(12) United States Patent
Takeda et al.

(10) Patent No.: US 9,240,330 B2
(45) Date of Patent: Jan. 19, 2016

(54) METHOD OF MANUFACTURING A SEMICONDUCTOR INTEGRATED CIRCUIT DEVICE

(71) Applicant: Renesas Electronics Corporation, Kanagawa (JP)

(72) Inventors: Yasuhiro Takeda, Kanagawa (JP); Takao Kumihashi, Kanagawa (JP); Hiroshi Yanagita, Kanagawa (JP); Takashi Takeuchi, Kanagawa (JP); Yasushi Matsuda, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/795,731

(22) Filed: Mar. 12, 2013

(65) Prior Publication Data

US 2013/0252416 A1    Sep. 26, 2013

(30) Foreign Application Priority Data

Mar. 26, 2012    (JP) .................................. 2012-069669

(51) Int. Cl.
*H01L 21/48*    (2006.01)
*H01L 21/768*    (2006.01)
(Continued)

(52) U.S. Cl.
CPC ........ *H01L 21/486* (2013.01); *H01L 21/76898* (2013.01); *H01L 22/14* (2013.01);
(Continued)

(58) Field of Classification Search
CPC ............ H01L 23/481; H01L 21/76898; H01L 2225/065451; H01L 21/486; H01L 22/14; H01L 23/49827; H01L 25/0657

USPC .................................. 438/637–640, 666–668
See application file for complete search history.

(56) References Cited

U.S. PATENT DOCUMENTS 7,646,062 B2    1/2010    Yamaoka et al.
7,932,602 B2    4/2011    Katagiri
(Continued)

FOREIGN PATENT DOCUMENTS

JP    2005-26405 A    1/2005
JP    2008-34805 A    2/2008
(Continued)

OTHER PUBLICATIONS

Communication dated Jun. 25, 2015 from the Japanese Patent Office in counterpart application No. 2012-069669.
(Continued)

*Primary Examiner* — Thanhha Pham
(74) *Attorney, Agent, or Firm* — Sughrue Mion, PLLC

(57) ABSTRACT

The TSV technology has been popular as one of stacking technologies of a plurality of semiconductor chips. It has however been revealed by the present inventors that when TSV is formed using a so-called first via process, via middle process, front-via via last process, or the like, there is a possibility of defects such as gate breakdown occurring due to electrostatic breakdown in the subsequent process. In order to overcome the above problem, the present invention provides a method of manufacturing a semiconductor integrated circuit device, in which a through via electrode is formed by forming a hole in a semiconductor substrate, forming an insulating member in the hole, and burying a conductive member in the resulting hole while covering a portion of the hole except for the bottom portion with the insulating member.

18 Claims, 34 Drawing Sheets

(51) Int. Cl.
    *H01L 23/48*         (2006.01)
    *H01L 21/66*         (2006.01)
    *H01L 25/065*       (2006.01)
    *H01L 23/00*         (2006.01)
    *H01L 21/683*       (2006.01)

(52) U.S. Cl.
    CPC ......... H01L 23/481 (2013.01); H01L 25/0657 (2013.01); *H01L 21/6836* (2013.01); *H01L 24/03* (2013.01); *H01L 24/05* (2013.01); *H01L 24/13* (2013.01); *H01L 24/16* (2013.01); *H01L 24/81* (2013.01); *H01L 2221/6834* (2013.01); *H01L 2221/68327* (2013.01); *H01L 2224/0345* (2013.01); *H01L 2224/0361* (2013.01); *H01L 2224/0401* (2013.01); *H01L 2224/05025* (2013.01); *H01L 2224/0557* (2013.01); *H01L 2224/05147* (2013.01); *H01L 2224/05166* (2013.01); *H01L 2224/05567* (2013.01); *H01L 2224/05568* (2013.01); *H01L 2224/05583* (2013.01); *H01L 2224/05624* (2013.01); *H01L 2224/05655* (2013.01); *H01L 2224/06181* (2013.01); *H01L 2224/11462* (2013.01); *H01L 2224/131* (2013.01); *H01L 2224/13022* (2013.01); *H01L 2224/13083* (2013.01); *H01L 2224/13147* (2013.01); *H01L 2224/13155* (2013.01); *H01L 2224/16145* (2013.01); *H01L 2224/16225* (2013.01); *H01L 2224/16237* (2013.01); *H01L 2224/16238* (2013.01); *H01L 2224/81192* (2013.01); *H01L 2224/81815* (2013.01); *H01L 2224/94* (2013.01); *H01L 2225/06513* (2013.01); *H01L 2225/06517* (2013.01); *H01L 2225/06544* (2013.01); *H01L 2924/00014* (2013.01); *H01L 2924/12032* (2013.01); *H01L 2924/13091* (2013.01); *H01L 2924/15311* (2013.01)

(56) References Cited

U.S. PATENT DOCUMENTS

| | | |
|---|---|---|
| 8,471,367 B2 | 6/2013 | Saito et al. |
| 2009/0152602 A1* | 6/2009 | Akiyama ..................... 257/288 |
| 2009/0166846 A1* | 7/2009 | Pratt et al. .................... 257/698 |
| 2012/0091593 A1* | 4/2012 | Cheng et al. ................. 257/774 |

FOREIGN PATENT DOCUMENTS

| | | |
|---|---|---|
| JP | 2009-043779 A | 2/2009 |
| JP | 2010-27973 A | 2/2010 |
| JP | 2010-114352 A | 5/2010 |
| JP | 2010-515275 A | 5/2010 |
| JP | 2010-186870 A | 8/2010 |
| WO | 2008/083284 A2 | 7/2008 |
| WO | 2011/058712 A1 | 5/2011 |

OTHER PUBLICATIONS

Chinese Office Action issued is Chinese Application No. 201310099950.X, issued on Nov. 2, 2015.

* cited by examiner

METHOD OF MANUFACTURING A SEMICONDUCTOR INTEGRATED CIRCUIT DEVICE

CROSS-REFERENCE TO RELATED APPLICATIONS

The disclosure of Japanese Patent Application No. 2012-069669 filed on Mar. 26, 2012 including the specification, drawings, and abstract is incorporated herein by reference in its entirety.

BACKGROUND

The present invention relates to a method of manufacturing a semiconductor integrated circuit device (or a semiconductor device), in particular, to a technology effective when applied to a through via technology, that is, TSV (Through Silicon Via) technology.

Japanese Patent Laid-Open No. 2009-43779 (Patent Document 1) or U.S. Pat. No. 7,932,602 (Patent Document 2) corresponding thereto discloses a technology of forming a tungsten-based through electrode penetrating through a buried silicon oxide film, which has been buried in advance in a surface region of a silicon substrate, and a premetal insulating film on the buried silicon oxide film and reaching the lower surface thereof. The TSV technology disclosed in this document belongs to a via first process, that is, a process of forming a through via after formation of a premetal insulating film.

Japanese Patent Laid-Open No. 2010-186870 (Patent Document 3) discloses a technology of forming a through electrode penetrating through a silicon substrate from the back surface side thereof and reaching the lower surface of a metal pad. The TSV technology disclosed in this document belongs to a so-called "back via type via last" process.

[Patent Documents]
[Patent Document 1] Japanese Patent Laid-Open No. 2009-43779
[Patent Document 2] U.S. Pat. No. 7,932,602
[Patent Document 3] Japanese Patent Laid-Open No. 2010-186870

SUMMARY

The TSV technology has been used popular as a technology of stacking a plurality of semiconductor chips and the like. It has however been elucidated by the present inventors that when TSV is formed using a so-called via first process, via middle process, front via type via last process, or the like, there is a possibility of defects such as gate breakdown occurring due to electrostatic breakdown in the subsequent process.

Means for overcoming such problems will next be described. Other problems and novel features of the present invention will be apparent from the description herein and accompanying drawings.

Among embodiments disclosed herein, a typical one will next be outlined simply.

The following is the outline of one embodiment of the invention: in a method of manufacturing a semiconductor integrated circuit device, a through via electrode is formed by making a hole in a semiconductor substrate, forming an insulating member in the hole, and then burying a conductive member in the hole as the through via electrode while covering the hole except for the bottom portion with the insulating member.

Advantages available by the typical embodiment, among embodiments disclosed herein, will next be described briefly.

There is a reduced possibility of occurrence of defects such as gate breakdown.

DETAILED DESCRIPTION

Figure 1:
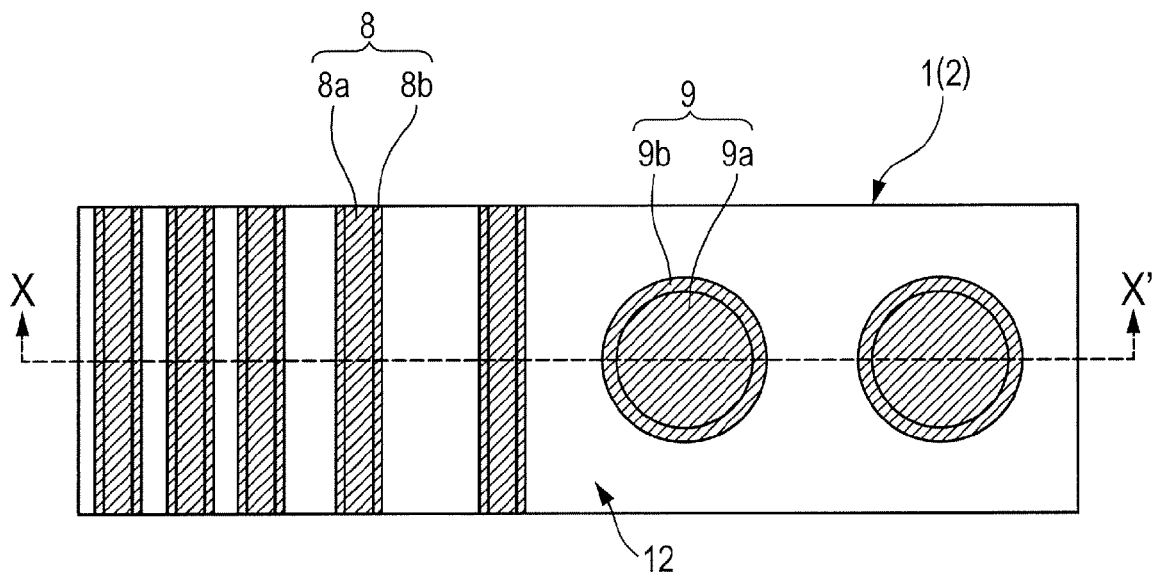
FIG. 1 is a top view (at the time of completion of burying and planarization of a through via electrode) showing a partial region on a wafer for describing the outline (mainly, a via middle process) of a method of manufacturing a semiconductor integrated circuit device according to First Embodiment of the invention (including a modification example)

[Summary of Embodiment] First, typical embodiments disclosed herein will be described.

1. A method of manufacturing a semiconductor integrated circuit device including the steps of: (a) preparing a semiconductor wafer having a device main surface and back surface; (b) forming, from the device main surface of the semiconductor wafer to a semiconductor surface region of the semiconductor wafer, a plurality of holes reaching the inside thereof; (c) forming an insulating film on the inner surface of the holes; and (d) after the step (c), burying a conductive member in the holes while covering, with the insulating film, the inner surface of the holes except for the bottom portion thereof, and thereby forming a plurality of through via electrodes.

2. The method of manufacturing a semiconductor integrated circuit device as described above in 1, further including the step of: (e) in a wafer process, electrically coupling at least one of the through via electrodes to a gate electrode.

3. The method of manufacturing a semiconductor integrated circuit device as described above in 1 or 2, wherein the through via electrodes are formed using a via middle process.

4. The method of manufacturing a semiconductor integrated circuit device as described above in 3, wherein the through via electrodes are buried in a step of forming a first-level wiring but at a timing different from that of burying the first-level wiring.

5. The method of manufacturing a semiconductor integrated circuit device as described above in 3, wherein the through via electrodes are buried simultaneously with burying of a first-level wiring.

6. The method of manufacturing a semiconductor integrated circuit device as described above in 1 or 2, wherein the through via electrodes are formed using a via last process.

7. The method of manufacturing a semiconductor integrated circuit device as described above in 6, wherein the through via electrodes are formed during a step of forming uppermost-level wirings except for a pad layer.

8. The method of manufacturing a semiconductor integrated circuit device as described above in 7, wherein at least one of the through via electrodes is electrically coupled to a pad through a wiring belonging to the pad layer.

9. The method of manufacturing a semiconductor integrated circuit device as described above in any one of 1 to 8, further including the step of: (f) after the step (d) but during the wafer process, irradiating electron beams to the device main surface of the wafer to test a conduction state of the through via electrodes.

10. The method of manufacturing a semiconductor integrated circuit device as described above in 1, 2, or 9, wherein the through via electrodes are formed using a via first process.

11. The method of manufacturing a semiconductor integrated circuit device as described above in 10, wherein the burying of the through via electrodes is conducted in a gate electrode forming step but at a timing different from that of forming a gate electrode film.

12. The method of manufacturing a semiconductor integrated circuit device as described above in 10, wherein the burying of the through via electrodes is conducted simultaneously with the formation of a gate electrode film.

13. The method of manufacturing a semiconductor integrated circuit device as described above in 10, wherein the burying of the through via electrodes is conducted in a contact forming step but at a timing different from that of forming a contact plug.

14. The method of manufacturing a semiconductor integrated circuit device as described above in 10, wherein the burying of the through via electrodes is conducted simultaneously with the formation of a contact plug.

15. The method of manufacturing a semiconductor integrated circuit device as described above in any one of 1 to 14, wherein at least after the step (d), the semiconductor region in the vicinity of the lower end of each of the through via electrodes has a heavily doped region having the same conductivity type as that of a semiconductor region therearound and having a high impurity concentration.

16. The method of manufacturing a semiconductor integrated circuit device as described above in any one of 1 to 15, wherein the through via electrodes have a barrier metal structure with a titanium film as an outer layer and a titanium nitride film as an inner layer.

17. The method of manufacturing a semiconductor integrated circuit device as described above in any one of 1 to 16, wherein the lower end of each of the through via electrodes and a semiconductor region in the vicinity thereof have therebetween a metal silicide layer.

18. The method of manufacturing a semiconductor integrated circuit device as described above in any one of 1 to 17, further including the step of: (g) after the step (d), the semiconductor wafer is subjected to film thinning treatment from the back surface side of the semiconductor wafer to expose the through via electrodes on the back surface side of the semiconductor wafer.

19. The method of manufacturing a semiconductor integrated circuit device as described above in 18, further including the step of: (h) after the step (g), the through via electrodes are coupled to a bump electrode provided on another semiconductor substrate.

[Explanation on Description Manner, Basic Terms, and Usage Herein]

1. In the present application, a description in embodiments may be made after divided in a plurality of sections if necessary for convenience's sake. These sections are not independent each other, but they may each be a part of a single example or one of them may be partial details of the other or a modification example of a part or whole of the other unless otherwise specifically indicated. In principle, description is not repeated with regards to similar portions. In the embodiments, when a reference is made to constituent elements, they are not essential unless otherwise specifically indicated, limited to the number theoretically, or principally apparent from the context that it is not.

Further, in the invention, the term "semiconductor device" or "semiconductor integrated circuit device" means mainly various transistor (active element) units, devices having, with the transistor units as a main component, resistors, capacitors, and the like integrated on a semiconductor chip or the like (for example, a single crystal silicon substrate), and packaged semiconductor chips. Typical examples of various transistors may include MISFET (metal insulator semiconductor field effect transistor) typified by MOSFET (metal oxide semiconductor field effect transistor). In this case, typical examples of the integrated circuit constitution may include CMIS (complementary metal insulator semiconductor) type integrated circuits typified by CMOS (complementary metal oxide semiconductor) type integrated circuits having an N channel type MISFET and a P channel type MISFET in combination.

The wafer process of recent semiconductor integrated circuit devices, that is, LSI (large scale integration), can usually be classified into two steps. First one is a FEOL (front end of line) step from the loading of a silicon wafer as a raw material to a premetal step (a step including the formation of an interlayer insulating film between a lower edge of an M1 wiring layer and a gate electrode structure, the formation of a contact hole, the burying of tungsten plug, and the like). The second one is a BEOL (back end of line) step from the formation of the M1 wiring layer to the formation of a pad opening for a final passivation film on an aluminum-based pad electrode (in a wafer level package process, the process is also included).

2. Similarly, in the description of the embodiment, and the like, when "X made of A" or the like is used with regard to the material, composition or the like, a component other than A is not excluded from main constituting elements unless otherwise specifically indicated or principally apparent from the context it is not. For example, with regard to a component, the above sentence means "X containing A as a main component". For example, it is needless to say that the term "silicon member" or the like means not only a member made of pure silicon but also a member containing a SiGe alloy, another multielement alloy having silicon as a main component, or an additive.

Similarly, the terms "silicon oxide film," "silicon oxide insulating film" and so on refer to not only an insulating film made of relatively pure undoped silicon oxide (Undoped Silicon Dioxide) but also other insulating films having silicon oxide as a main component. Examples of the silicon oxide film include impurity-doped silicon oxide-based insulating films such as TEOS-based silicon oxide, PSG (phosphorus silicate glass), and BPSG (borophosphosilicate glass) films. In addition, thermally oxidized films, CVD oxidized films, films obtained by the method of application such as SOG (spin on glass) and NCS (nano-clustering silica) films are also embraced in the silicon oxide films or silicon oxide-based insulating films. In addition, low-k insulating films such as FSG (fluorosilicate glass), SiOC (silicon oxycarbide), carbon-doped silicon oxide, and OSG (organosilicate glass) films are also embraced in the silicon oxide films or silicon oxide-based insulating films. Moreover, silica-based low-k insulating films (porous insulating films) obtained by introducing pores in members similar to them are also embraced in the silicon oxide films or silicon oxide-based insulating films.

In addition, silicon-based insulating films ordinarily used in the semiconductor field like silicon oxide-based insulating films are silicon nitride-based insulating films. Materials which belong to such a group include SiN, SiCN, SiNH, and SiCNH. The term "silicon nitride" as used herein embraces both SiN and SiNH unless otherwise specified. Similarly, the term "SiCN" as used herein embraces both SiCN and SiCNH unless otherwise specified.

Incidentally, SiC has properties similar to those of SiN, but SiON tends to be classified rather into a silicon oxide-based insulation film.

Silicon nitride films are not only greatly used as an etch stop film in SAC (self-aligned contact) technology, that is, as CESL (contact etch-stop layer) but also used as a stress applying film in SMT (stress memorization technique).

Likewise, the term "nickel silicide" typically refers to nickel monosilicide, but it includes not only relatively pure one but also an alloy, a mixed crystal, or the like each containing nickel monosilicide as a main component. Also, silicide is not limited to nickel silicide but may be conventionally used cobalt silicide, titanium silicide, tungsten silicide, or the like. As a metal film for silicidation, not only a Ni (nickel) film, but also a nickel alloy film such as a Ni—Pt alloy film (alloy film of Ni and Pt), a Ni—V alloy film (alloy film of Ni and V), a Ni—Pd alloy film (alloy film of Ni and Pd), a Ni—Yb alloy film (alloy film of Ni and Yb), or a Ni—Er alloy film (alloy film of Ni and Er) can be used. It is to be noted that such silicides containing nickel as a main metal element thereof are collectively called "nickel-based silicide".

3. Similarly, preferred examples of the shape, position, attribute or the like are shown, but it is needless to say that the shape, position, attribute, or the like is not limited strictly to the preferred one unless otherwise specifically indicated or principally apparent from the context that it is not.

4. Further, when a reference is made to a specific number or amount, the number or amount may be greater than or less than the specific number or amount unless otherwise specifically indicated, limited to the specific number or amount theoretically, or apparent from the context that it is not.

5. The term "wafer" means a single crystal silicon wafer over which a semiconductor integrated circuit device (also semiconductor device or an electronic device) is to be formed, but it is needless to say that it embraces an epitaxial wafer and a composite wafer of a semiconductor layer and an insulating substrate such as SOI substrate or LCD glass substrate.

6. With regards to the classification of the formation process of TSV, a process of forming TSV mainly during a FEOL step is called "via first process", a process of forming TSV mainly during a BEOL step is called "via middle process", and a process of forming TSV mainly after the BEOL step but before stacking is called "after stack process". In the present invention, the classification of the formation process of TSV is as follows, which almost corresponds to the above-mentioned one. First, the process is classified roughly into "via first process", "via middle process", "via last process", and "after stack process", according to the TSV formation timing.

In the via first process, a through via such as TSV is formed prior to the formation of a first-level wiring interlayer insulating film; in the via middle process, a through via is formed after completion of a premetal region but prior to the completion of uppermost-level wiring layers except for a pad layer; in the via last process, a through via is formed thereafter but prior to stacking; and in the after stacking process, a through via is formed after stacking.

Furthermore, a through via formed from the surface side of a wafer is called "front via", while a through via formed from the back side of a wafer is called "back via".

Particularly when a through via formed prior to thinning of a wafer is discriminated from that formed after thinning of the wafer, the former one is called "through via precedence" or "through via preceding type". In the following embodiments, vias belonging to "through via preceding front-via type" are described mainly.

Furthermore, the via first process using polysilicon or the like as a main filling member of a through via is called "via first polysilicon process", while the via first process using tungsten as a filling member similar to that of a contact hole is called "via first contact process".

7. The term "TSV", "through via", "through via electrode" or the like as used herein means both a member which has already penetrated or which should penetrate unless otherwise they should be distinguished from each other, because calling of a member by another name during steps leads to undesirable confusion. It is needless to say that a substrate for "TSV", "through silicon via", or the like is not limited to a silicon-based wafer or the like.

Details of Embodiment Embodiments will next be described more specifically. In all the drawings, the same or like members will be identified by the same or like symbols or reference numerals and overlapping descriptions will be omitted in principle.

Moreover, when in the accompanying drawings, hatching or the like complicates the drawing or a difference from a space portion is clear, hatching is sometimes omitted even from a cross-sectional view. In this connection, even when it is apparent from the description or the like that a hole is clearly closed in a planar view, a contour of the background is sometimes omitted. Further, hatching may be applied even if it is not a cross-sectional view to clearly show that it is not a space portion.

When two are in an alternative relationship and one is called "first" or the like and the other one is called "second" or the like, they may be made to correspond based on a typical embodiment. It is however needless to say that when a certain member is called, for example, "first" one, it is not limited to this choice.

1. Description on the outline (mainly, via middle process) of a method of manufacturing a semiconductor integrated circuit device according to First Embodiment of the invention (including a modification example) (mainly, FIG. 1 to FIG. 3)

A description will hereinafter be made specifically with a silicon-based CMIS type semiconductor integrated circuit device (that is, a MOS type semiconductor integrated circuit device) as an example. It is however needless to say that a bipolar semiconductor integrated circuit device or another device may be used as the example.

This section will describe mainly a via middle process, which is employed in Sections 2 to 6, but it is needless to say that this section can be applied to a via last process or a via first process.

The depth of a through via (for example, about 50 µm and usually within a range of from about 10 to 100 µm) is usually much deeper than the depth of an impurity doped region such as wells (usually in a submicron order) so that in the accompanying drawings, the impurity doped region is omitted in principle unless it is necessary. In addition, a structure at the periphery of a gate such as sidewall is also omitted from the drawings.

Figure 2:
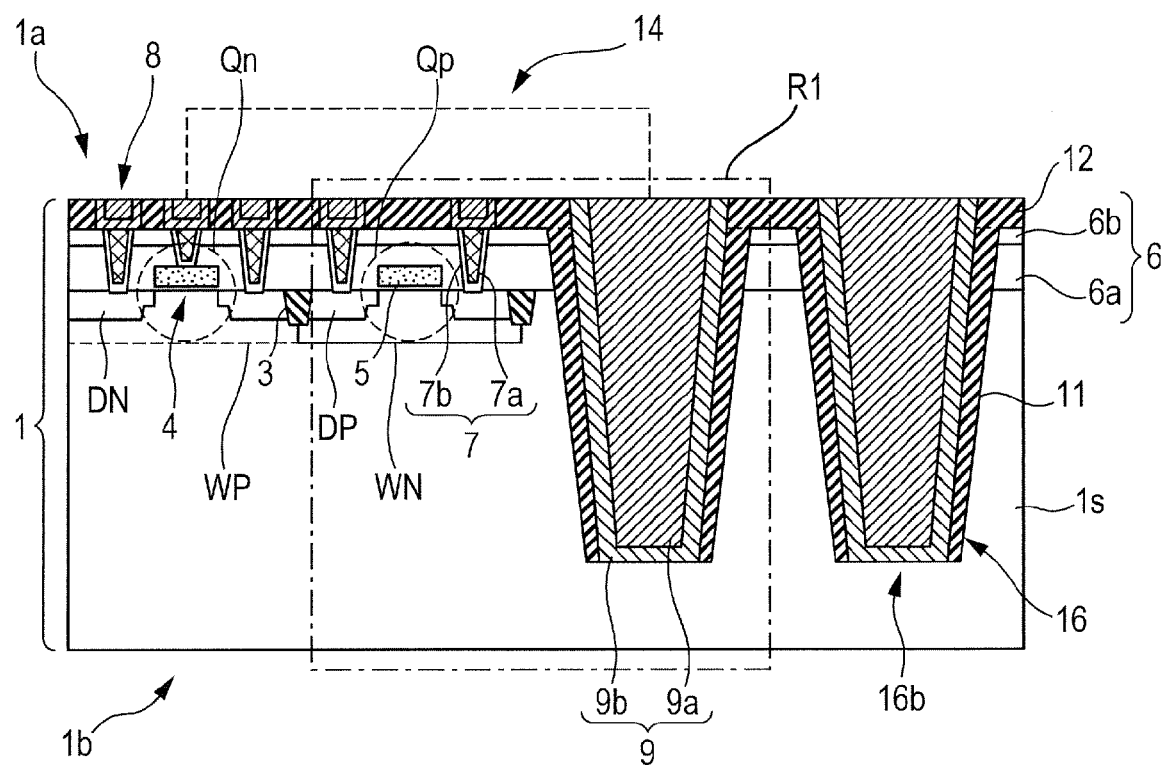
FIG. 2 is a cross-sectional view of the wafer corresponding to an X-X' cross-section of FIG. 1.
Figure 3:
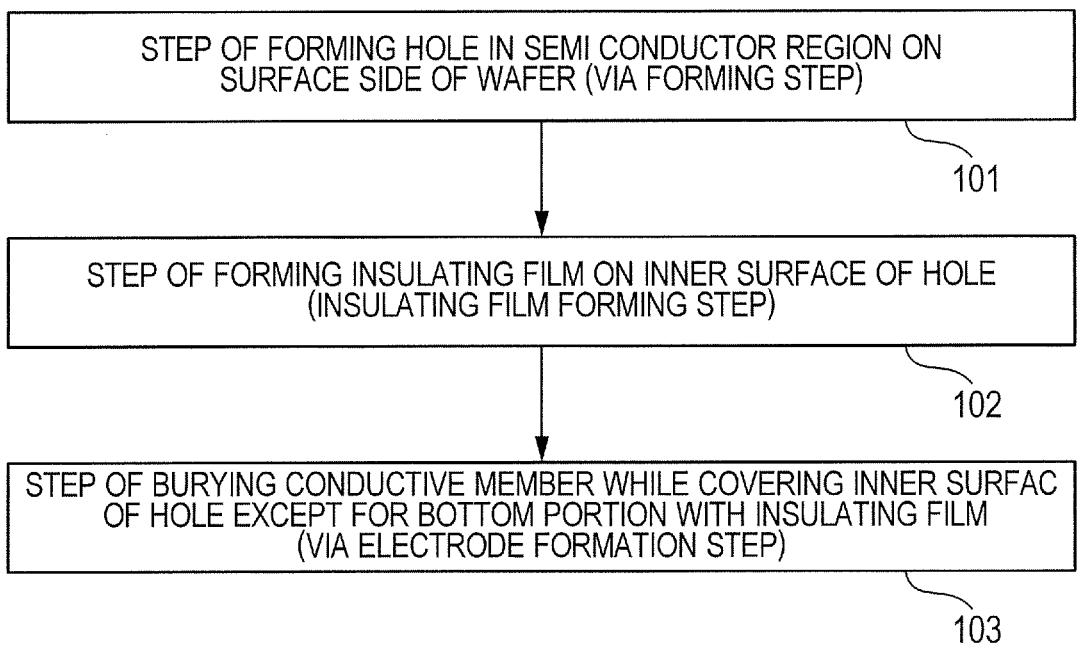
FIG. 3 is a process block flow chart showing the outline of the major part of a through via formation process in the method of manufacturing a semiconductor integrated circuit device according to First Embodiment of the invention (including a modification example)

FIG. 1 is a top view (at the time of completion of burying and planarization of a through via electrode) showing a partial region on a wafer for describing the outline (mainly, via middle process) of a method of manufacturing a semiconductor integrated circuit device according to First Embodiment of the invention (including a modification example). FIG. 2 is a cross-sectional view of the wafer corresponding to an X-X' cross-section of FIG. 1. FIG. 3 is a process block flow chart showing the outline of the major part of the through via formation process in the method of manufacturing a semiconductor integrated circuit device according to First Embodiment of the invention (including a modification example). Based on these drawings, the outline (mainly, a via middle process) of the method of manufacturing a semiconductor integrated circuit device according to First Embodiment of the invention will be described.

FIG. 1 shows the top view of a portion (a region having a through via and the periphery thereof) of a chip region 2 of a wafer 1 at the time of completion of a major wafer processing treatment in the method of manufacturing a semiconductor integrated circuit device according to First Embodiment. On the right side of FIG. 1, there appear upper end portions of a plurality of substantially circular through via electrodes 9. On the left side, on the other hand, there appears a plurality of first-level buried wirings 8. The other portion is a first-level wiring interlayer insulating film 12 made of, for example, a silicon oxide-based insulating film.

The through via electrode 9 (which has not yet been completed as a through via) is comprised of a through-via main metal electrode 9a made of, for example, a copper member and a through-via barrier metal film 9b made of, for example, titanium nitride. Similarly, the first-level buried wiring 8 is comprised of a first-level copper wiring film 8a made of, for example, a copper member and a first-level wiring barrier metal film 8b made of, for example, titanium nitride.

The X-X' cross-section of FIG. 1 is shown in FIG. 2. As shown in FIG. 2, the semiconductor wafer 1 (having a thickness of, for example, about 700 µm) has, on a surface 1a (device surface or first main surface) of a semiconductor substrate portion 1s (P-type single crystal silicon substrate) (that is, on the side opposite to a back surface 1b), an N-channel MISFET (Qn) and a P-channel MISFET (Qp) which are isolated from each other by an STI region 3 or the like. The N channel MISFET (Qn) and P channel MISFET (Qp) each have a gate electrode 5 (for example, a gate polysilicon film) provided via a gate insulating film 4. A P well region WP provided in a semiconductor region on the surface 1a side of the semiconductor substrate portion 1s has, in the surface thereof, an N type source drain region DN of the N channel MISFET (Qn). On the other hand, an N well region WN provided in the semiconductor region on the surface 1a side of the semiconductor substrate portion 1s has, in the surface thereof, a P type source drain region DP of the P channel MISFET (Qp).

The semiconductor substrate portion 1s has, in the surface 1a thereof, a premetal insulating film 6 (having a thickness of, for example, about 300 nm) and it is comprised of, for example, a main premetal insulating film 6a as a lower layer and a cap-layer premetal insulating film 6b as an upper layer. The main premetal insulating film 6a is comprised of, for example, a relatively thin silicon nitride-based insulating film (for example, a silicon nitride film) as a lower layer and a relatively thick silicon oxide-based insulating film (for example, an ozone TEOS-based silicon oxide film) as an upper layer. The cap-layer premetal insulating film 6b is comprised of, for example, a silicon oxide-based insulating film (for example, a plasma TEOS-based silicon oxide film).

The premetal insulating film 6 has a conductive plug 7 buried therein and this conductive plug penetrates through this insulating film and reaches the gate electrode 5, the N type source drain region DN, the P type source drain region DP, and the like. The conductive plug 7 is comprised of a main metal plug 7a (for example, a tungsten plug), a metal plug barrier metal film 7b (for example, a titanium nitride film), and the like. The premetal insulating film 6 has thereon a first-level wiring interlayer insulating film 12 (an ozone TEOS-based silicon oxide film having a thickness of, for example, about 200 nm) and this first-level wiring interlayer insulating film has therein the first-level buried wiring 8 coupled to the conductive plug 7 and the like.

As described above in FIG. 1, in this example, the premetal insulating film 6 has therein a plurality of through vias 16 which penetrate therethrough and reach the inside of the semiconductor substrate portion 1s. These through vias have, buried therein, the through via electrode 9 via a through-via liner insulating film 11. Incidentally, in this example, the through-via liner insulating film 11 is of the same layer as the first-level wiring interlayer insulating film 12 and they are formed simultaneously, which is however not an essential requirement. The through via 16 is comprised of, for example, the through via main metal electrode 9a (for example, a metal member having copper as a main component) as an inner layer and the through-via barrier metal film 9b (for example, a titanium nitride film) as side and bottom layers. In general, at least one of the through via electrodes 9 is electrically coupled to at least one of the gate electrodes 5 via a gate electrode—through via electrode wiring 14. The gate electrode—through via electrode wiring 14 is comprised of the gate electrode 5, wirings of each layer, or combination thereof.

In this example, at this time point, the through via 16 does not have, at the via bottom portion 16b thereof, the through-via liner insulating film 11 so that the through via electrode 9 and the semiconductor substrate portion 1s (P type single-crystal silicon substrate) are substantially electrically coupled to each other (ohmic contact or Schottkey junction) to prevent occurrence of a large potential difference. During manufacturing steps, the through via 16 is therefore as if grounded to the semiconductor substrate portion 1s, making it possible to prevent occurrence of gate breakdown or the like which will otherwise occur by undesired charging-up of the through via 16.

Next, the outline of the manufacturing method for actualizing such a structure will be shown in FIG. 3 (refer to FIG. 2). As shown in FIG. 3, the following is the outline of the manufacturing method. (1) Form in a semiconductor surface region a plurality of holes extending from the surface 1a side of the wafer 1 to the inside thereof. (2) Then, form an insulating film on the inner surface of the holes. (3) After the step (2), bury a conductive member in the holes while covering the inner surface of the holes except for the bottom portion with the insulating film (in other words, without covering at least a portion of the bottom) to form a plurality of through via electrodes.

By using the method as described above, all the through via electrodes 9 and the semiconductor substrate portion 1s are substantially electrically coupled to each other during from the starting of burying of the conductive member in the through vias until removal of the bottom portion of the through vias by back grinding (thinning of the wafer).

2. Local description on the process (via middle process) until completion of filling of vias in the method of manufacturing a semiconductor integrated circuit device according to First Embodiment (mainly from FIG. 4 to FIG. 15)

The process shown here is one example and needless to say, each element process may be modified. Each element process is not essential unless specified that it is essential or unless it is obviously essential. This will also apply to each element shown in Section 3. Needless to say, additional elements shown in Section 3 to Section 6 are not essential but arbitral.

Figure 4:
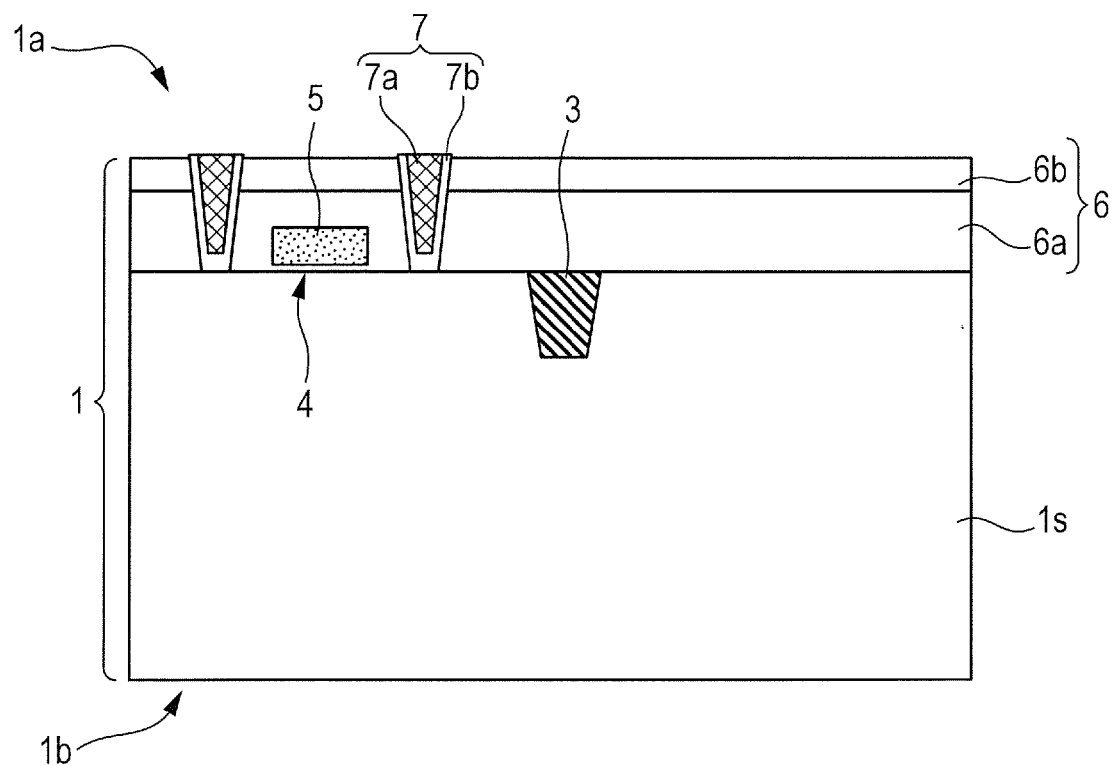
FIG. 4 is a schematic cross-sectional view (at the time of completion of burying of a tungsten plug) showing a region R1 of the wafer at the peripheries of the MISFET and through via cut out from FIG. 2 for locally describing a process (a via middle process) until completion of filling of a via in the method of manufacturing a semiconductor integrated circuit device according to First Embodiment of the invention.
Figure 5:
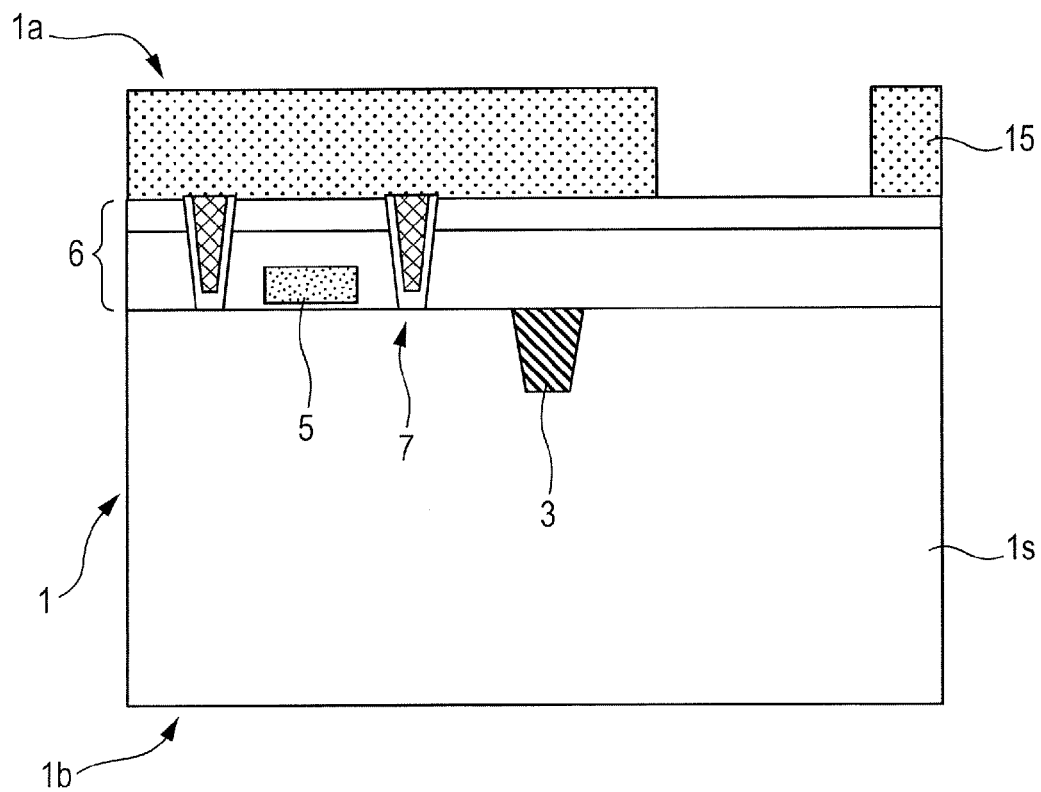
FIG. 5 is a schematic cross-sectional view (a step of patterning a through via forming resist film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 6:
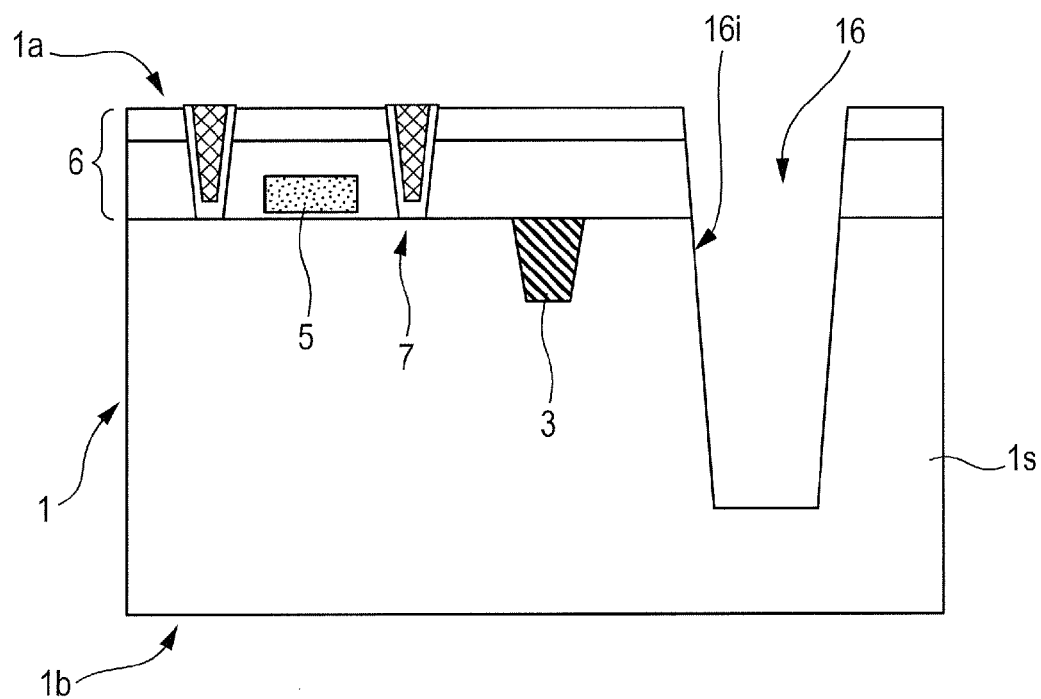
FIG. 6 is a schematic cross-sectional view (a step of forming a through via) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 7:
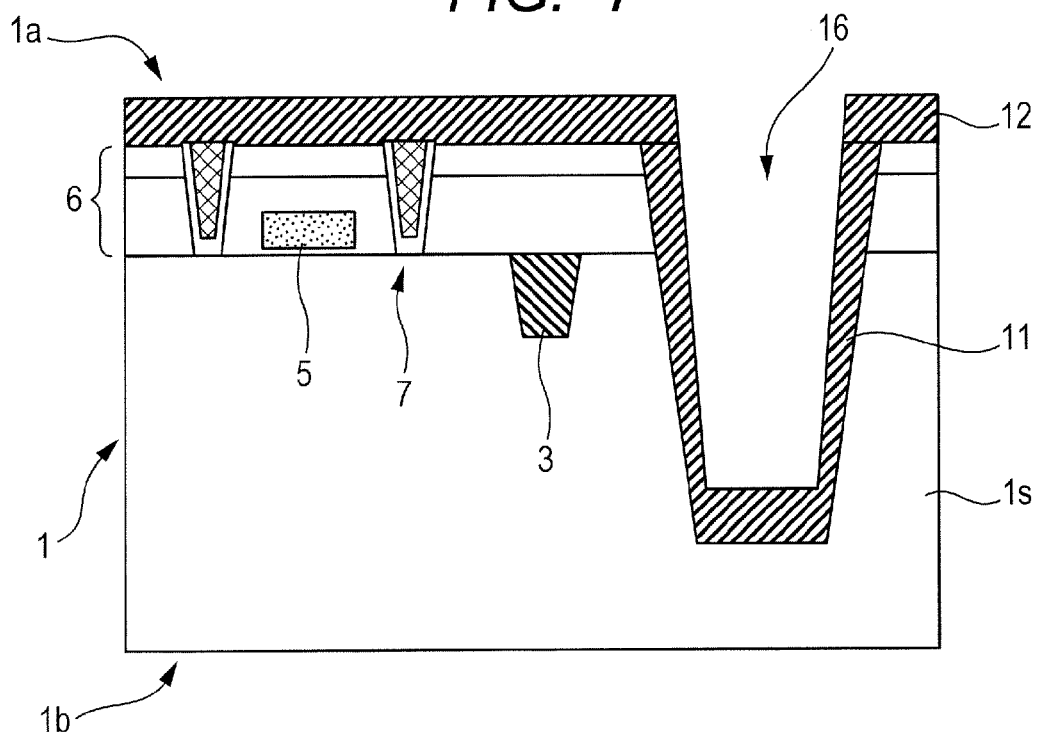
FIG. 7 is a schematic cross-sectional view (a step of forming a first-level wiring interlayer insulating film and a through-via liner insulating film) showing the region R1 of the wafer at the peripheries of MISFET and through via cut out from FIG. 2 for locally describing the process (the via middle process) until completion of filling of a via in the method of manufacturing a semiconductor integrated circuit device according to First Embodiment of the invention.
Figure 8:
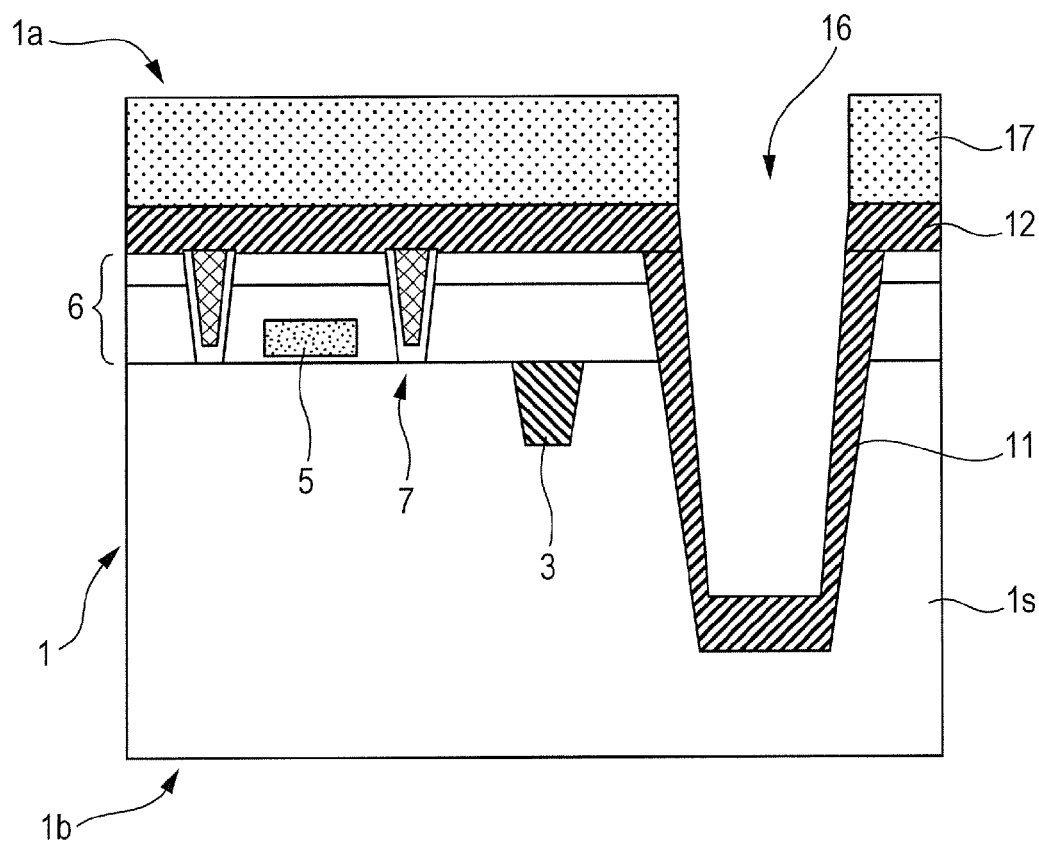
FIG. 8 is a schematic cross-sectional view (a step of patterning a through-via bottom insulating film forming resist film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 9:
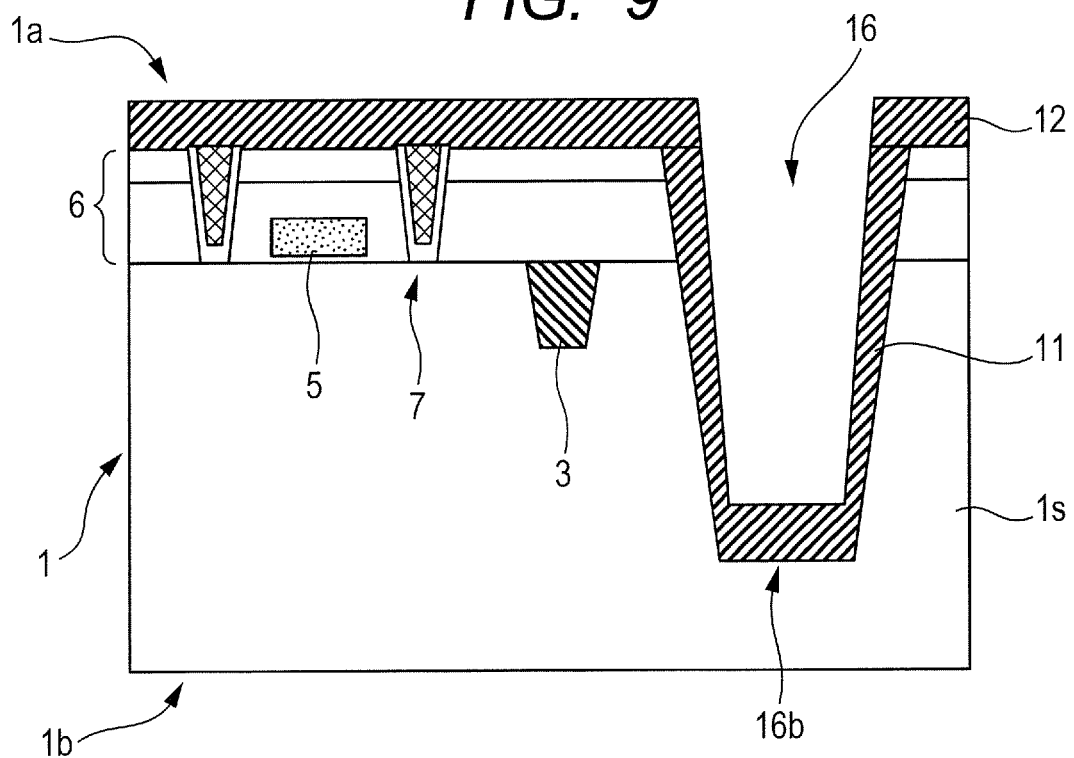
FIG. 9 is a schematic cross-sectional view (a step of removing the through-via bottom insulating film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 10:
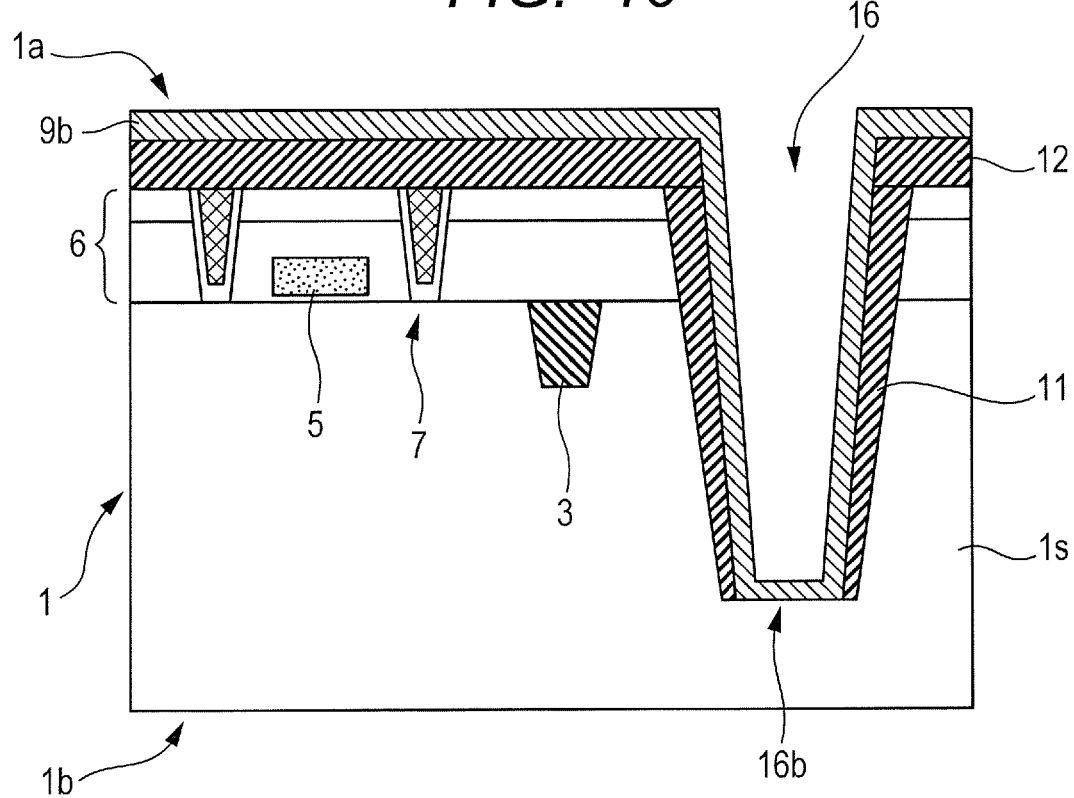
FIG. 10 is a schematic cross-sectional view (a step of forming a through-via barrier metal film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 11:
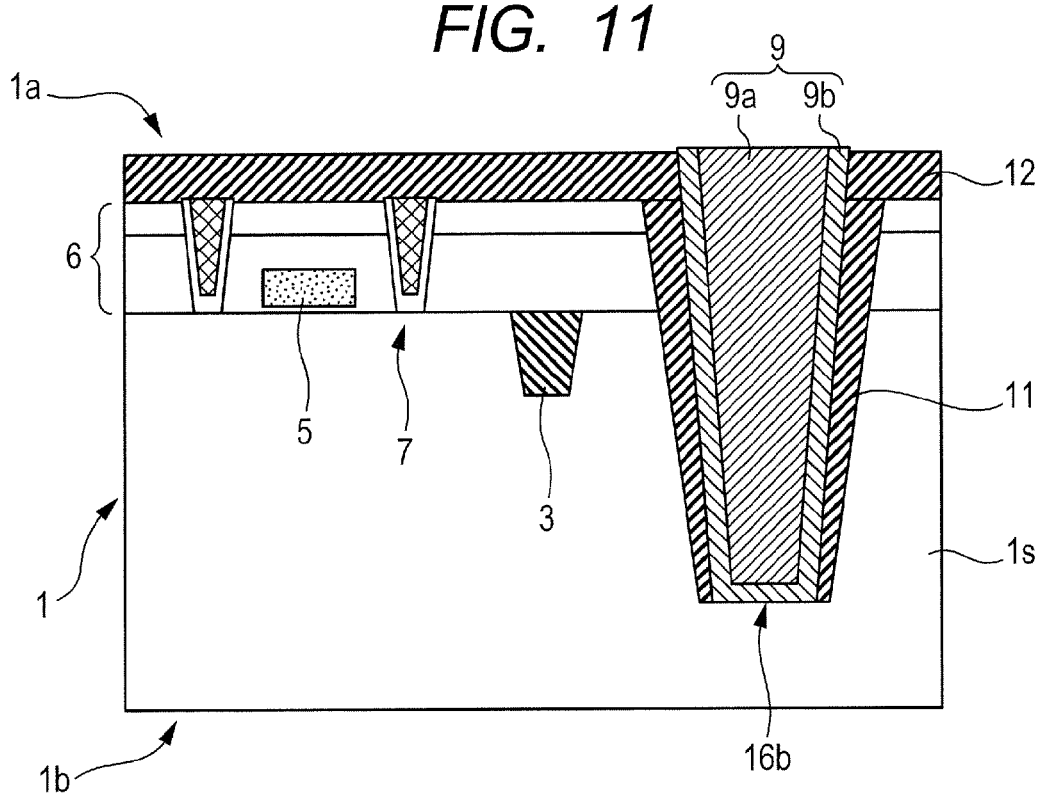
FIG. 11 is a schematic cross-sectional view (a step of burying and planarizing a through via main metal electrode) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 12:
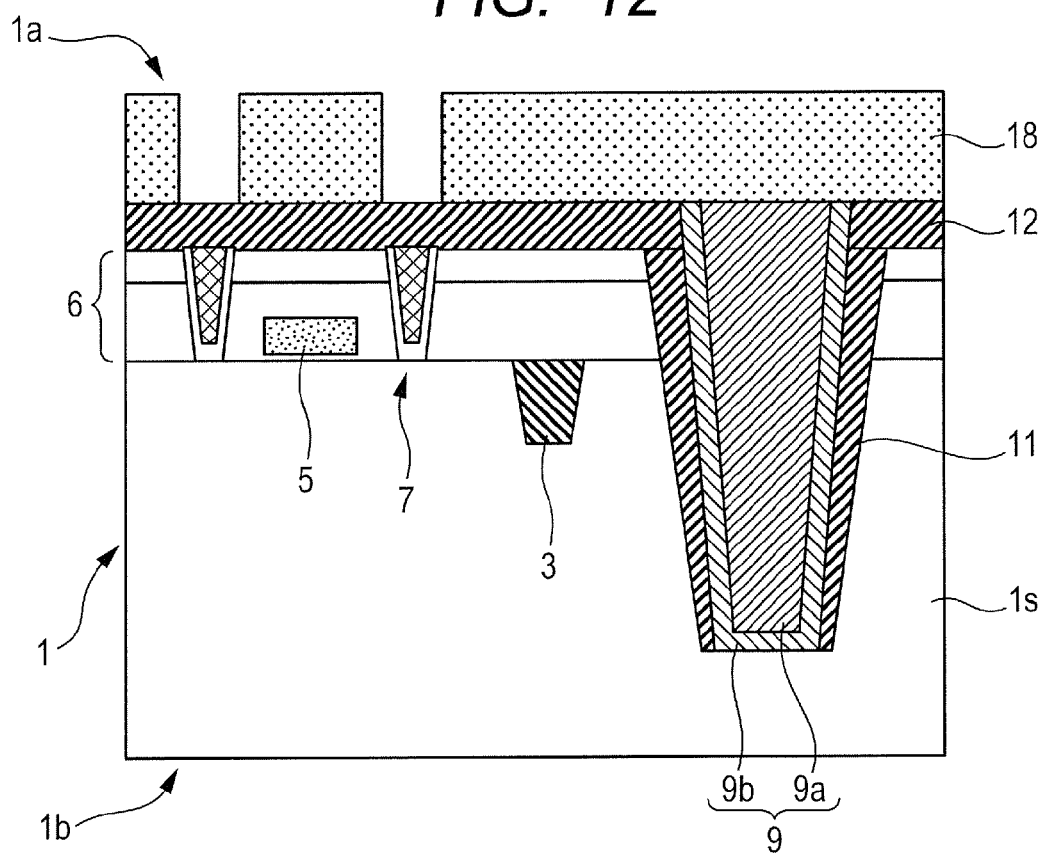
FIG. 12 is a schematic cross-sectional view (a step of patterning a first-level wiring trench forming resist film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 13:
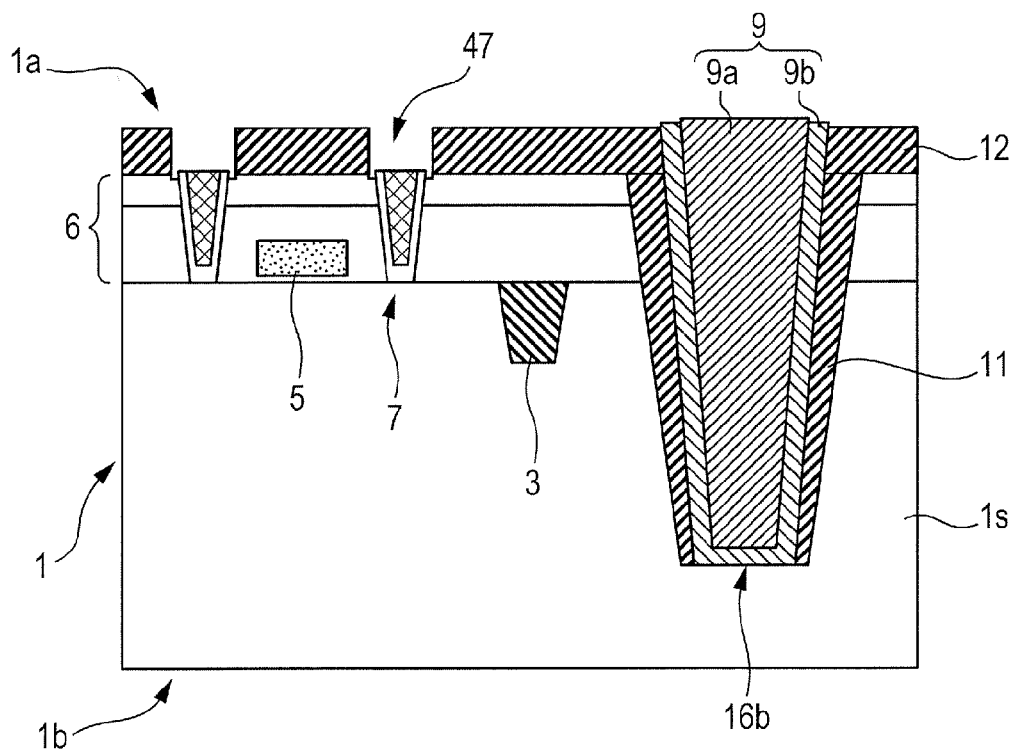
FIG. 13 is a schematic cross-sectional view (a step of forming a first-level wiring trench) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 14:
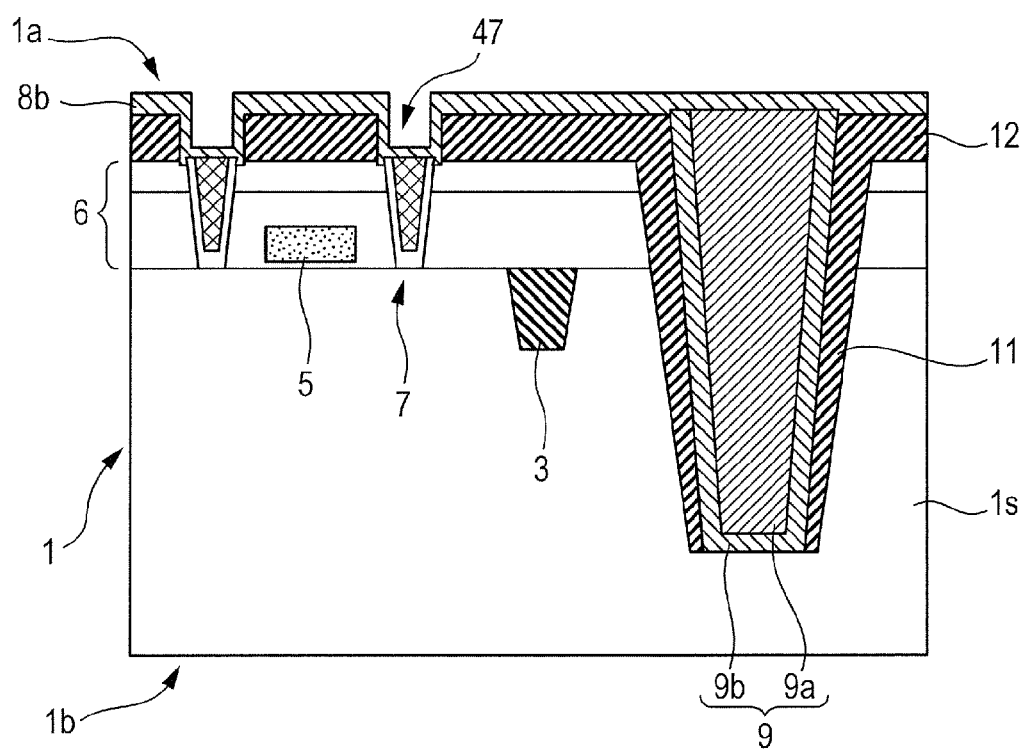
FIG. 14 is a schematic cross-sectional view (a step of forming a first-level wiring barrier metal film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention.
Figure 15:
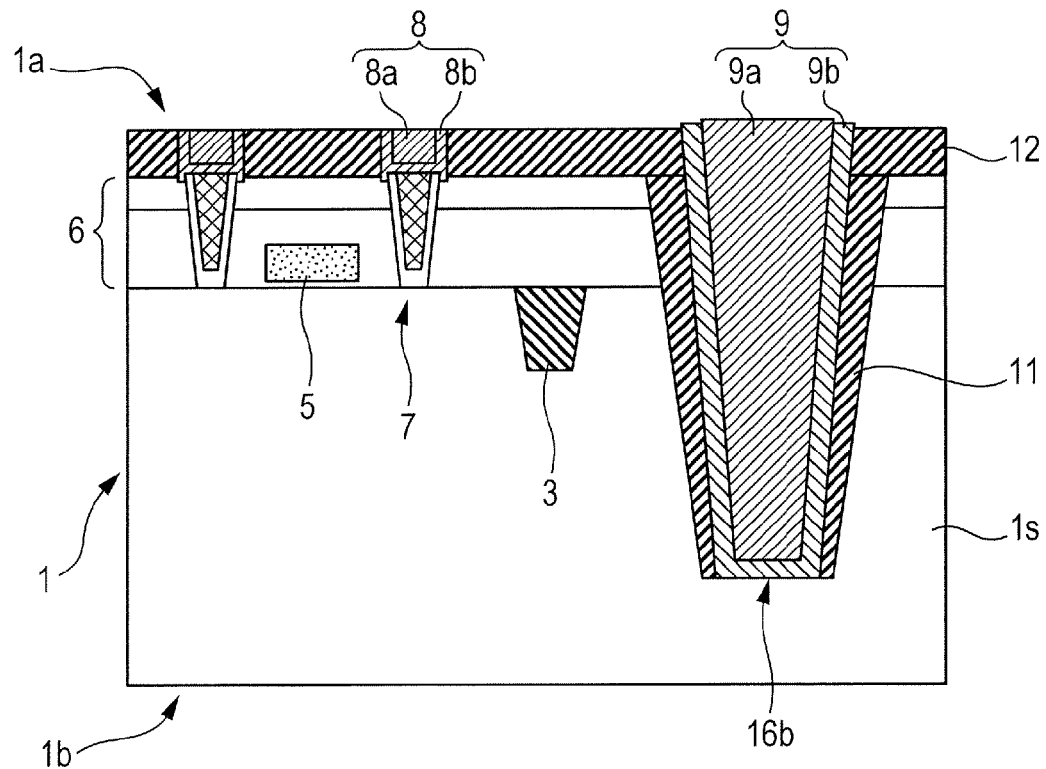
FIG. 15 is a schematic cross-sectional view (a step of burying and planarizing a through via electrode) showing the region R1 of the wafer at the peripheries of the MISFET and through via cut out from FIG. 2 for locally describing the process (the via middle process) until completion of the filling of a via in the method of manufacturing a semiconductor integrated circuit device according to First Embodiment of the invention.

FIG. 4 is a schematic cross-sectional view (at the time of completion of burying of a tungsten plug) showing a region R1 of the wafer at the peripheries of the MISFET and through via cut out from FIG. 2 for locally describing a process (a via middle process) until completion of filling of a via in the method of manufacturing a semiconductor integrated circuit device according to First Embodiment of the invention. FIG. 5 is a schematic cross-sectional view (a step of patterning a through via forming resist film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 6 is a schematic cross-sectional view (a step of forming a through via) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 7 is a schematic cross-sectional view (a step of forming a first-level wiring interlayer insulating film and a through-via liner insulating film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 8 is a schematic cross-sectional view (a step of patterning a resist film for removing a through-via bottom insulating film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 9 is a schematic cross-sectional view (a step of removing the through-via bottom insulating film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 10 is a schematic cross-sectional view (a step of forming a through-via barrier metal film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 11 is a schematic cross-sectional view (a step of burying and planarizing a through via main metal electrode) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 12 is a schematic cross-sectional view (a step of patterning a first-level wiring trench forming resist film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 13 is a schematic cross-sectional view (a step of forming a first-level wiring trench) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 14 is a schematic cross-sectional view (a step of forming a first-level wiring barrier metal film) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. FIG. 15 is a schematic cross-sectional view (a step of burying and planarizing a through via electrode) showing the region R1 of the wafer at the peripheries of the MISFET and through via cut out from FIG. 2 for locally describing the process (the via middle process) until completion of filling of a via in the method of manufacturing a semiconductor integrated circuit device according to First Embodiment of the invention. Based on them, a local description will be made on the process (the via middle process) until completion of filling of a via in the method of manufacturing a semiconductor integrated circuit device according to First Embodiment of the invention.

The device cross-sectional structure at the time of completion of a premetal step, for example, according to a typical CMIS process is shown in FIG. 4. In the drawings on and after FIG. 4, different from FIG. 2, an impurity-doped region in the semiconductor substrate is omitted in principle in order to avoid complicating the drawings.

Next, as shown in FIG. 5, a through via forming resist film 15 (having a thickness of, for example, 5 μm) is formed almost all over the surface of the wafer 1 on the device surface 1a side, followed by patterning, for example, by typical lithography.

Next, as shown in FIG. 6, with the patterned through via forming resist film 15 as a mask, anisotropic dry etching is conducted to form through vias 16 having a substantially circular planar shape (having a top diameter of about 10 μm and a depth of about 50 μm). In other words, a plurality of holes (through vias 16) reaching the inside of the semiconductor surface region of the semiconductor wafer is formed. The resist film which becomes unnecessary is then removed, for example, by ashing. An inner side surface 16i of the through via 16 may be perpendicular or slightly tapered toward the bottom.

Then, as shown in FIG. 7, a silicon oxide-based insulating film (for example, an ozone TEOS film having a thickness of, for example, about 200 nm) is formed, for example, by CVD almost all over the surface of the wafer 1 on the device surface 1a side to form a through-via liner insulating film 11 and a first-level wiring interlayer insulating film 12.

Next, as shown in FIG. 8, a through-via bottom insulating film removing resist film 17 (having a thickness of, for example, about 1 μm) is formed, followed by patterning, for example, by typical lithography.

Next, as shown in FIG. 9, with the patterned resist film 17 as a mask, anisotropic dry etching is conducted to remove the insulating film from a through-via bottom 16b. Then, the resist film which becomes unnecessary is removed, for example, by ashing.

Next, as shown in FIG. 10, a titanium nitride film (having a thickness of for example about 30 nm) is formed as a through-via barrier metal film 9b almost all over the surface of the wafer 1 on the device surface side 1a, for example, by using MOCVD (Metal Organic CVD) or sputtering (for example, ionized sputtering). Examples of a precursor include TDMAT (tetrakis(dimethylamino)titanium) and TDEAT (tetrakis(diethylamino)titanium), which will also apply similarly to MOCVD described below. Film formation by using sputtering has the merit of excluding mixing of carbon, while MOCVD has the merit of forming a more uniform film even in a deep hole.

Then, as illustrated in FIG. 11, a copper seed film is formed all over the surface (including the inner surface of the through via 16) of the wafer 1 on the device surface 1a side and on the through-via barrier metal film 9b, for example, by using sputtering (for example, ionized sputtering). Next, electroplating is conducted with the copper seed film as a seed layer to form a copper film (including a seed film) all over the surface (including the inner surface of the through via 16) of the wafer 1 on the device surface 1a side so as to fill the through via 16 therewith. Metal CMP is then conducted to remove the copper film and the through-via barrier metal film 9b outside the through via 16 to form a through via electrode 9 comprised of a through via main metal electrode 9a (copper film) and the through-via barrier metal film 9b. This means that a plurality of through via electrodes is formed by forming an insulating film on the inner surface of a plurality of holes and filling the holes with a conductive member while covering the inner surface of the holes except for the bottom portion thereof. It is to be noted that at least one of the through via electrodes is electrically coupled to a gate electrode in any of the steps.

Next, as shown in FIG. 12, a first-level wiring trench forming resist film 18 (having a thickness of, for example, 1 μm) is formed all over the surface of the wafer 1 on the device surface 1a side, followed by patterning, for example, by typical lithography.

Next, as shown in FIG. 13, with the patterned resist film 18 as a mask, anisotropic dry etching is conducted to form a first-level wiring trench 47. Then, the resist film which becomes unnecessary is removed, for example, by ashing.

Next, as shown in FIG. 14, a titanium nitride film (having a thickness of, for example, about 10 nm) is formed as a first-level wiring barrier metal film 8b almost all over the surface (including the inner surface of the first-level wiring trench 47) of the wafer 1 on the device surface 1a side for example, by sputtering.

Next, as shown in FIG. 15, a copper seed film is formed all over the surface (including the inner surface of the first-level wiring trench 47) of the wafer 1 on the device surface 1a side, for example, by using sputtering. Then, electroplating is conducted to form a film to fill the first-level wiring trench 47 therewith. For example, CMP (chemical mechanical polishing) is conducted to planarize the wafer 1 on the device surface 1a side and remove the first-level wiring barrier metal film 8b and the copper film including the copper seed film outside the first-level wiring trench 47. As a result, a first-level buried wiring 8 comprised of a first-level copper wiring film 8a and the first-level wiring barrier metal film 8b is completed.

In the next section, the process described in this section and a process subsequent thereto will be described from the more global viewpoint.

The process (different timing process) in which mainly in the first-level wiring forming step, burying of a first-level wiring and burying of a through via electrode are conducted at different timings has been described above specifically. It is needless to say that the process (simultaneous process) in which burying of a first-level wiring as shown in FIGS. 12 to 15 and burying of a through via electrode are simultaneously conducted may be employed. The different timing process has the merit of conducting the process easily, while the simultaneous process has the merit of simplifying process steps.

3. Global description on the process after completion of an FEOL step in the method of manufacturing a semiconductor integrated circuit device according to First Embodiment of the invention (mainly from FIG. 16 to FIG. 27)

A bonding or stacking method of a semiconductor substrate will be described specifically with D2D (Die-to-Die) bonding through B2F (Back-to-Face) bonding as an example, but needless to say, F2F (Face-to-Face) bonding may be employed instead. As a stacking method, needless to say, either W2W (Wafer-to-wafer) stacking or D2W (Die-to-Wafer) stacking may be employed. This W2W method embraces a reconfigured wafer obtained by re-arraying known good dies on a wafer or a wafer-like substrate. Similarly, both B2F bonding and F2F bonding can be applied to W2W stacking or D2W stacking.

In the following description, bonding of substrates is described specifically with solder bonding as one example, but it is needless to say that bonding with a tin-copper intermetallic or bonding with another metal such as copper, silver, or gold may be employed.

Figure 16:
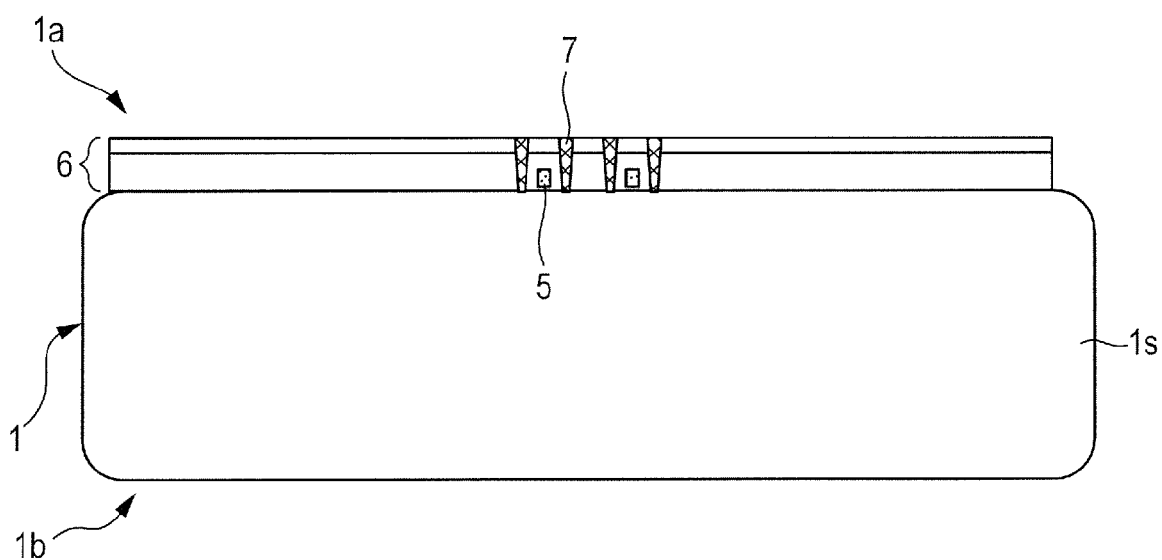
FIG. 16 is a schematic cross-sectional view (at the time of completion of a FEOL step, that is, a view corresponding to FIG. 4) of the entire wafer for globally describing a process after completion of a FEOL step in the method of manufacturing a semiconductor integrated circuit device according to First Embodiment of the invention.
Figure 17:
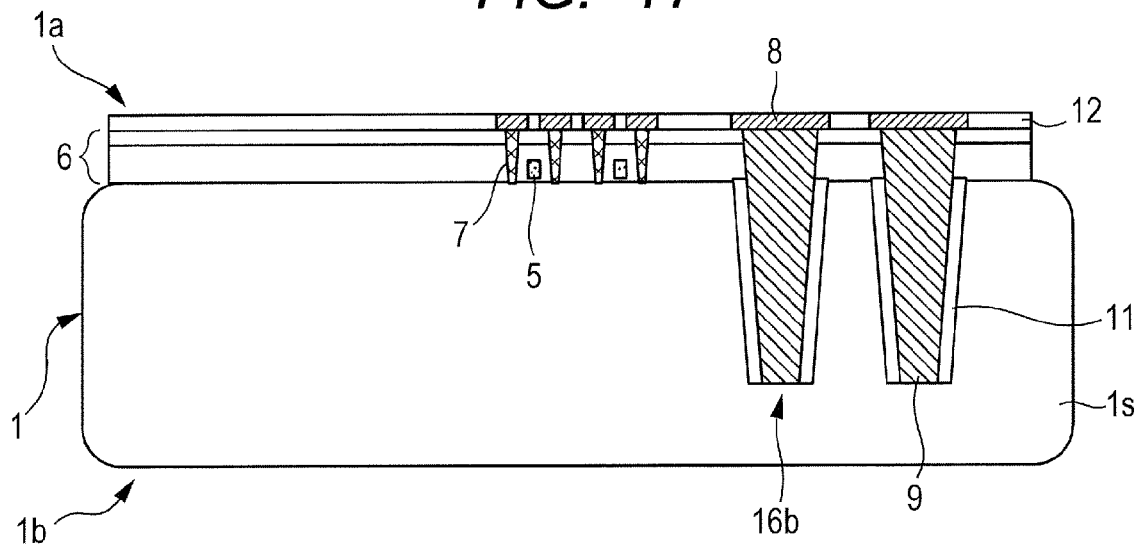
FIG. 17 is a schematic cross-sectional view (a first-level buried wiring forming step) of the entire wafer for globally describing the process after completion of a FEOL step in the method of manufacturing a semiconductor integrated circuit device according to First Embodiment of the invention.
Figure 18:
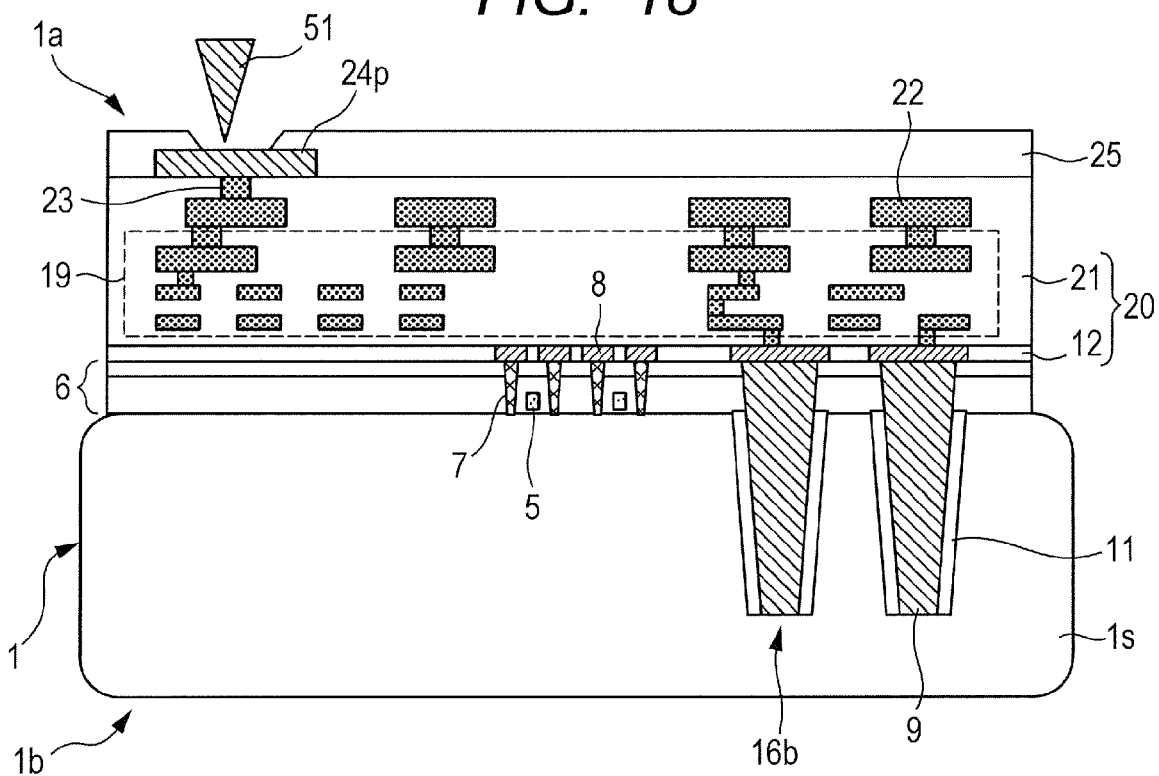
FIG. 18 is a schematic cross-sectional view (a probe test step of a wafer on a pad) of the entire wafer for globally describing the process after completion of a FEOL step in the method of manufacturing a semiconductor integrated circuit device according to First Embodiment of the invention.
Figure 19:
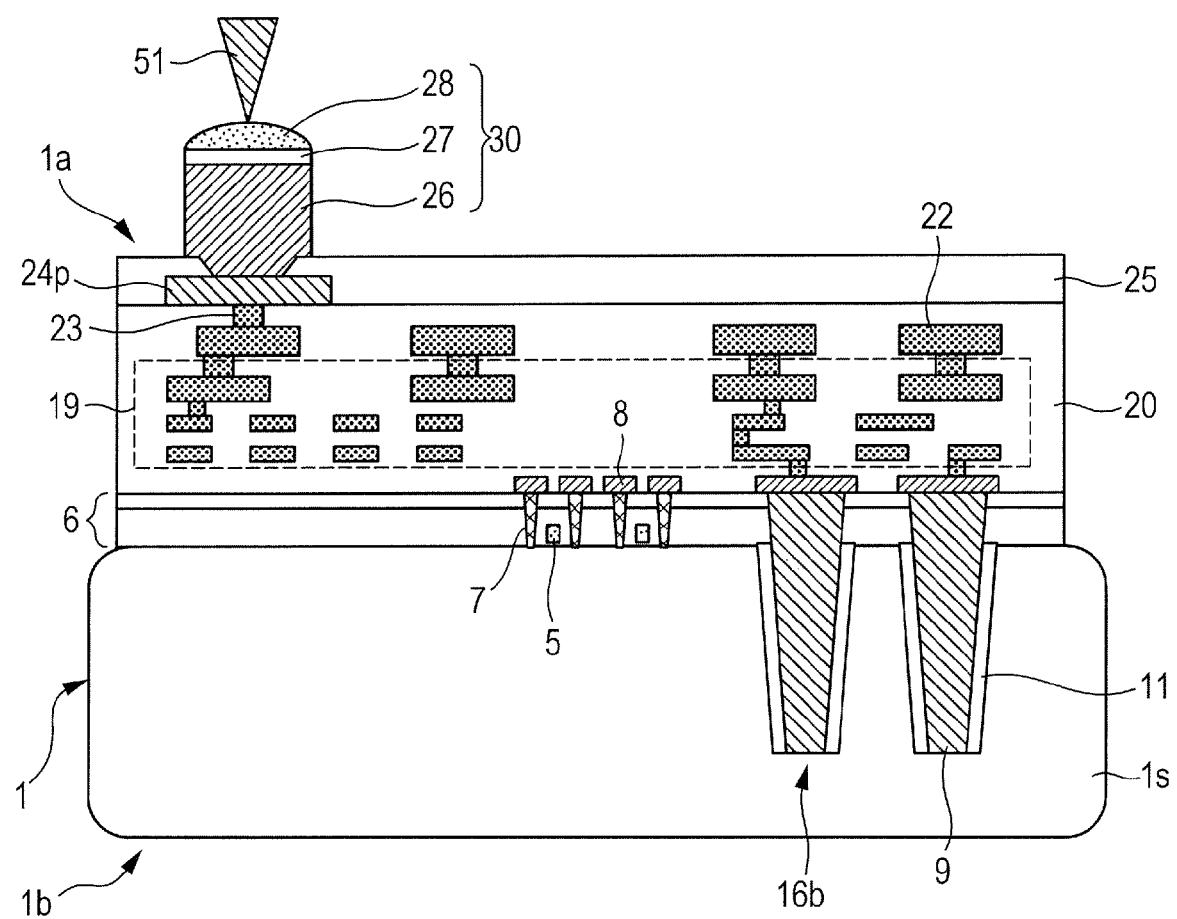
FIG. 19 is a schematic cross-sectional view (a probe test step of a wafer on a bump) of the entire wafer for globally describing the process after completion of a FEOL step in the method of manufacturing a semiconductor integrated circuit device according to First Embodiment of the invention.
Figure 20:
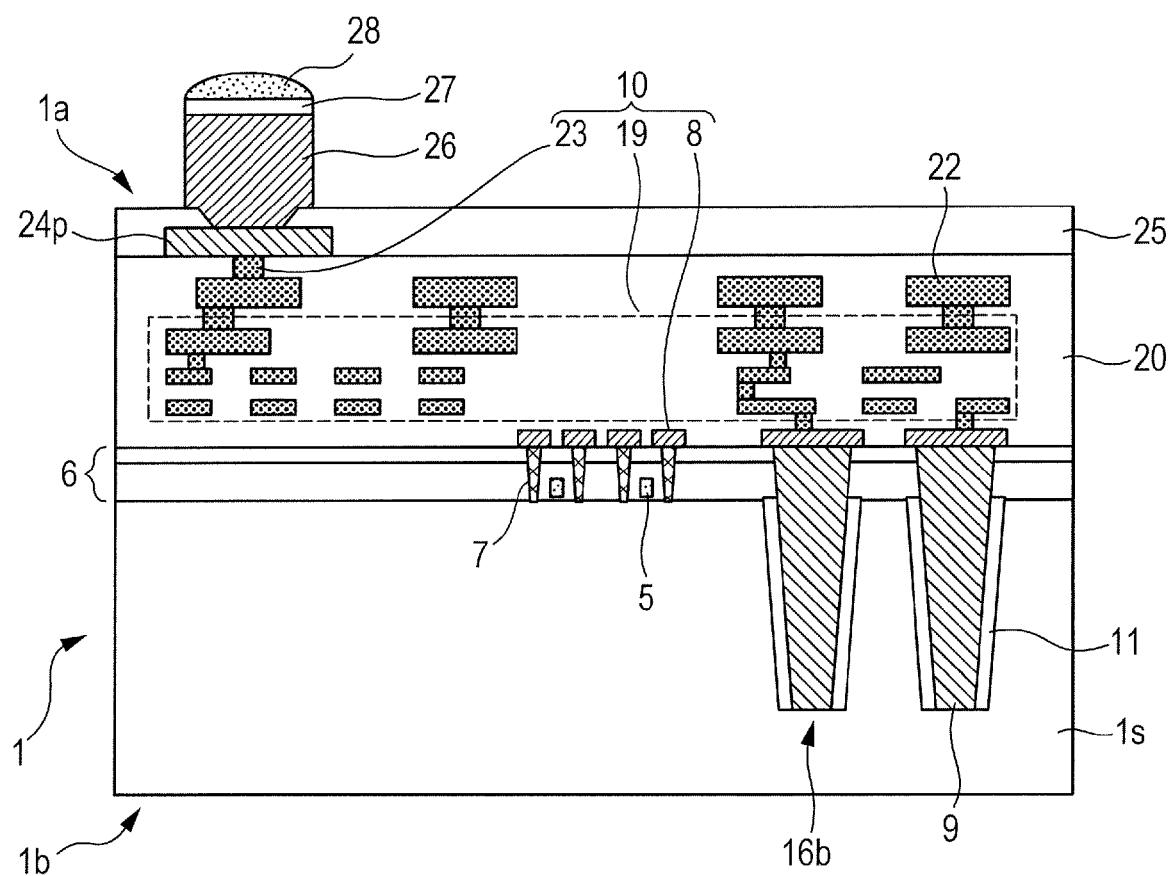
FIG. 20 is a schematic cross-sectional view (a wafer edge trimming step) of the entire wafer for globally describing the process after completion of a FEOL step in the method of manufacturing a semiconductor integrated circuit device according to First Embodiment of the invention.
Figure 21:
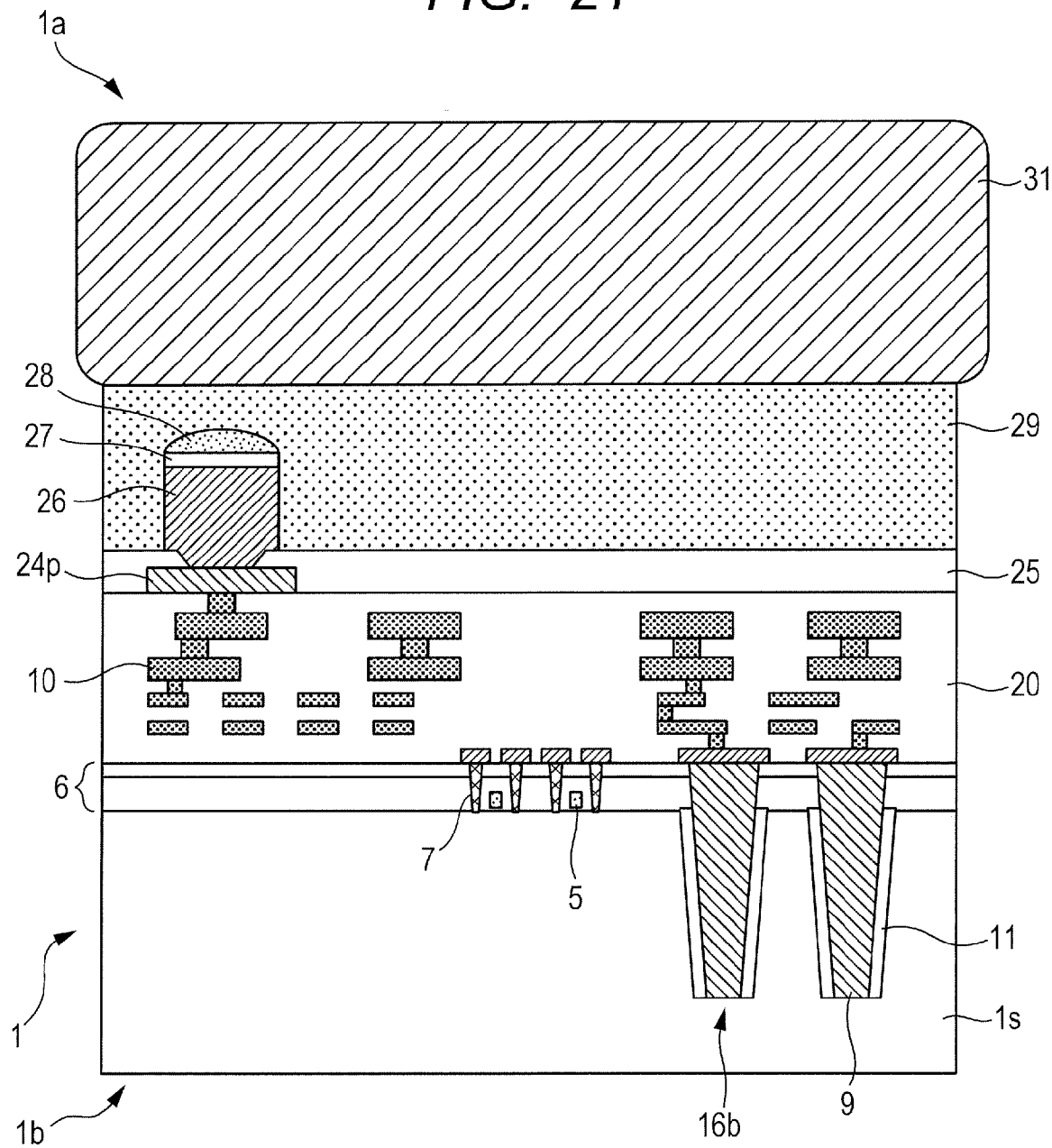
FIG. 21 is a schematic cross-sectional view (a glass support plate attaching step) of the entire wafer for globally describing the process after completion of a FEOL step in the method of manufacturing a semiconductor integrated circuit device according to First Embodiment of the invention.
Figure 22:
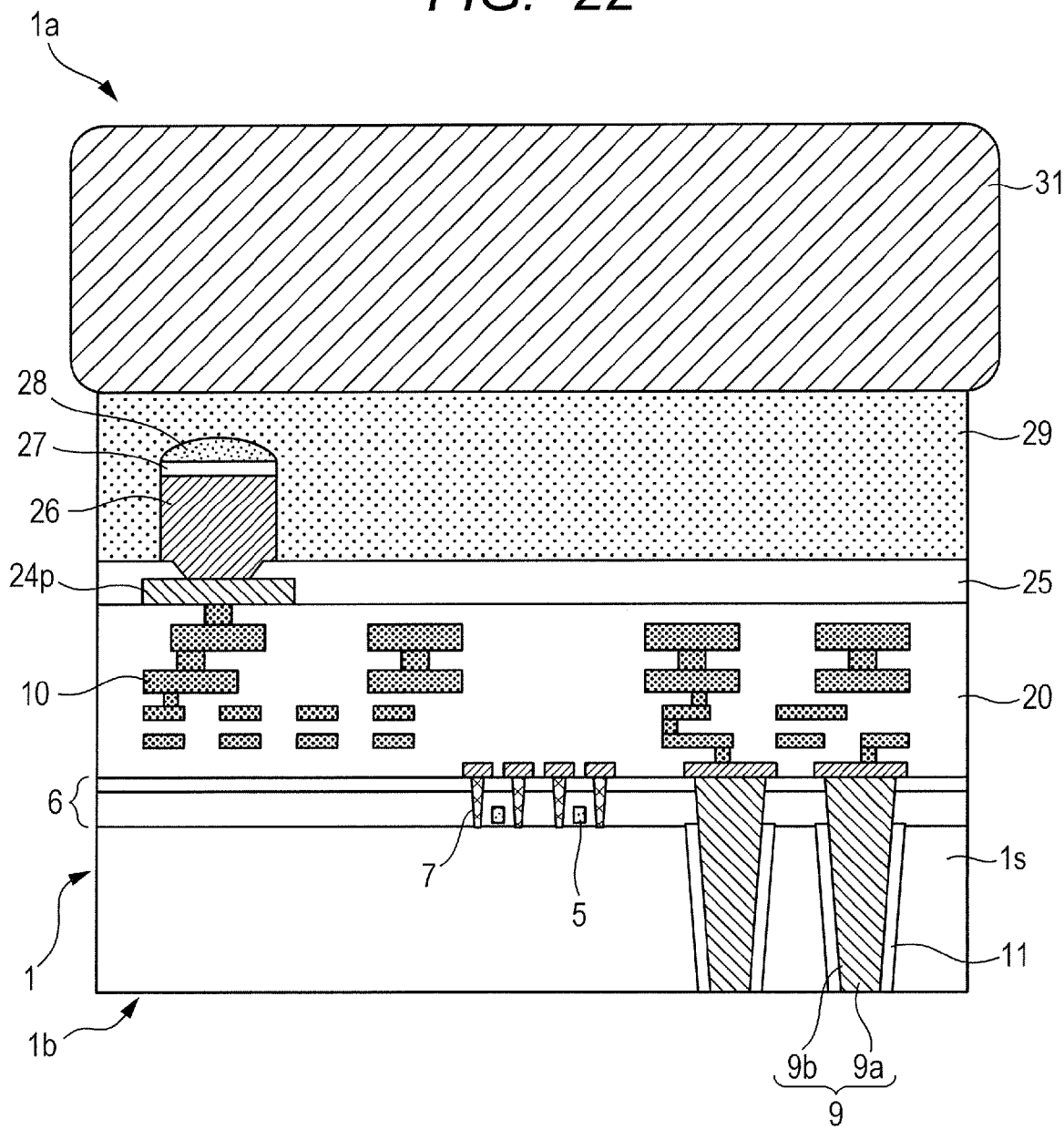
FIG. 22 is a schematic cross-sectional view (a back grinding step) of the entire wafer for globally describing the process after completion of a FEOL step in the method of manufacturing a semiconductor integrated circuit device according to First Embodiment of the invention.
Figure 23:
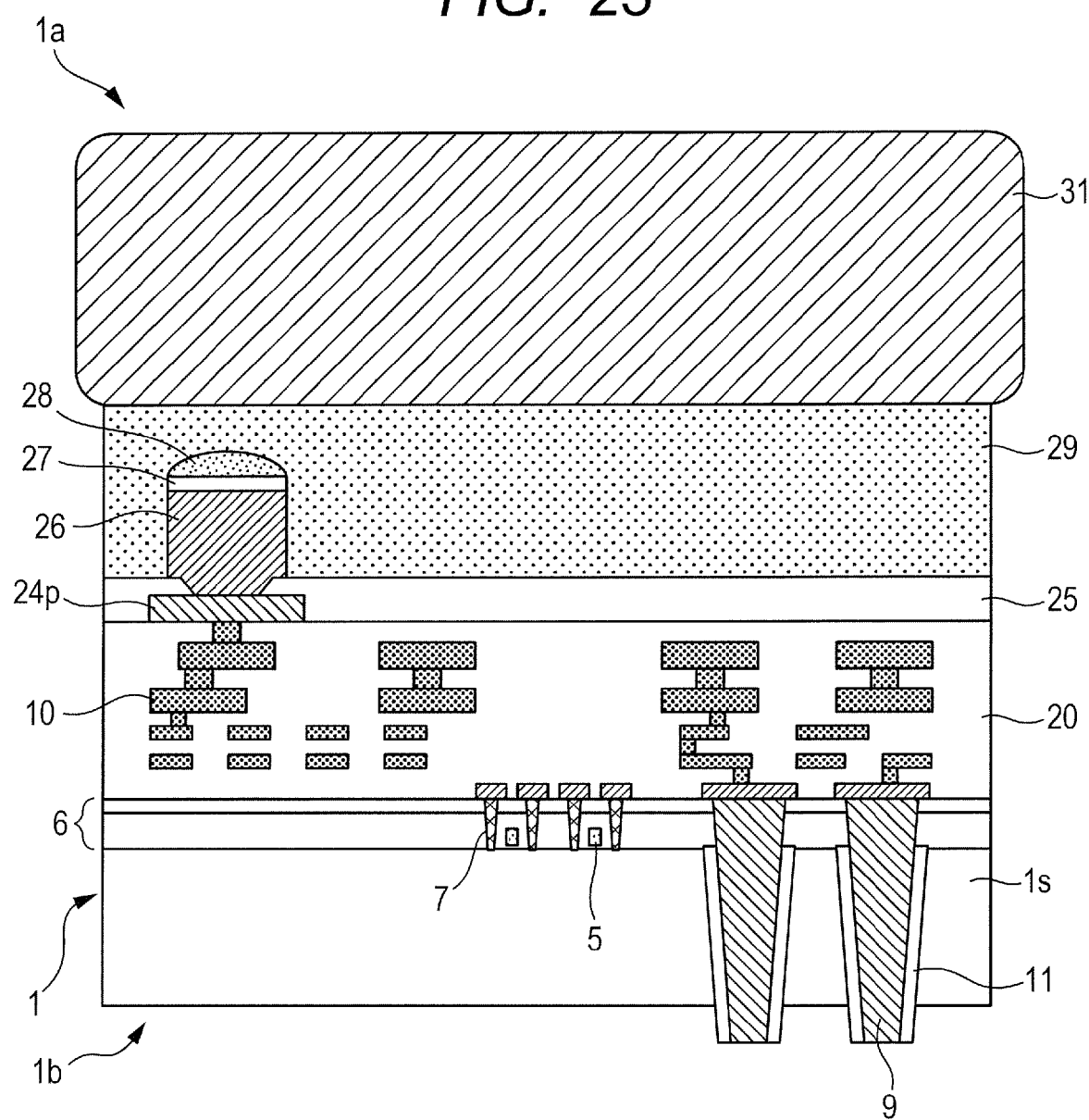
FIG. 23 is a schematic cross-sectional view (a back etching step) of the entire wafer for globally describing the process after completion of a FEOL step in the method of manufacturing a semiconductor integrated circuit device according to First Embodiment of the invention.
Figure 24:
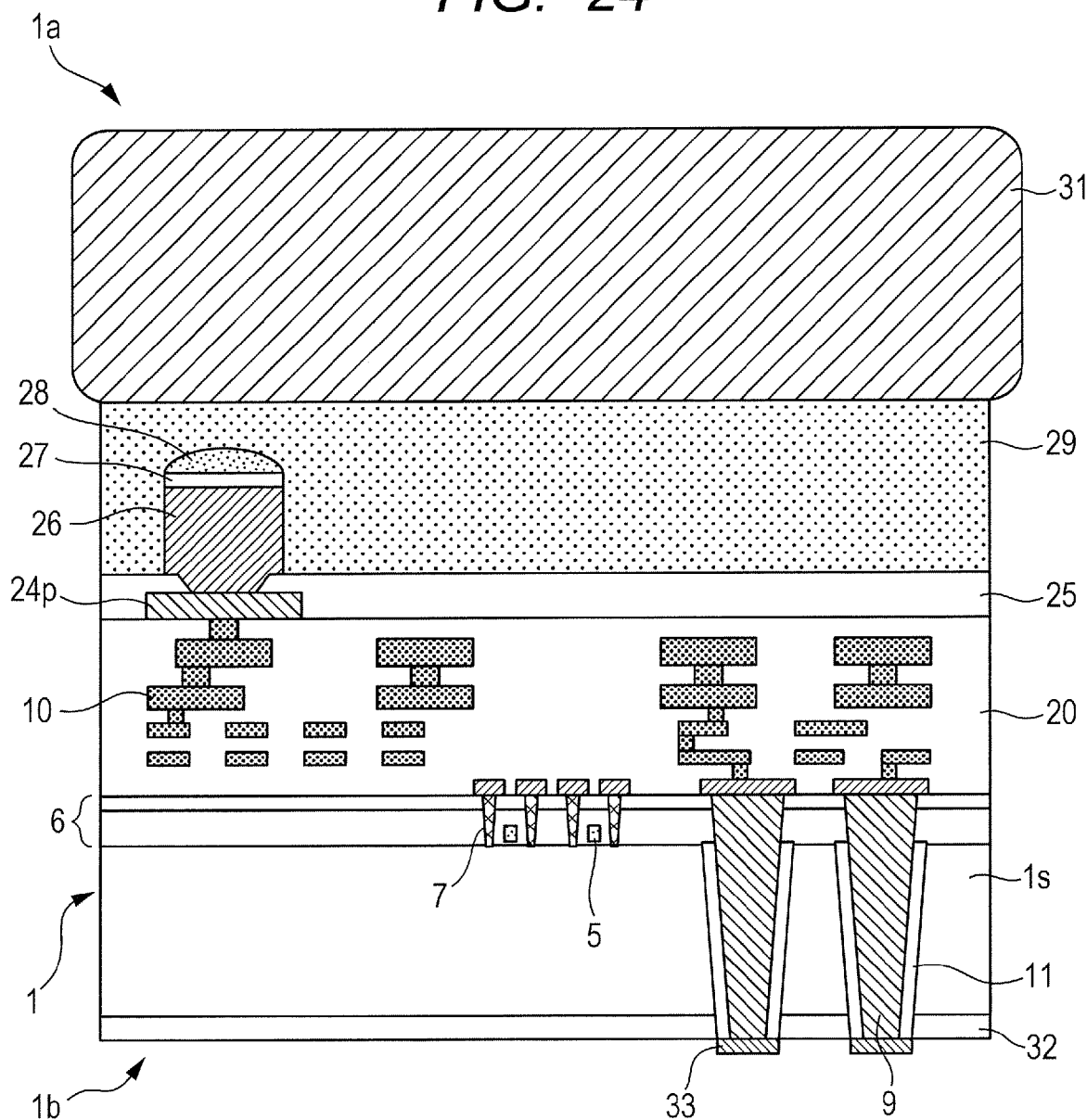
FIG. 24 is a schematic cross-sectional view (a step of forming a backside insulating film and a backside pad) of the entire wafer for globally describing the process after completion of a FEOL step in the method of manufacturing a semiconductor integrated circuit device according to First Embodiment of the invention.
Figure 25:
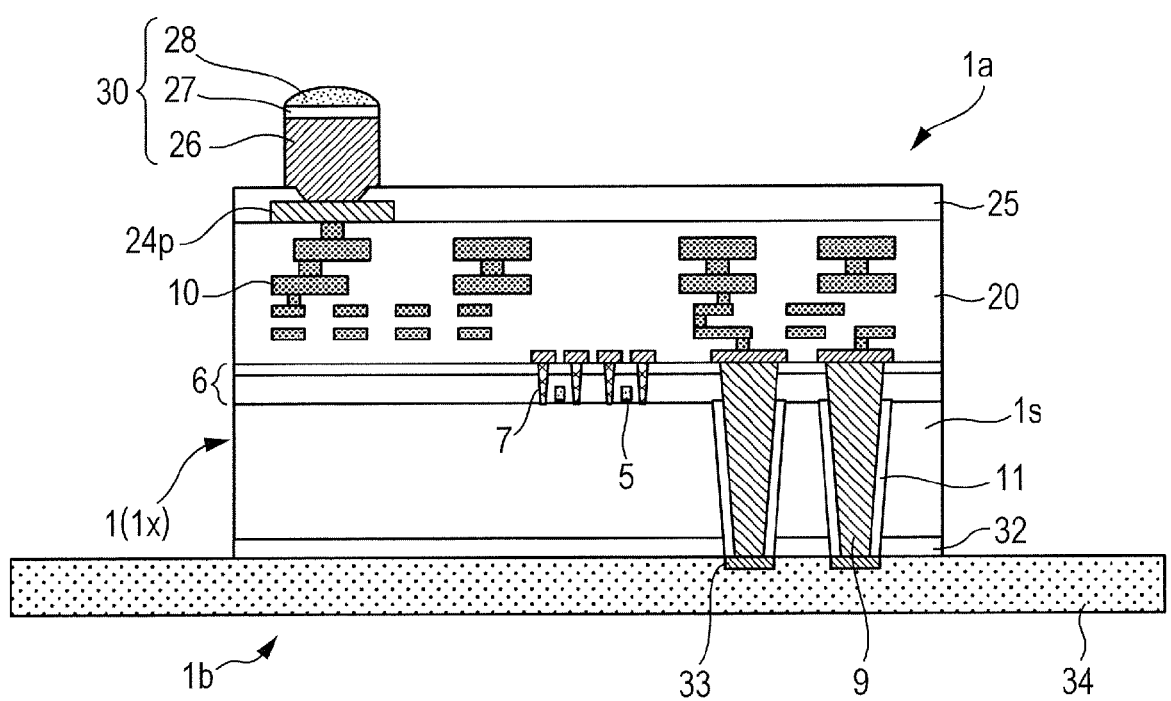
FIG. 25 is a schematic cross-sectional view (a step of mounting on a dicing tape and removing the glass support plate) of the entire wafer for globally describing the process after completion of a FEOL step in the method of manufacturing a semiconductor integrated circuit device according to First Embodiment of the invention.
Figure 26:
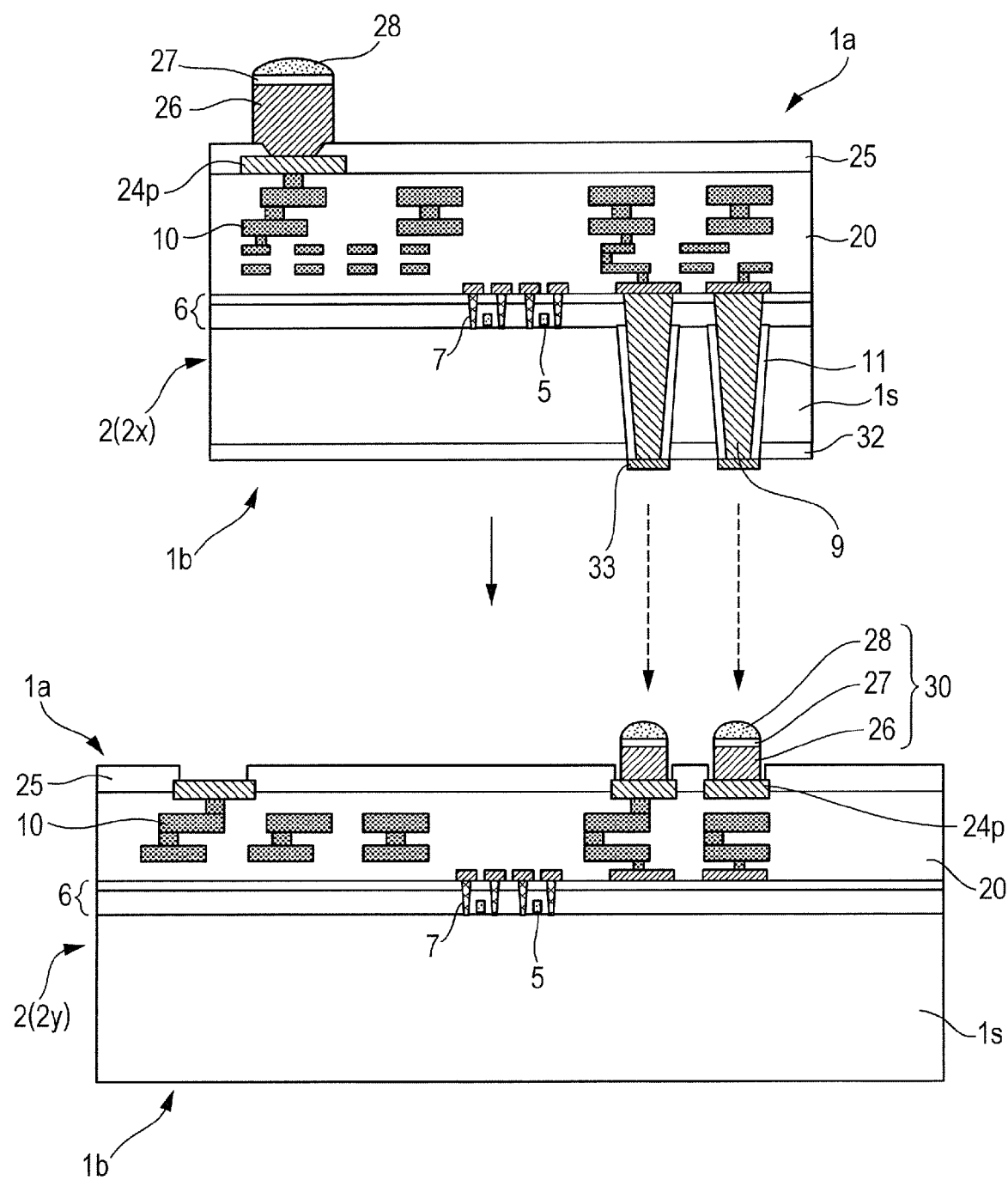
FIG. 26 is a schematic cross-sectional view (a step of dicing and die bonding onto another chip) of the entire wafer for globally describing the process after completion of a FEOL step in the method of manufacturing a semiconductor integrated circuit device according to First Embodiment of the invention.
Figure 27:
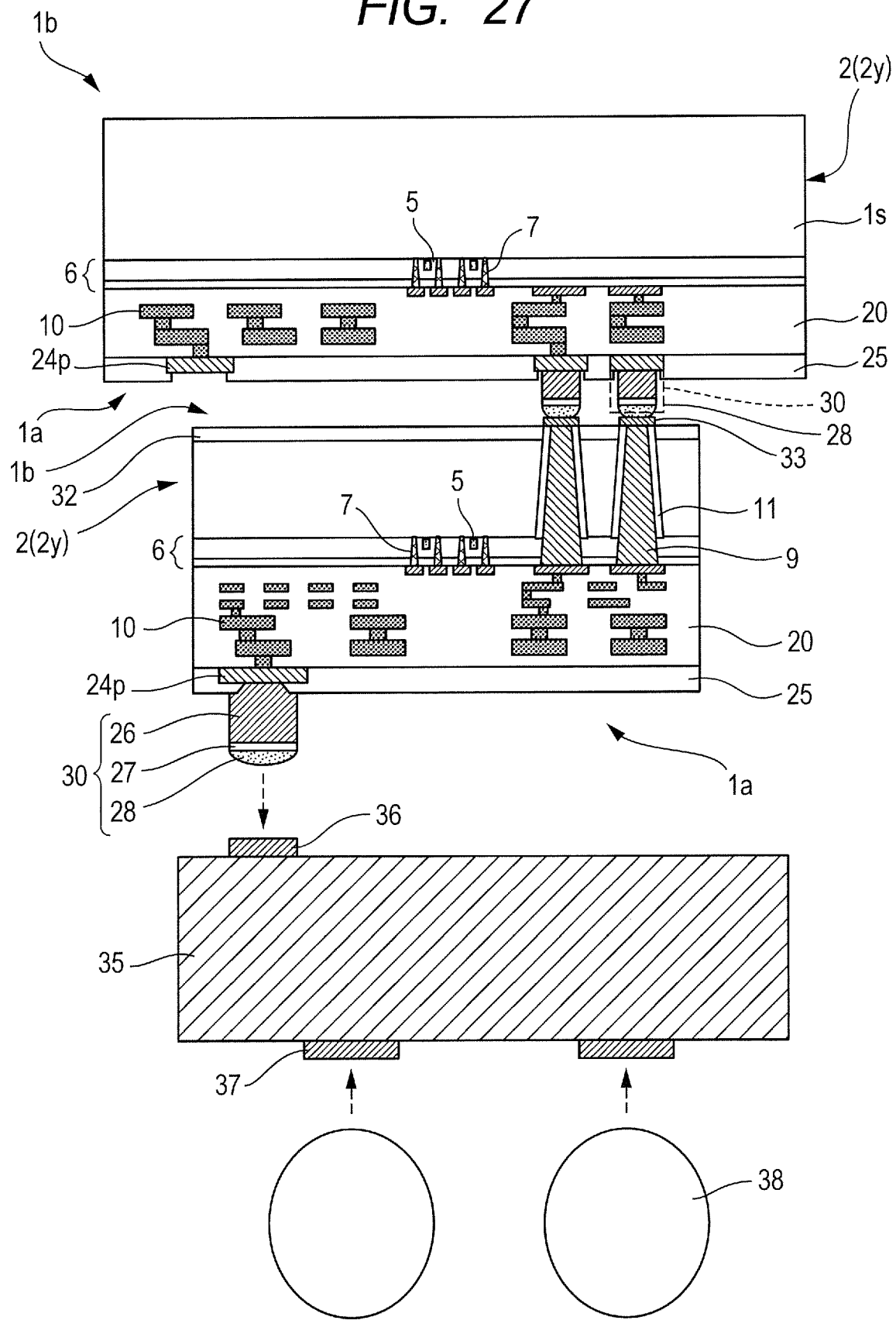
FIG. 27 is a schematic cross-sectional view (a step of die bonding onto a wiring substrate) of the entire wafer for globally describing the process after completion of a FEOL step in the method of manufacturing a semiconductor integrated circuit device according to First Embodiment of the invention.

FIG. 16 is a schematic cross-sectional view (at the time of completion of a FEOL step, that is, a view corresponding to FIG. 4) of the entire wafer for globally describing a process after completion of a FEOL step in the method of manufacturing a semiconductor integrated circuit device according to First Embodiment of the invention. FIG. 17 is a schematic cross-sectional view (a step of forming a first-level buried wiring) of the entire wafer for globally describing the process after completion of a FEOL step in the method of manufacturing a semiconductor integrated circuit device according to First Embodiment of the invention. FIG. 18 is a schematic cross-sectional view (a step of making a probe test of a wafer on a pad) of the entire wafer for globally describing the process after completion of a FEOL step in the method of manufacturing a semiconductor integrated circuit device according to First Embodiment of the invention. FIG. 19 is a schematic cross-sectional view (a step of making a probe test of a wafer on a bump) of the entire wafer for globally describing the process after completion of a FEOL step in the method of manufacturing a semiconductor integrated circuit device according to First Embodiment of the invention. FIG. 20 is a schematic cross-sectional view (a wafer edge trimming step) of the entire wafer for globally describing the process after completion of a FEOL step in the method of manufacturing a semiconductor integrated circuit device according to First Embodiment of the invention. FIG. 21 is a schematic cross-sectional view (a glass support plate attaching step) of the entire wafer for globally describing the process after completion of a FEOL step in the method of manufacturing a semiconductor integrated circuit device according to First Embodiment of the invention. FIG. 22 is a schematic cross-sectional view (a back grinding step) of the entire wafer for globally describing the process after completion of a FEOL step in the method of manufacturing a semiconductor integrated circuit device according to First Embodiment of the invention. FIG. 23 is a schematic cross-sectional view (a back etching step) of the entire wafer for globally describing the process after completion of a FEOL step in the method of manufacturing a semiconductor integrated circuit device according to First Embodiment of the invention. FIG. 24 is a schematic cross-sectional view (a step of forming a backside insulating film and a backside pad) of the entire wafer for globally describing the process after completion of a FEOL step in the method of manufacturing a semiconductor integrated circuit device according to First Embodiment of the invention. FIG. 25 is a schematic cross-sectional view (a step of mounting on a dicing tape and removing the glass support plate) of the entire wafer for globally describing the process after completion of a FEOL step in the method of manufacturing a semiconductor integrated circuit device according to First Embodiment of the invention. FIG. 26 is a schematic cross-sectional view (a step of dicing and die bonding onto another chip) of the entire wafer for globally describing the process after completion of a FEOL step in the method of manufacturing a semiconductor integrated circuit device according to First Embodiment of the invention. FIG. 27 is a schematic cross-sectional view (a step of die bonding onto a wiring substrate) of the entire wafer for globally describing the process after completion of a FEOL step in the method of manufacturing a semiconductor integrated circuit device according to First Embodiment of the invention. Based on these drawings, a global description will next be made on the process after completion of an FEOL step in the method of manufacturing a semiconductor integrated circuit device according to First Embodiment of the invention.

FIG. 4 is shown as FIG. 16 from a more global viewpoint. From FIG. 16 to FIG. 27 (also, FIG. 28), the structure in the semiconductor substrate except for a structure having a direct relationship with the through via and through via electrode is omitted (for example, an impurity-doped region and STI region) in order to avoid complicating the drawings.

Next, as shown in FIG. 17, a through via electrode 9 is formed as described above in Section 2. Then, for example, simultaneously with the formation of a first-level buried wiring 8 on a conductive plug 7, a first-level buried wiring 8 is formed on the through via electrode 9 as needed.

Next, as shown in FIG. 18, a multilayer intermediate-level buried wiring 19 (for example, a copper-based buried wiring made by the dual damascene process) buried in an intermediate-level & upper-level interlayer insulating film 21 made mainly of a silicon oxide-based insulating film (for example, a low-k porous SiOC-based silicon oxide film) is formed on a first-level wiring interlayer insulating film 12 as needed. Next, on the intermediate-level buried wiring 19, formed is an uppermost-level wiring 22 (an uppermost-level buried wiring, for example, a copper-based buried wiring formed, for example, by the dual damascene process) except for a pad layer buried in the intermediate-level & upper-level interlayer insulating film 21. Here, the first-level wiring interlayer insulating film 12, the intermediate-level & upper-level interlayer insulating film 21, and the like constitute a wiring interlayer insulating film 20. Then, in the wiring interlayer insulating film 20 on the uppermost-level wiring 22, for example, a tungsten plug 23 is buried as an upper layer. Next, on the wiring interlayer insulating film 20, an electrode pad 24p (for example, an aluminum pad) is formed and a portion thereon except for a pad opening is covered with a final passivation film 25. Preferred examples of the final passivation film 25 include a silicon oxide-based insulating film and a silicon nitride-based insulating film, and a composite film thereof (they are called "inorganic final passivation film", collectively). An organic final passivation film (for example, a polyimide-based resin film) may be formed on the inorganic final passivation film. Next, for example, a probe 51 is brought into contact with the electrode pad 24p to conduct a wafer probe test. This test is, needless to say, not essential.

Next, as shown in FIG. 19, a metal bump electrode 26 such as copper bump electrode is formed on the electrode pad 24p via an UBM (under bump metal) layer, for example, by electroplating. Next, on the copper bump electrode 26, for example, a solder barrier metal film 27 (for example, a nickel film) is formed by electroplating or the like. Then, on the solder barrier metal film 27, a solder layer 28 (for example, a tin-silver-based solder) such as lead-free solder is formed by electroplating or the like. Next, the probe 51 is brought into contact with the solder layer 28 to conduct a wafer probe test. This test is, needless to say, not essential.

Then, as shown in FIG. 20, edge trimming of the wafer 1 on the device surface 1a side is conducted as needed.

Next, as shown in FIG. 21, a support substrate 31 (for example, a glass support wafer) is attached to the device surface 1a side of the wafer 1 via an adhesive layer 29.

Next, as shown in FIG. 22, the back surface 1b (second main surface) of the wafer 1 is subjected to film thinning treatment such as back grinding treatment while having the support substrate 31 on the wafer to expose the lower end portions of the through via electrode 9, more precisely, the lower end portion of the through via main-metal electrode 9a. By the film thinning treatment conducted here, the thickness of the wafer is reduced to a value close to the target thickness of the final wafer. The grinding amount is therefore a difference obtained by subtracting the target thickness of the wafer (for example, about 50 μm) from the original thickness of the wafer (for example, about 700 μm).

Next, as shown in FIG. 23, the through via electrode 9 and the like are protruded a little from the back surface 1b of the wafer 1 by slightly etching the silicon substrate on the back surface 1b side of the wafer 1 by using, for example, dry etching (using a halogen-based gas as a gas system). This etching is so-called back etching.

Next, as shown in FIG. 24, a resin film such as polyimide is applied, as a backside insulating film 32, to almost the entire surface of the wafer 1 on the back surface 1b side, followed by CMP or etch-back to planarize it and expose the lower end portions of the through via electrode 9 again. Next, for example, a titanium film, a copper film, a nickel film, and the like are formed in the order of mention from the wafer 1 side on almost the entire surface of the wafer 1 on the back surface 1b side, for example, by sputtering. The resulting film stack is then patterned, for example, by wet etching to form a backside pad 33. Next, by exposing the wafer to ultraviolet rays through the support substrate 31 to reduce the adhesive force of the adhesive layer 29, the support substrate 31 and the adhesive layer 29 are removed from the surface 1a (device surface) of the wafer 1.

Next, as shown in FIG. 25, the back surface 1b of the wafer 1 (1x) is attached to a dicing tape 34 attached to a dicing frame. In this state, the wafer 1 (1x) is divided into individual chip regions, for example, by dicing.

Next, as shown in FIG. 26, the backside pad 33 on the back surface 1b of the divided chip 2 (2x) is bonded to, for example, the bump electrode 30 on the device surface 1a of another chip 2 (2y) formed in a similar manner, for example, by solder bonding. By this bonding, a plurality of through via electrodes is coupled to bump electrodes provided on another semiconductor substrate.

Next, as shown in FIG. 27, the bump electrode 30 on the device surface 1a of the chip 2 (2x) and an upper land 36 on the upper surface of a multilayer wiring substrate 35 are coupled to each other, for example, by solder bonding (meaning flip chip bonding). Next, an external solder bump electrode 38 (solder ball) is attached (meaning, ball mounting) to a lower land 37 on the lower surface of the multilayer wiring substrate 35, for example, by reflow. As a result, BGA (ball grid array) is almost completed.

4. A supplementary description on a wafer probe test in the method of manufacturing a semiconductor integrated circuit device according to First Embodiment of the invention (FIG. 28).

This Section describes an additional technology useful for overcoming the problems which may occur in the wafer probe test conducted at each time in the manufacture. This method is therefore not essential.

Figure 28:
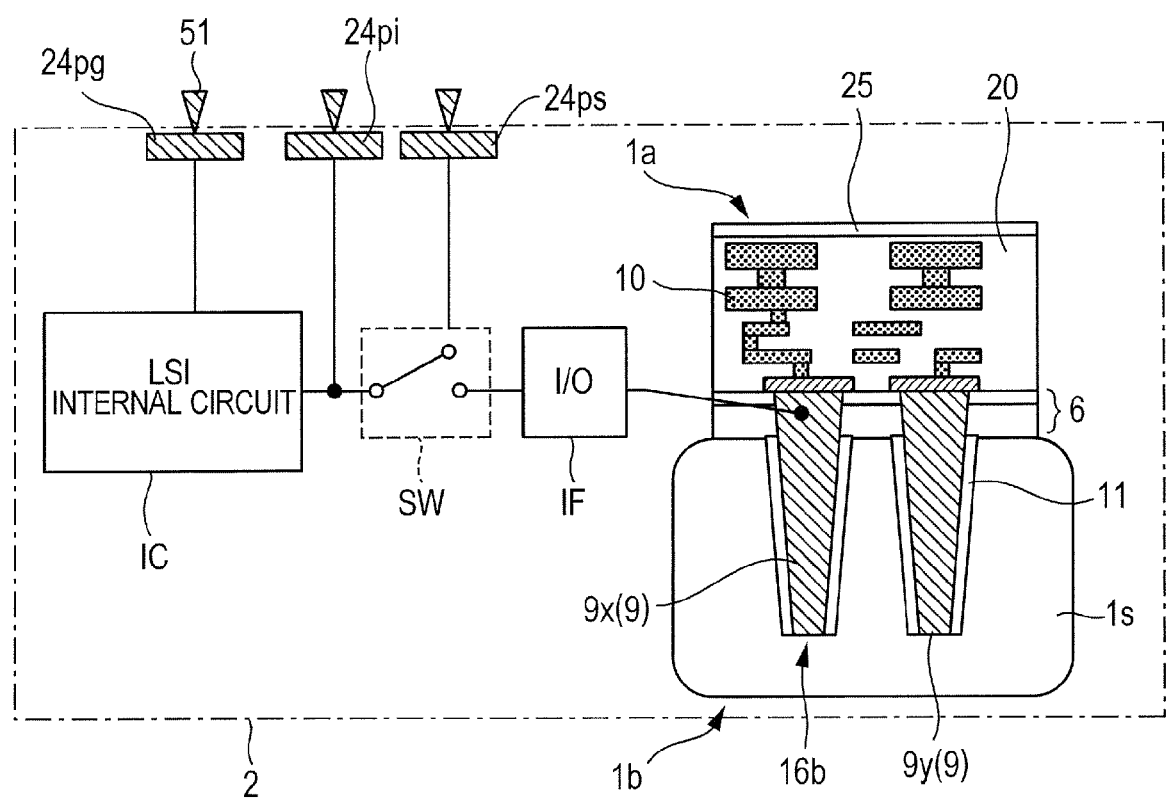
FIG. 28 is a schematic circuit diagram in a chip region of a wafer for providing a supplementary description on a wafer probe test in the method of manufacturing a semiconductor integrated circuit device according to First Embodiment of the invention.

FIG. 28 is a schematic circuit diagram in a chip region in a wafer for providing a supplementary description on a wafer probe test in the method of manufacturing a semiconductor integrated circuit device according to First Embodiment of the invention. Based on this drawing, a supplementary description on a wafer probe test in the method of manufacturing a semiconductor integrated circuit device according to First Embodiment of the invention will be made.

In Embodiments which have been described previously (for example, FIG. 18 or FIG. 19), almost all the through via electrodes 9 have continuity to the substrate region is of the wafer 1. When some of the through via electrodes 9 are electrically coupled to an electrode (electrode pad 24p or bump electrode 30) to be used for the wafer probe test and the electrode is a data input electrode, it is sometimes impossible to make the test.

An example of a method for avoiding such an inconvenience will next be described. Supposing that as shown in FIG. 28, for example, an output electrode pad 24pg, a data input electrode pad 24pi, and the like are electrically coupled to an LSI internal circuit IC of this chip 2 and this data input electrode pad 24pi is coupled to one of through via electrodes 9x and 9y, for example, via an input/output circuit IF. When the data input electrode pad is coupled to the through via electrode 9x, even if data is input to the data input electrode pad 24pi, it is sometimes impossible to make a test normally due to an influence of the semiconductor substrate portion 1s, for example, at a ground potential.

In this example, to avoid such a case, for example, a switch or switch circuit SW is inserted between the LSI internal circuit IC and the input/output circuit 1F to switch off by a signal from a switch control electrode pad 24ps (usually, ON state). This enables a normal probe test.

5. Supplementary description on VC (voltage contrast) test in the method of manufacturing a semiconductor integrated circuit device according to First Embodiment of the invention (mainly, FIGS. 29 and 30)

In this section, a description will be made on a conduction test of a through via electrode by using electron beams or the like, which test is conducted, for example, in the step (at the time of completion of filling of a through via) of FIG. 11 in Section 2.

Figure 29:
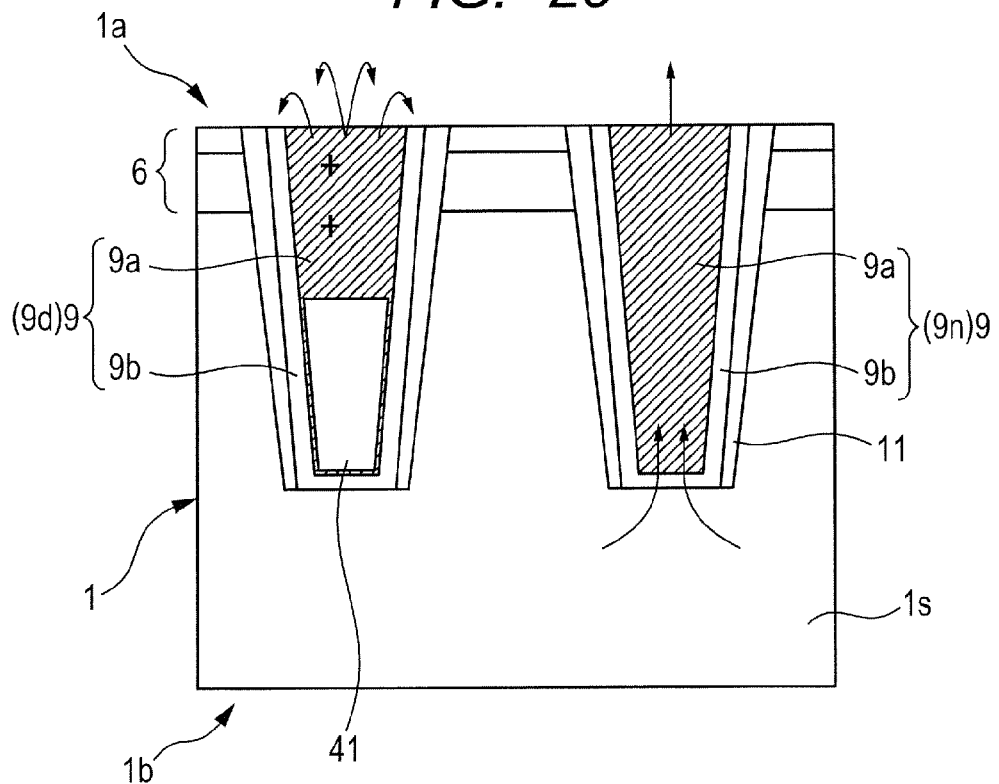
FIG. 29 is a schematic cross-sectional view of the wafer at the periphery of the through via for providing a supplementary description on a PVC (Positive Voltage Contrast) test in the method of manufacturing a semiconductor integrated circuit device according to First Embodiment of the invention.
Figure 30:
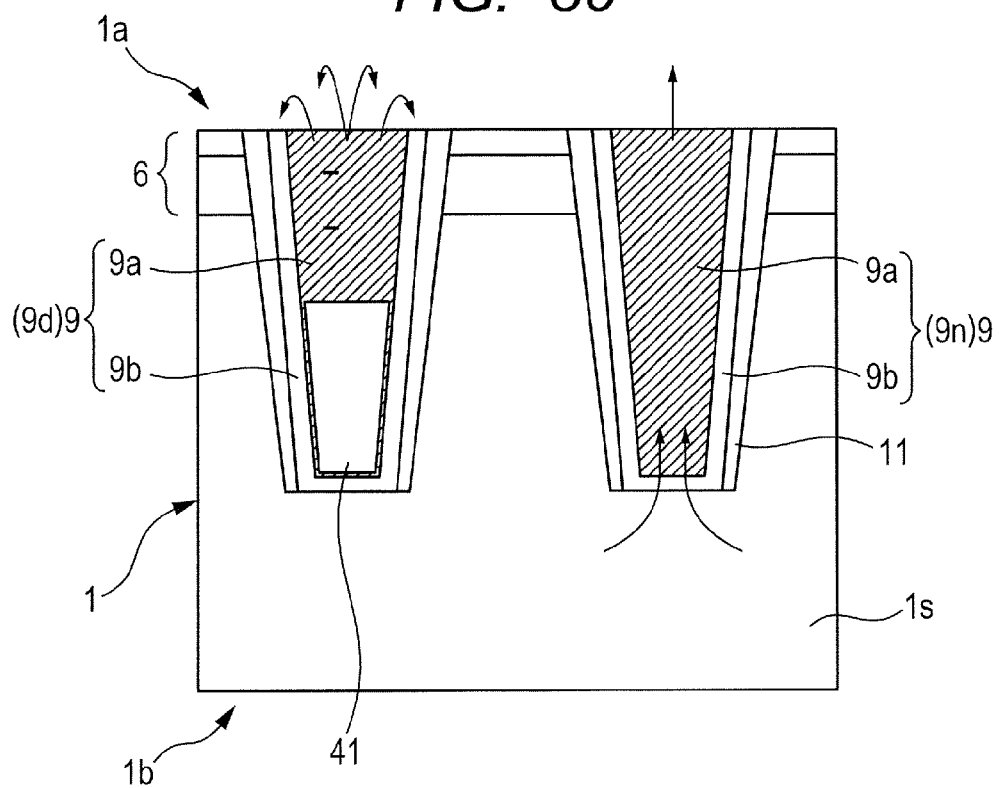
FIG. 30 is a schematic cross-sectional view of the wafer at the periphery of the through via for providing a supplemental description on a NVC (Negative Voltage Contrast) test in the method of manufacturing a semiconductor integrated circuit device according to First Embodiment of the invention.

FIG. 29 is a schematic cross-sectional view of the wafer at the periphery of the through via for providing a supplementary description on a PVC (positive voltage contrast) test in the method of manufacturing a semiconductor integrated circuit device according to First Embodiment of the invention. FIG. 30 is a schematic cross-sectional view of the wafer at the periphery of the through via for providing a supplemental description on a NVC (negative voltage contrast) test in the method of manufacturing a semiconductor integrated circuit device according to First Embodiment of the invention. Based on them, a supplementary description on the VC (voltage contrast) tests in the method of manufacturing a semiconductor integrated circuit device according to First Embodiment of the invention will next be made.

(1) Description on PVC Test (Mainly FIG. 29)

This voltage contrast test can be roughly classified into two types. One is a PVC (positive voltage contrast) test in which the surface $1a$ side of the wafer 1 is positively charged, while the other one is an NVC (negative voltage contrast) test in which the surface $1a$ side of the wafer 1 is negatively charged. First, the PVC test is described.

In the PVC test, as shown in FIG. 29, when a through via electrode $9n$ is normal, electrons are supplied thereto from the semiconductor substrate portion $1s$ so that charging does not proceed and the electrode looks bright. On the other hand, when a through via electrode $9d$ is in a non-conducting state, no electrons are supplied thereto from the semiconductor substrate portion $1s$ so that charging proceeds and the electrode looks dark.

Thus, since in the manufacturing steps, the bottom of all the through via electrodes is substantially electrically coupled to the semiconductor substrate portion $1s$, it becomes possible to distinguish easily between an abnormal through via electrode and a normal through via electrode in a very early stage after completion of the burying of the through via electrode. This also applies completely to the following NVC test.

(2) Description on NVC Test (Mainly, FIG. 30)

In the NVC test, as shown in FIG. 30, the through via electrode $9n$ is normal and electrons are supplied thereto from the semiconductor substrate portion $1s$ so that charging does not proceed and the electrode looks dark. On the other hand, when the through via electrode $9d$ is in a non-conducting state, no electrons are supplied thereto so that charging proceeds and the electrode looks bright.

(3) Appropriate Timing of These Tests

Figure 38:
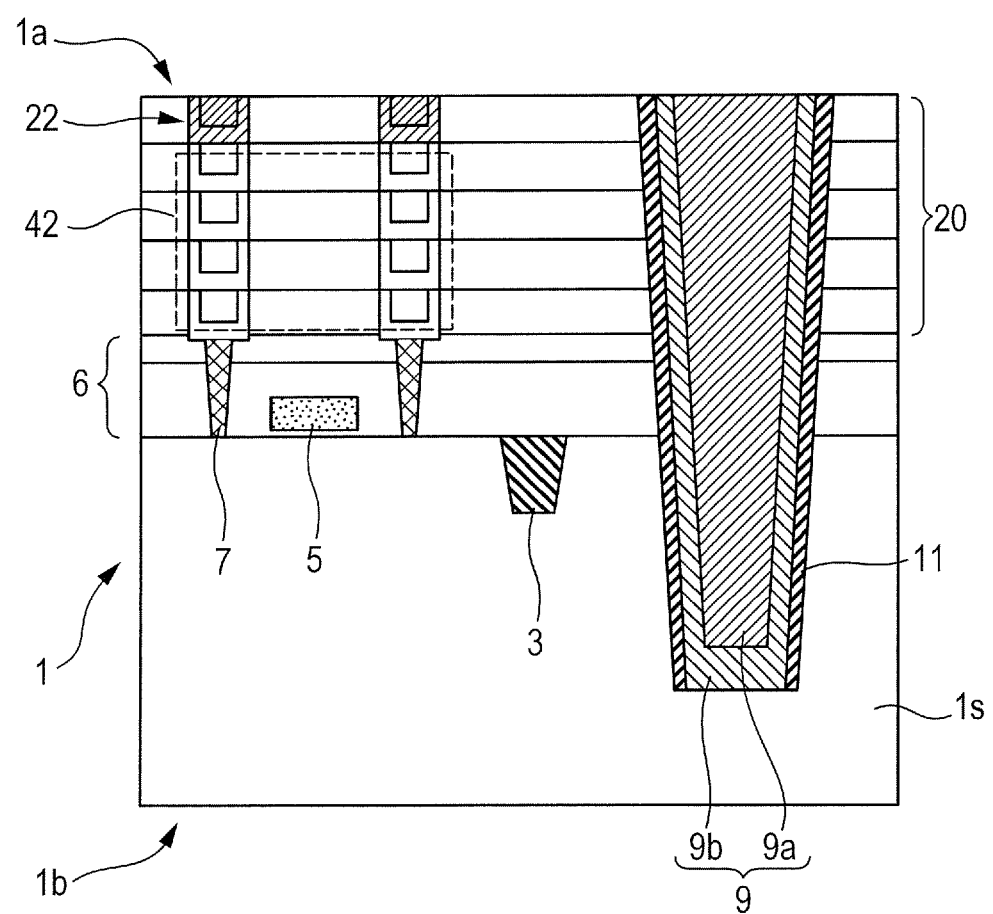
FIG. 38 is a schematic cross-sectional view (a step of burying and planarizing a through via electrode) showing the region R1 of the wafer at the peripheries of the MISFET and through via cut out from FIG. 2 for describing the modification example (a via last process) of the through via formation process in the method of manufacturing a semiconductor integrated circuit device according to First Embodiment of the invention.
Figure 42:
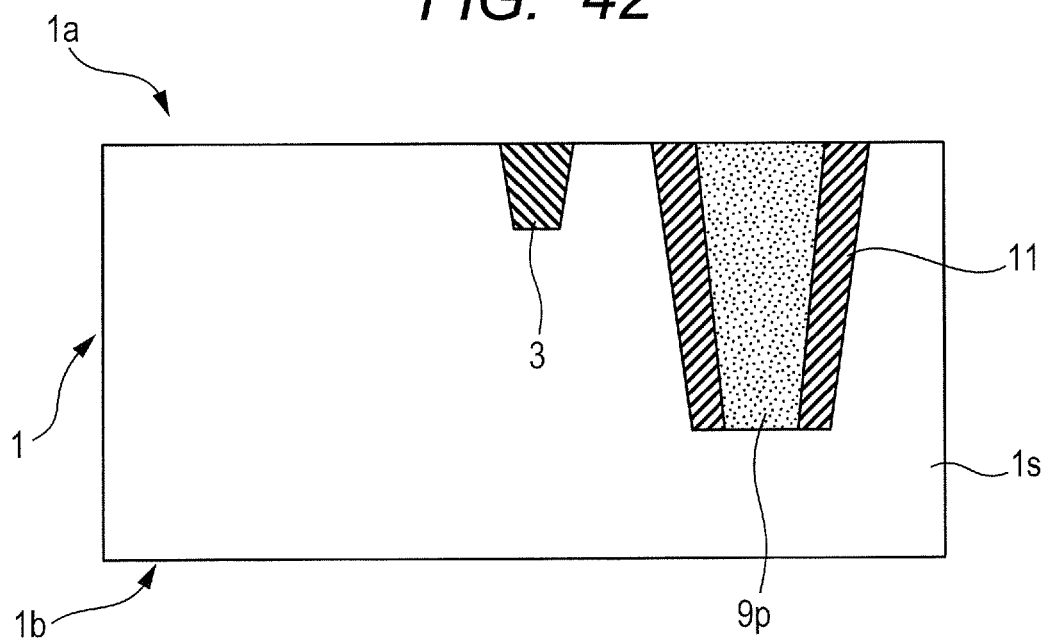
FIG. 42 is a schematic cross-sectional view (a step of burying and planarizing a through via electrode) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention.
Figure 51:
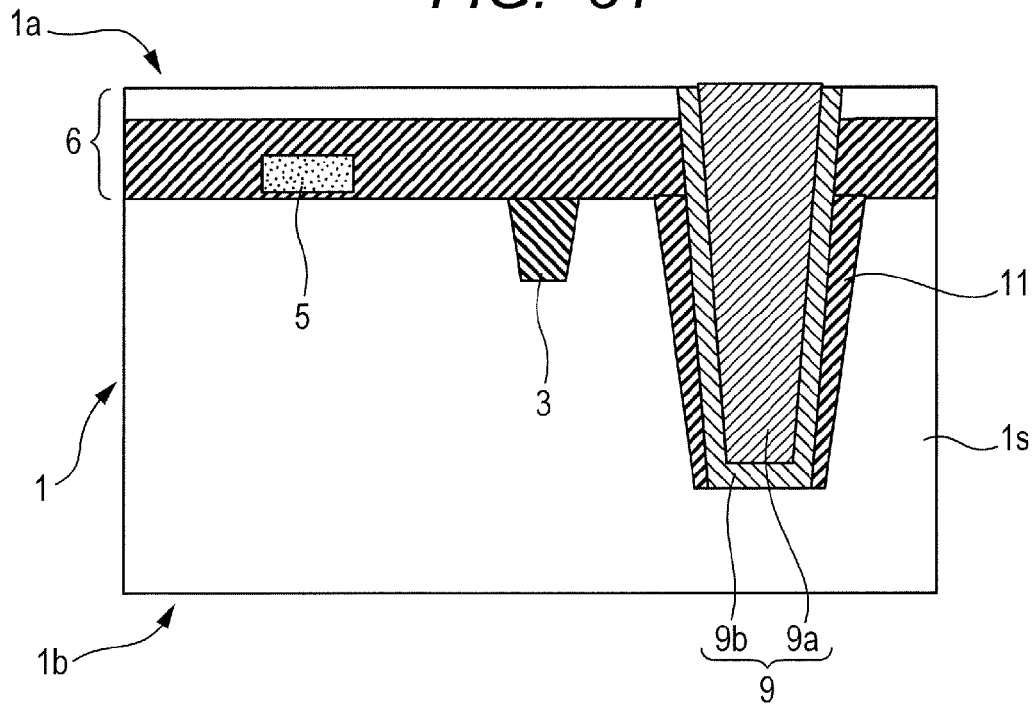
FIG. 51 is a schematic cross-sectional view (a step of burying and planarizing a through via electrode) showing the region R1 of the wafer at the peripheries of the MISFET and through via cut out from FIG. 2 for describing the modification example (a via first contact process) of the through via formation process in the method of manufacturing a semiconductor integrated circuit device according to First Embodiment of the invention.

Examples of the appropriate timing of these tests include steps shown in FIG. 11 in Section 2, FIG. 38, FIG. 42, and FIG. 51 (each, at the time of completion of filling of the through via). Thus, it is possible to relatively easily test the conduction state of many (a plurality of) through via electrodes immediately after the completion (without waiting for the subsequent step) by exposing the device surface of the wafer to electron beams.

6. Supplementary description on improvement in contact resistance at via bottom in the method of manufacturing a semiconductor integrated circuit device according to First Embodiment of the invention (mainly, from FIG. 31 to FIG. 33).

This section describes an additional method for further improving the electrical coupling state between the through via electrode 9 and the semiconductor substrate portion $1s$ which has been described previously.

Figure 31:
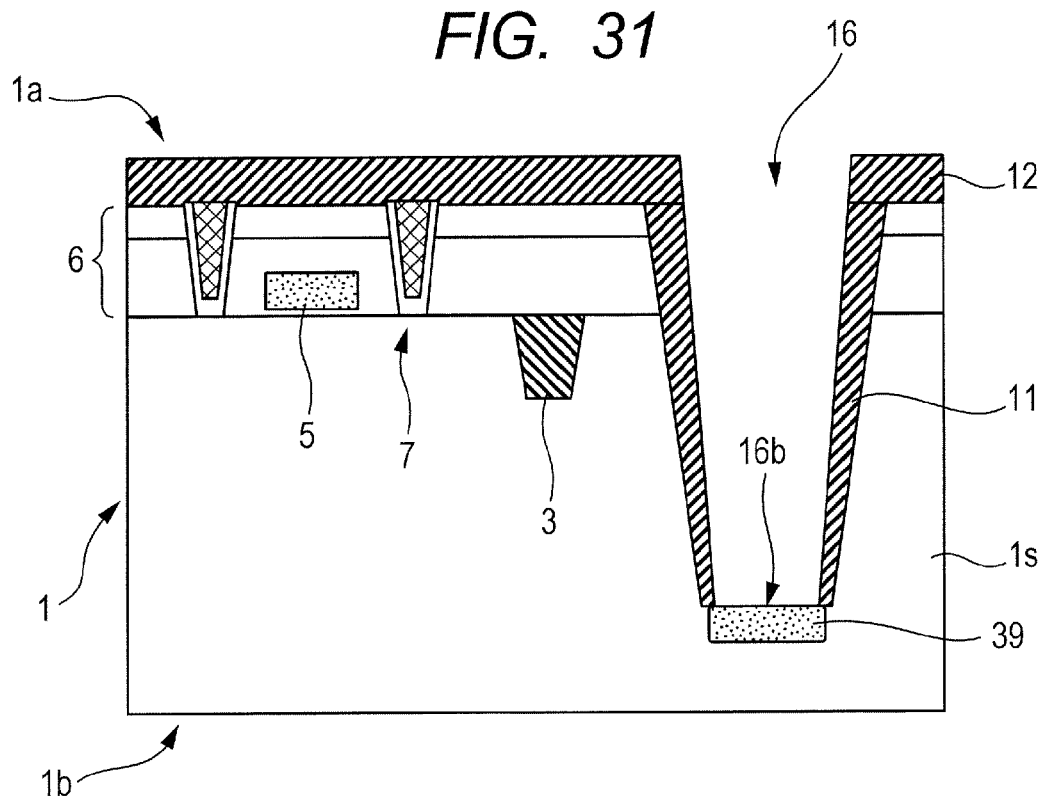
FIG. 31 is a schematic cross-sectional view (a step of introducing a through-via bottom heavily-doped region) showing the region R1 of the wafer at the peripheries of the MISFET and through via cut out from FIG. 2 and corresponding to FIG. 9 for providing a supplementary description on improvement in contact resistance at the via bottom in the method of manufacturing a semiconductor integrated circuit device according to First Embodiment of the invention.
Figure 32:
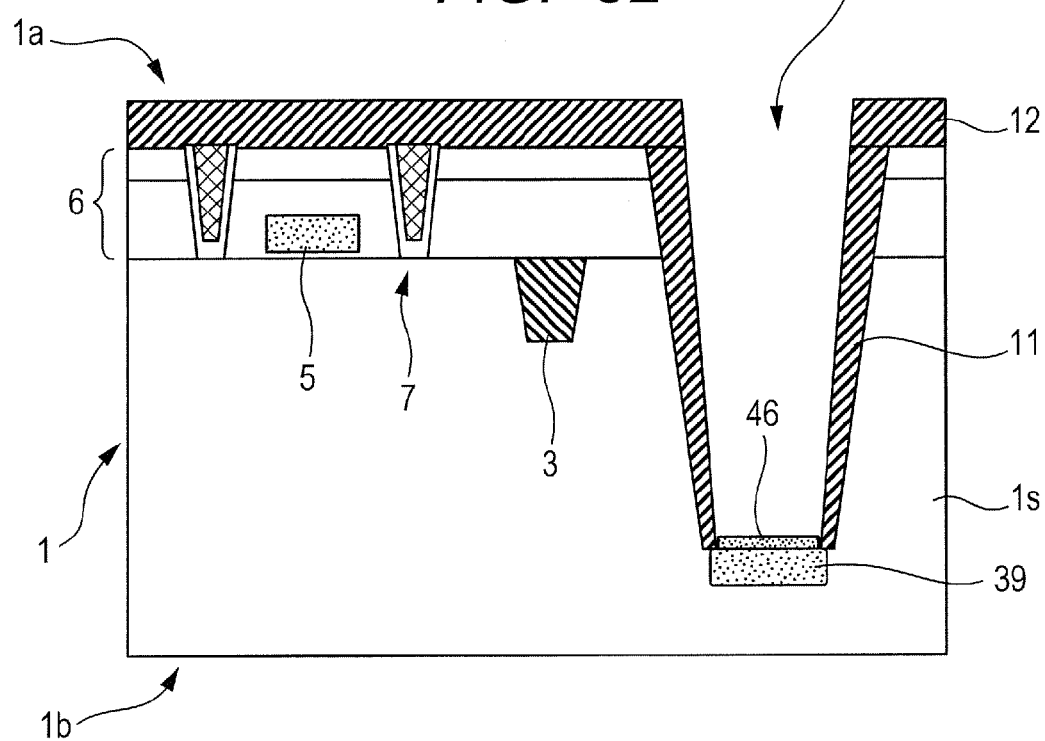
FIG. 32 is a schematic cross-sectional view (a step of introducing a through-via bottom silicide layer) showing the region R1 of the wafer at the peripheries of the MISFET and through via cut out from FIG. 2 and corresponding to FIG. 9 for providing a supplementary description on improvement in contact resistance at the via bottom in the method of manufacturing a semiconductor integrated circuit device according to First Embodiment of the invention.
Figure 33:
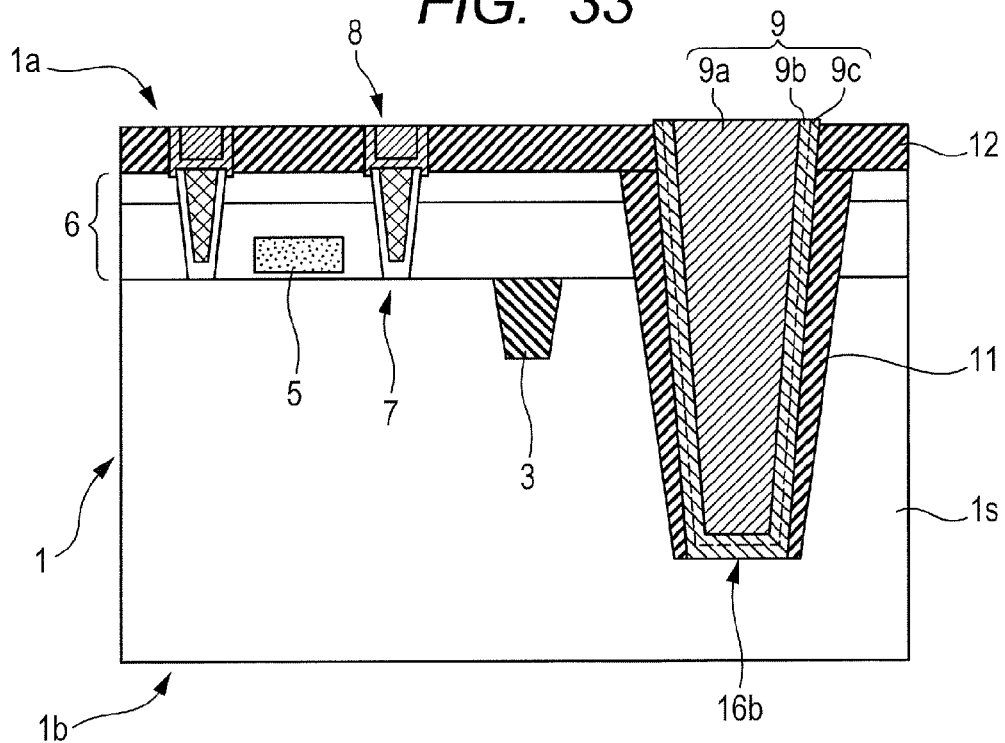
FIG. 33 is a schematic cross-sectional view (a step of burying and planarizing a through via electrode) showing the region R1 of the wafer at the peripheries of the MISFET and through via cut out from FIG. 2 and corresponding to FIG. 15 for providing a supplementary description on improvement in contact resistance at the via bottom in the method of manufacturing a semiconductor integrated circuit device according to First Embodiment of the invention.

FIG. 31 is a schematic cross-sectional view (a step of introducing a through-via bottom heavily doped region) showing the region R1 of the wafer at the peripheries of the MISFET and through via cut out from FIG. 2 and corresponding to FIG. 9 for providing a supplementary description on improvement in contact resistance at the via bottom in the method of manufacturing a semiconductor integrated circuit device according to First Embodiment of the invention. FIG. 32 is a schematic cross-sectional view (a step of introducing a through-via bottom silicide layer) showing the region R1 of the wafer at the peripheries of the MISFET and through via cut out from FIG. 2 and corresponding to FIG. 9 for providing a supplementary description on improvement in contact resistance at the via bottom in the method of manufacturing a semiconductor integrated circuit device according to First Embodiment of the invention. FIG. 33 is a schematic cross-sectional view (a step of burying and planarizing a through via electrode) showing the region R1 of the wafer at the peripheries of the MISFET and through via cut out from FIG. 2 and corresponding to FIG. 15 for providing a supplementary description on improvement in contact resistance at the via bottom in the method of manufacturing a semiconductor integrated circuit device according to First Embodiment of the invention. Based on them, a supplementary description will be made on the improvement in contact resistance at the via bottom in the method of manufacturing a semiconductor integrated circuit device according to First Embodiment of the invention.

(1) Description on Introduction of Heavily Doped Region to Through-via Bottom (Mainly FIG. 31)

As shown in FIG. 31, to the semiconductor substrate portion $1s$ (for example, a p type silicon substrate) is introduced a p type impurity (for example, boron) at a higher concentration than that of the semiconductor substrate portion from the device surface $1a$ of the wafer 1, for example, by ion implantation, for example, at a stage of completion of removal of the insulating film from the through-via bottom $16b$ of FIG. 9. The following is a formal example of implantation conditions: an implantation angle: substantially right angle, dose: for example, about $1 \times 10^{15}/cm^2$, and implantation energy: for example, about 50 KeV. By providing a heavily-doped region 39 in the semiconductor substrate portion $1s$ at the through-via bottom $16b$, an ohmic contact can be formed between the through via electrode 9 and the semiconductor substrate portion $1s$.

The ion implantation may be conducted using a pattern such as resin film. Alternatively it may be conducted in self alignment without using the resist film and in this case, the process becomes simpler. Using a resist film, on the other hand, improves freedom of the process.

The ion implantation may be conducted, as shown in FIG. 8, while having an insulating film at the bottom of the through-via bottom. In this case, however, a little higher implantation energy is required. This method has also the merit of facilitating the process.

It is also possible to carry out ion implantation while having a sacrificial oxide film on the bottom of the through via as shown in FIG. 9. This has the merit of excluding introduction of contaminants.

When the semiconductor substrate portion $1s$ an N type, impurities to be introduced are N type, for example, phosphorus or arsenic.

As described above, according to such a process, since a region having the same conductivity type as that of the substrate portion and being heavily doped is formed in the semiconductor substrate portion in the vicinity of the lower end of each of the through via electrodes at least at the time of completion of filling of the through via (for example, FIG. 11), each of the through via electrodes and the semiconductor substrate portion are in good contact.

(2) Description on Introduction of Metal Silicide Film to Through-via Bottom (Mainly, FIG. 32)

After the step of FIG. 31, as shown in FIG. 32, the contact resistance can be reduced further by forming a metal silicide film 46 (examples of the material therefor include nickel-based silicide, tungsten silicide, cobalt silicide, and platinumbased silicide) on the surface of the heavily-doped region 39. Since the metal silicide layer is formed between each of the through via electrodes and the semiconductor region in the vicinity thereof, it has the merit of improving mutual contact between them.

(3) Description on Modification Example of Detailed Structure of Barrier Metal Film on Inner Surface of Through Via (Mainly FIG. 33)

As shown in FIG. 33, for example, after completion of removal of the insulating film from the through-via bottom 16b in FIG. 9 but prior to formation of the through-via barrier metal film 9b, that is, a titanium nitride film in FIG. 10, a relatively thin titanium film 9c (having a thickness of, for example, 10 nm) is formed almost all over the surface of the wafer 1 on the device surface 1a side, for example, by sputtering. By using a titanium film as an outside film and a titanium nitride film as an inside film to form a barrier metal structure, good contact characteristics can be secured due to improved adhesion of the titanium film to the oxide film or the like and reducing action to silicon.

7. Description on modification example (a via last process) of through via formation process in the method of manufacturing a semiconductor integrated circuit device according to First Embodiment of the invention (mainly, from FIG. 34 to FIG. 39).

In this section, an example of a via last process will be described as a modification example of the process described in Section 2 or the like in the timing of through via formation. The flow of the process is fundamentally similar to that described in FIG. 4 to FIG. 27 except for the portion of the through via, because the timing of through via formation is transferred from the time of completion of the premetal region to the time of completion of the uppermost-level buried wiring 22. Accordingly, a portion which varies depending on the transfer of the timing of the through via formation will hereinafter be described in principle.

Here, a via last process in which formation of a through via is started after substantial completion of a buried wiring forming step will be described. To simplify drawings, the structure of the second or higher-level buried wirings which is a dual damascene structure is shown as a simple structure similar to that of the first-level buried wiring which is a single damascene structure.

Figure 34:
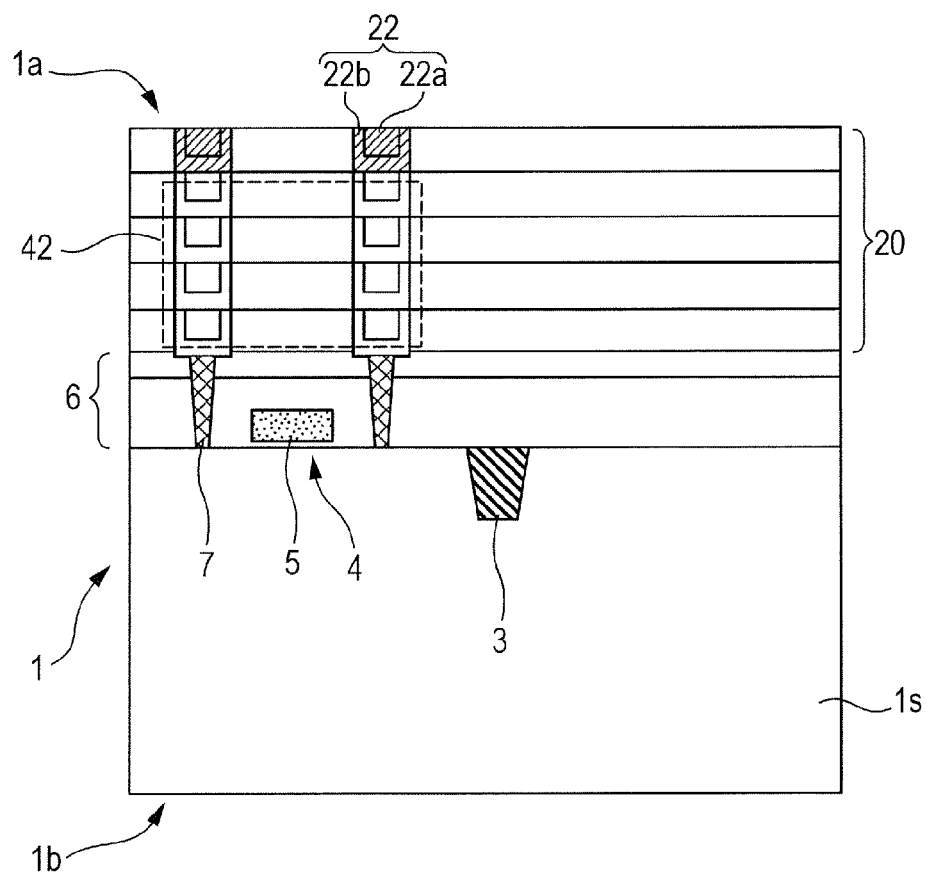
FIG. 34 is a schematic cross-sectional view (at the time of completion of an uppermost-level buried wiring forming step) showing the region R1 of the wafer at the peripheries of the MISFET and through via cut out from FIG. 2 for describing a modification example (a via last process) of the through via formation process in the method of manufacturing a semiconductor integrated circuit device according to First Embodiment of the invention.
Figure 35:
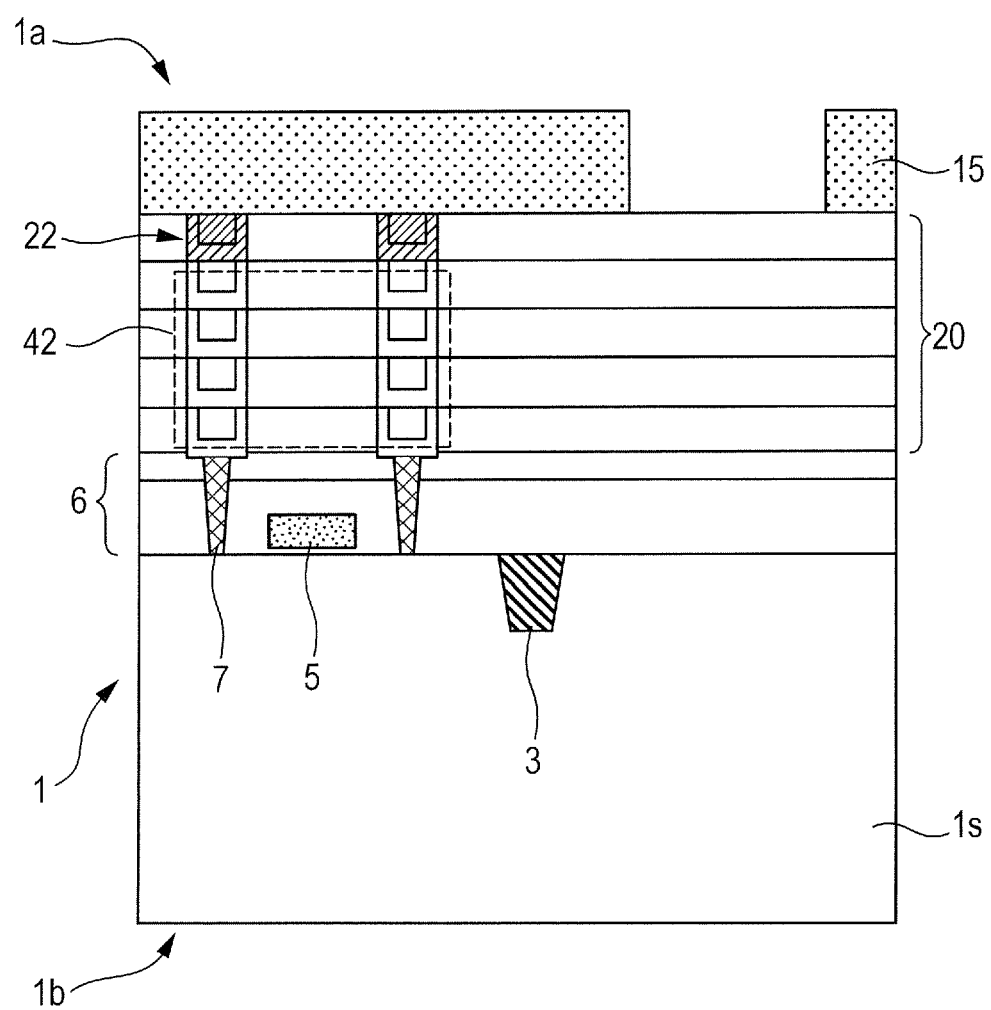
FIG. 35 is a schematic cross-sectional view (a step of patterning a through via forming resist film) showing the region R1 of the wafer at the peripheries of the MISFET and through via cut out from FIG. 2 for describing the modification example (a via last process) of the through via formation process in the method of manufacturing a semiconductor integrated circuit device according to First Embodiment of the invention.
Figure 36:
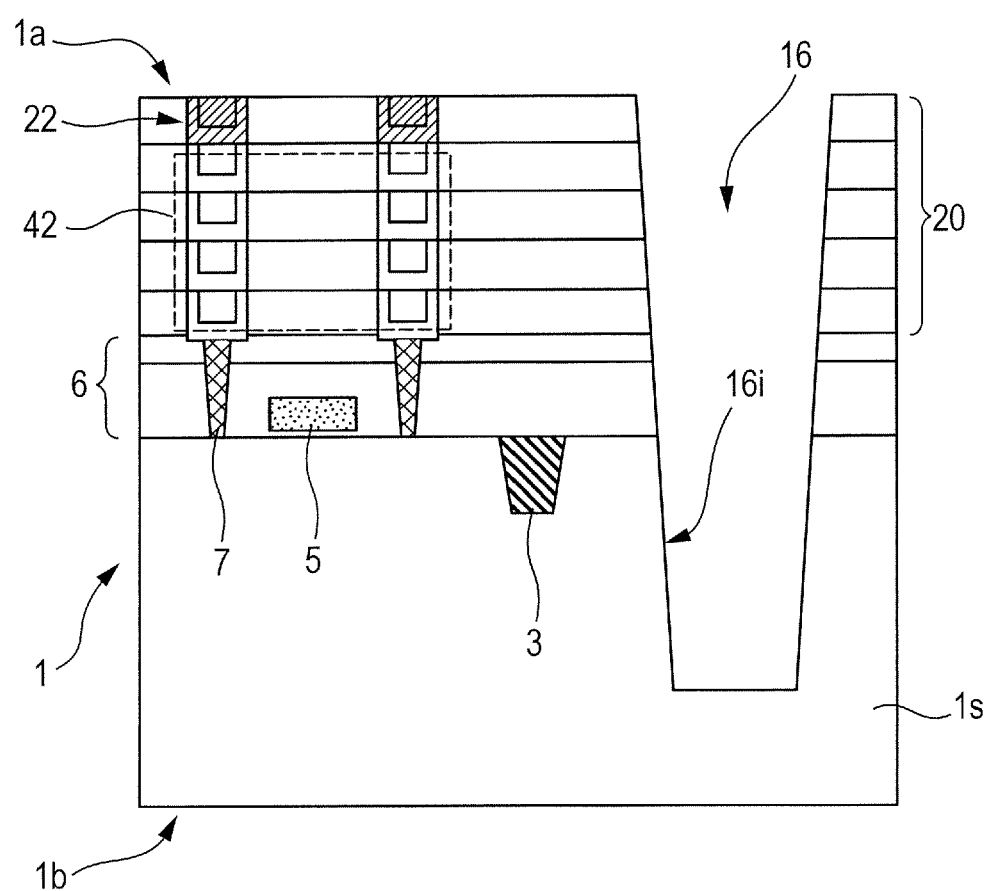
FIG. 36 is a schematic cross-sectional view (a step of forming a through via) showing the region R1 of the wafer at the peripheries of the MISFET and through via cut out from FIG. 2 for describing the modification example (a via last process) of the through via formation process in the method of manufacturing a semiconductor integrated circuit device according to First Embodiment of the invention.
Figure 37:
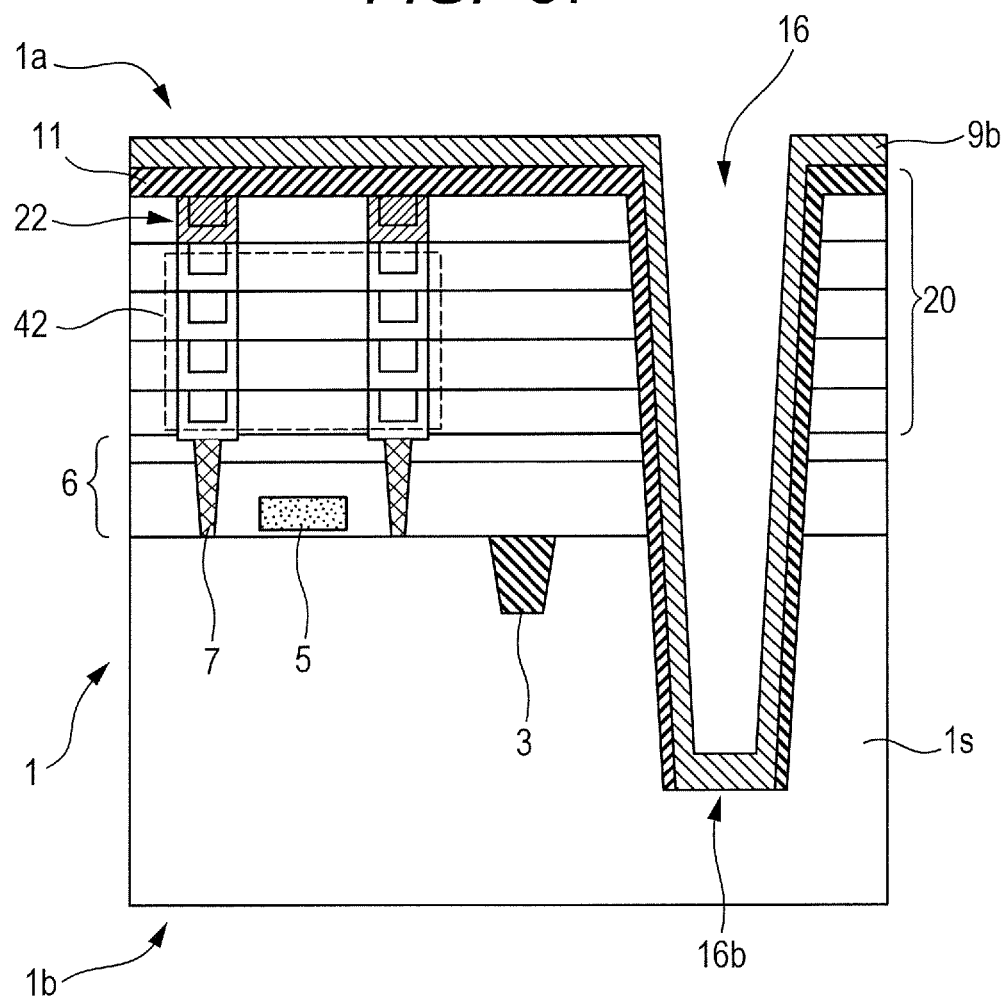
FIG. 37 is a schematic cross-sectional view (a step of forming a through-via liner insulating film and a through-via barrier metal film) showing the region R1 of the wafer at the peripheries of the MISFET and through via cut out from FIG. 2 for describing the modification example (a via last process) of the through via formation process in the method of manufacturing a semiconductor integrated circuit device according to First Embodiment of the invention.
Figure 39:
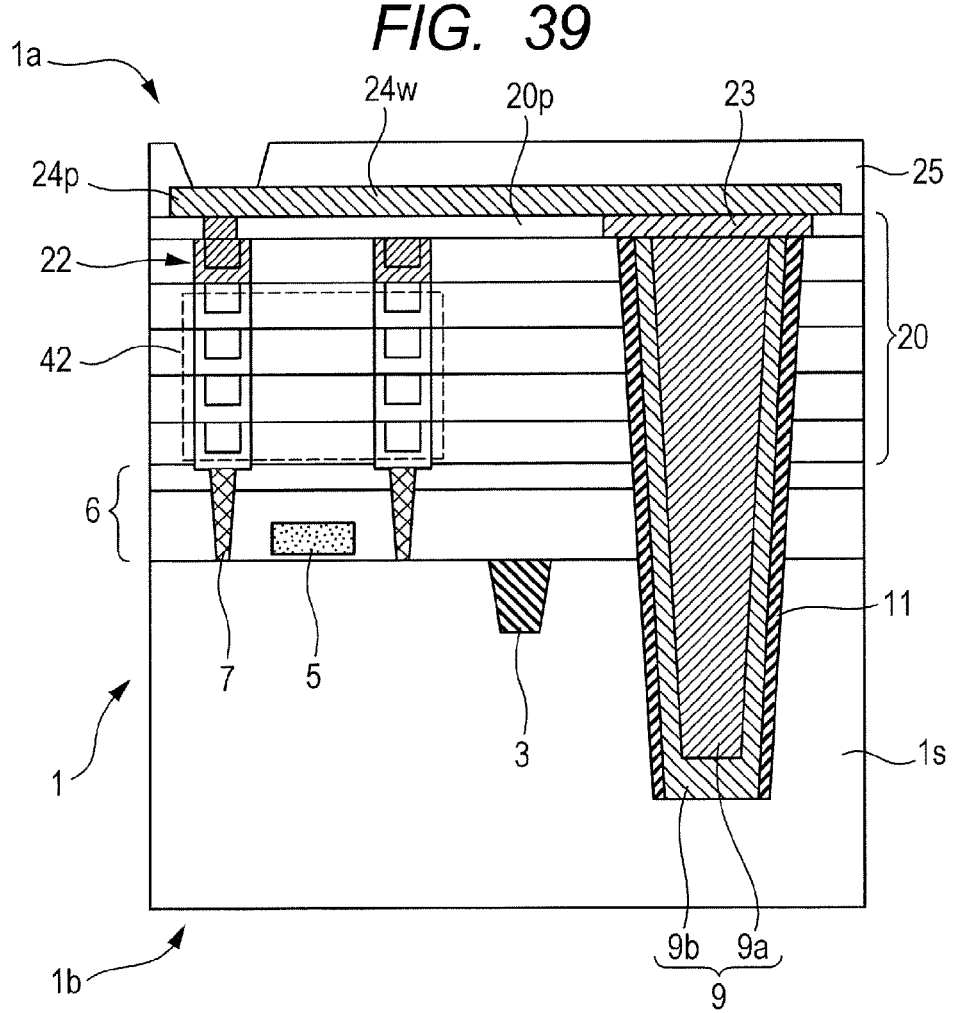
FIG. 39 is a schematic cross-sectional view (a final passivation step) showing the region R1 of the wafer at the peripheries of the MISFET and through via cut out from FIG. 2 for describing the modification example (a via last process) of the through via formation process in the method of manufacturing a semiconductor integrated circuit device according to First Embodiment of the invention.

FIG. 34 is a schematic cross-sectional view (at the time of completion of an uppermost-level buried wiring forming step) showing the region R1 of the wafer at the peripheries of the MISFET and through via cut out from FIG. 2 for describing a modification example (a via last process) of the through via formation process in the method of manufacturing a semiconductor integrated circuit device according to First Embodiment of the invention. FIG. 35 is a schematic cross-sectional view (a step of patterning a through via forming resist film) showing the region R1 of the wafer at the peripheries of the MISFET and through via cut out from FIG. 2 for describing the modification example (the via last process) of the through via formation process in the method of manufacturing a semiconductor integrated circuit device according to First Embodiment of the invention. FIG. 36 is a schematic cross-sectional view (a step of forming a through via) showing the region R1 of the wafer at the peripheries of the MISFET and through via cut out from FIG. 2 for describing the modification example (the via last process) of the through via formation process in the method of manufacturing a semiconductor integrated circuit device according to First Embodiment of the invention. FIG. 37 is a schematic cross-sectional view (a step of forming a through-via liner insulating film and a through-via barrier metal film) showing the region R1 of the wafer at the peripheries of the MISFET and through via cut out from FIG. 2 for describing the modification example (the via last process) of the through via formation process in the method of manufacturing a semiconductor integrated circuit device according to First Embodiment of the invention. FIG. 38 is a schematic cross-sectional view (a step of burying and planarizing a through via electrode) showing the region R1 of the wafer at the peripheries of the MISFET and through via cut out from FIG. 2 for describing the modification example (the via last process) of the through via formation process in the method of manufacturing a semiconductor integrated circuit device according to First Embodiment of the invention. FIG. 39 is a schematic cross-sectional view (a final passivation step) showing the region R1 of the wafer at the peripheries of the MISFET and through via cut out from FIG. 2 for describing the modification example (a via last process) of the through via formation process in the method of manufacturing a semiconductor integrated circuit device according to First Embodiment of the invention. Based on them, the modification example (the via last process) of the through via formation process in the method of manufacturing a semiconductor integrated circuit device according to First Embodiment of the invention will next be described.

As shown in FIG. 34, similar to from FIG. 4 to FIG. 18, a lower-level & intermediate-level buried wiring 42 is formed, followed by completion of burying of an uppermost-level wiring 22 (uppermost level buried wiring) except for a pad layer and the like.

Next, as shown in FIG. 35, similar to FIG. 5, a through via forming resist film 15 is formed almost all over the surface of the wafer 1 on the device surface 1a (surface) side, followed by patterning using, for example, typical lithography.

Next, as shown in FIG. 36, similar to FIG. 6, with the patterned through-via forming resist film 15 as a mask, a through via 16 (having, for example, a top diameter of about 20 μm and a depth of about 60 μm) penetrating through the wiring interlayer insulating film 20 and the premetal insulating film 6 and reaching the inside of the semiconductor substrate portion 1s formed by anisotropic dry etching (using, as a gas system, a fluorocarbon-based one for the insulating film portion and a halogen-based one for the substrate portion). Then, the resist film which becomes unnecessary is removed, for example, by ashing.

Next, as shown in FIG. 37, similar to FIG. 7, a silicon oxide-based insulating film (for example, an ozone TEOS film having a thickness of about 200 nm) is formed, for example, by CVD, on almost all over the surface of the wafer 1 on the device surface 1a side (surface side) to form a through-via liner insulating film 11. Next, as in FIGS. 8 and 9, the through-via liner insulating film 11 is removed by anisotropic dry etching from the bottom portion 16b of the through-via liner insulating film 11 (hole). Next, as in FIG. 10, a titanium nitride film (having a thickness of, for example, about 30 nm) is formed as a through-via barrier metal film 9b, for example, by MOCVD (metal organic CVD) or sputtering (for example, ionized sputtering) almost all over the surface of the wafer 1 on the device surface 1a side (including the inner surface of the through via 16).

Next as shown in FIG. 38, as in FIG. 11, a copper seed film is formed, for example, by sputtering (for example, ionized sputtering) on the through-via barrier metal film 9b and all over the surface (including the inner surface of the through via 16) of the wafer 1 on the device surface 1a side. Next, for example, by electroplating with the copper seed film as a seed layer, a copper film (including a seed film) is formed all over the surface (including the inner surface of the through via 16) so as to fill the through via 16. Next, by metal CMP, the copper film and the through-via barrier metal film 9*b* outside the through via 16 are removed by metal CMP to form a through via electrode 9 comprised of the through via main metal electrode 9*a* (copper film), the through-via barrier metal film 9*b*, and the like.

Next, as shown in FIG. 39, as in FIG. 18, an under-pad interlayer insulating film 20*p* is formed on the uppermost-level wiring 22 and an upper tungsten plug 23 is buried therein. Next, as in FIG. 18, an electrode pad 24*p* (for example, an aluminum-based pad) is formed on the under-pad interlayer insulating film 20*p* and a portion thereon except for the pad opening is covered with a final passivation film 25. As a result, at least one of the through via electrodes is electrically coupled to the pad with a wiring belonging to the pad layer.

Steps subsequent thereto are similar to those described referring to from FIG. 18 to FIG. 27 so that an overlapping description is omitted here.

In the example so far described in this section, a through via electrode is formed during the step of forming an uppermost-level wiring except for the pad layer. It has therefore the merit of forming the electrode separately from the step of forming an intermediate-or lower level wiring which requires minute processing. In short, it has the merit of forming the through via electrode by using a processing apparatus with relatively rough accuracy.

8. Description on a modification example (a via first-polysilicon process) of the through via formation process in the method of manufacturing a semiconductor integrated circuit device according to First Embodiment of the invention (mainly, from FIG. 40 to FIG. 46)

In this section, an example of a via first-polysilicon process will be described as an example of the process described in Section 2 and the like modified in the formation timing of a through via. The flow of the process is fundamentally similar to that described in FIG. 4 to FIG. 27 except for the portion of the through via, because only the timing of through via formation is shifted from the time of completion of a premetal region to the time of completion of an STI region and a portion of an impurity doped region (for example, an N well region WN, a p well region WP, and the like in FIG. 2). A portion which varies according to the shifting of the timing of the through via formation will therefore be described hereinafter in principle.

Figure 40:
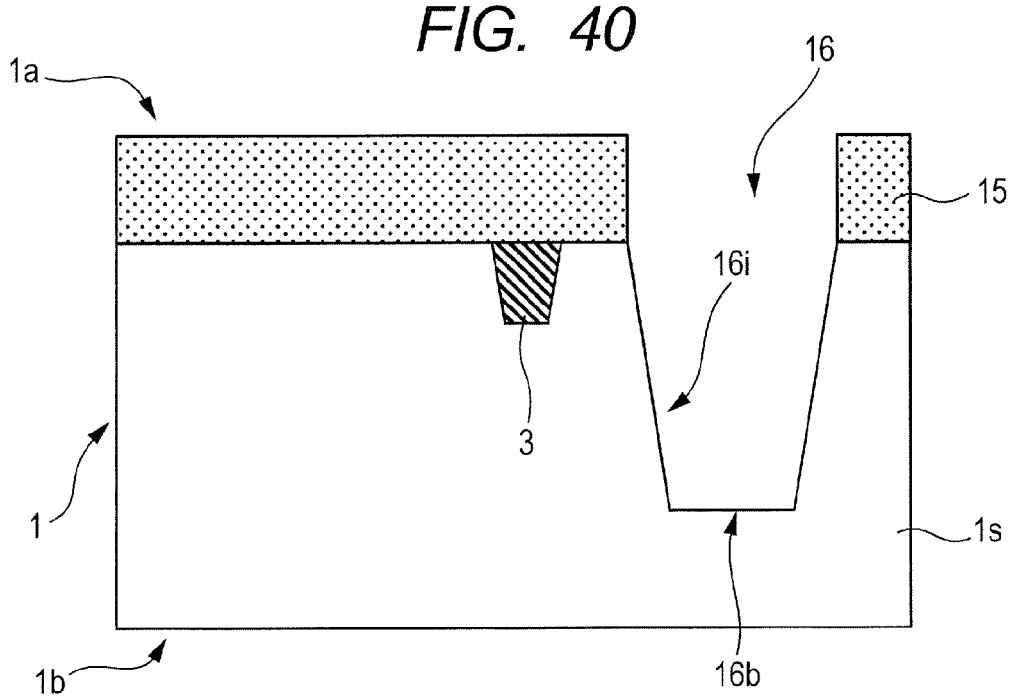
FIG. 40 is a schematic cross-sectional view (a step of forming a through via) showing the region R1 of the wafer at the peripheries of the MISFET and through via cut out from FIG. 2 for describing a modification example (a via first-polysilicon process) of the through via formation process in the method of manufacturing a semiconductor integrated circuit device according to First Embodiment of the invention.
Figure 41:
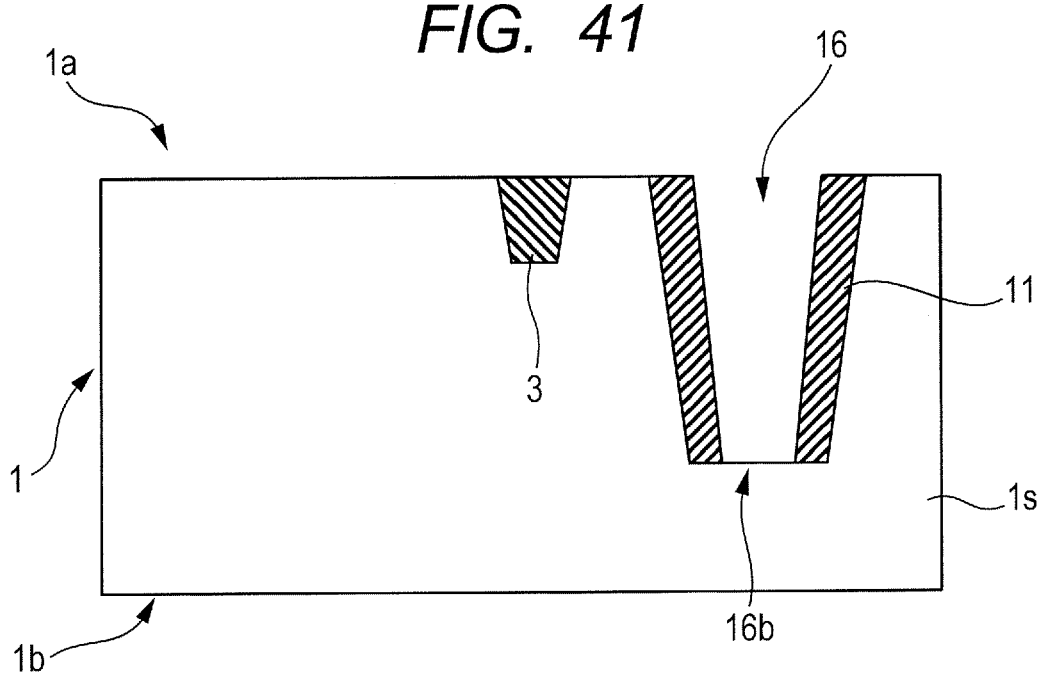
FIG. 41 is a schematic cross-sectional view (a step of forming a through-via liner insulating film and etching) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention.
Figure 43:
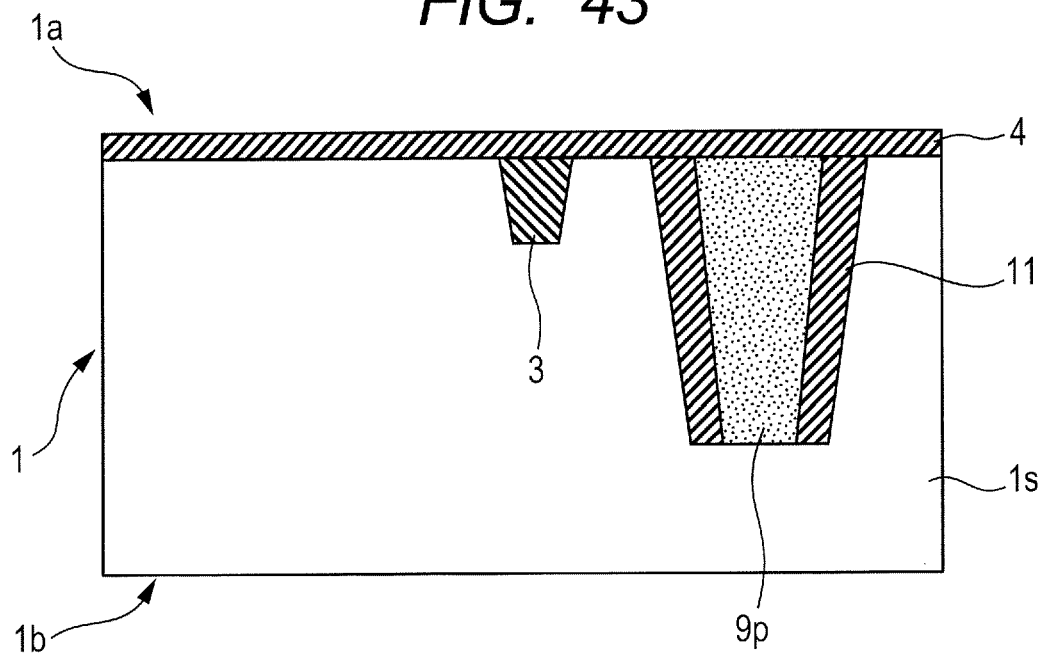
FIG. 43 is a schematic cross-sectional view (a step of forming a gate insulating film) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention.
Figure 44:
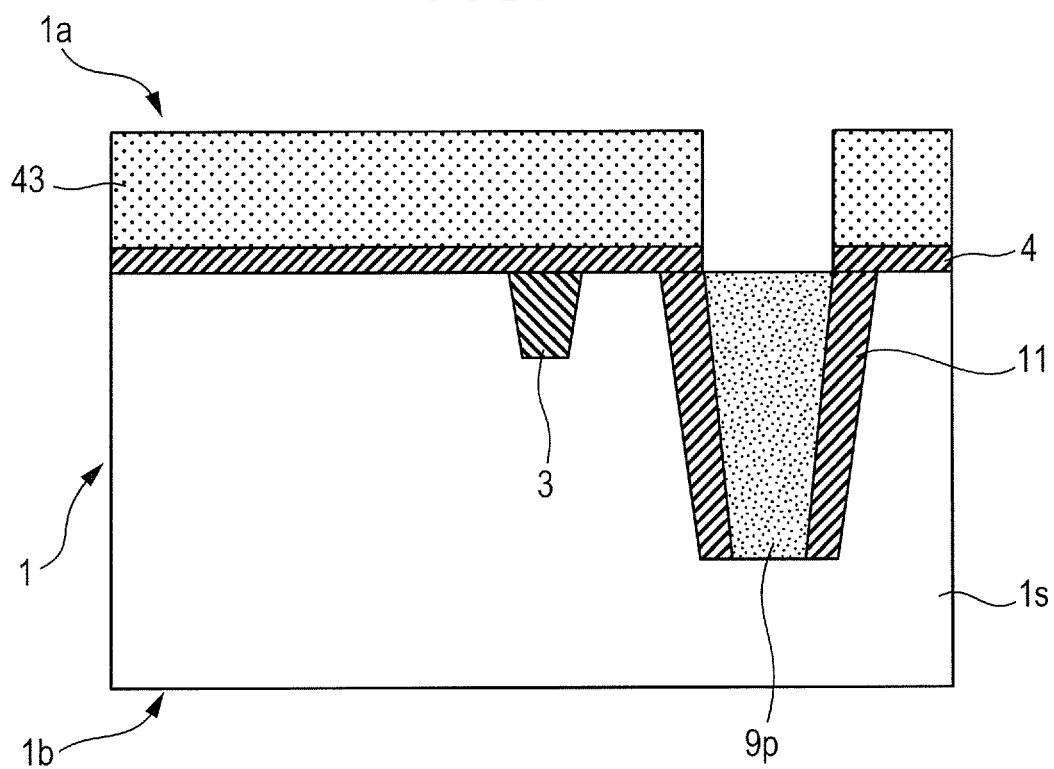
FIG. 44 is a schematic cross-sectional view (a gate insulating film etching step) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention.
Figure 45:
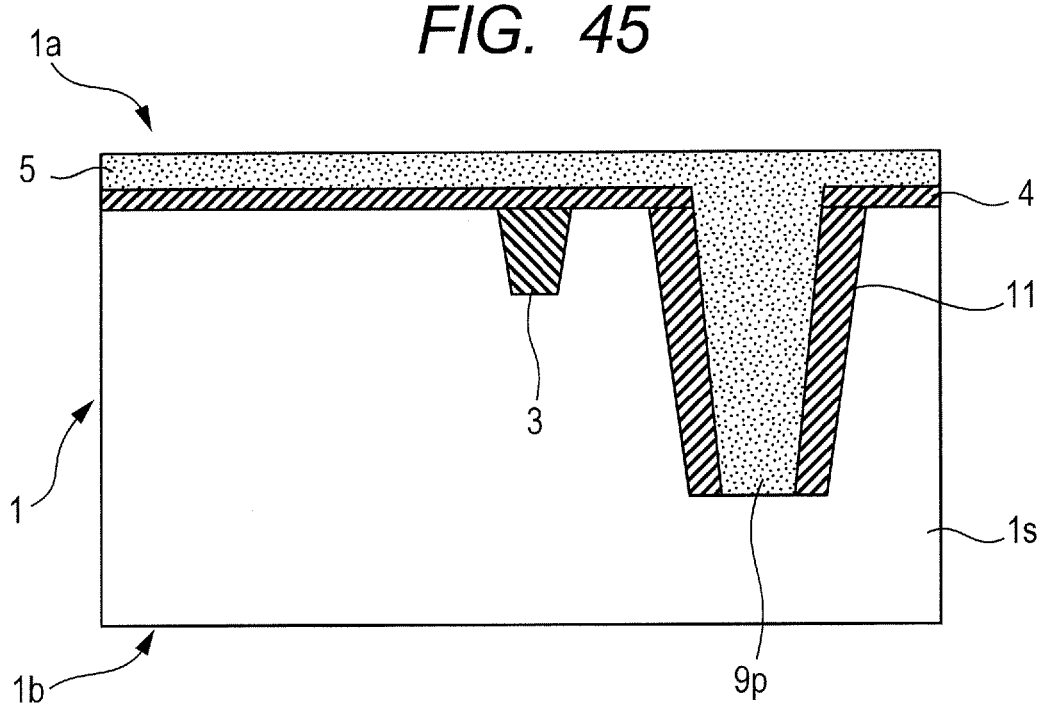
FIG. 45 is a schematic cross-sectional view (a gate electrode film forming step) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention.
Figure 46:
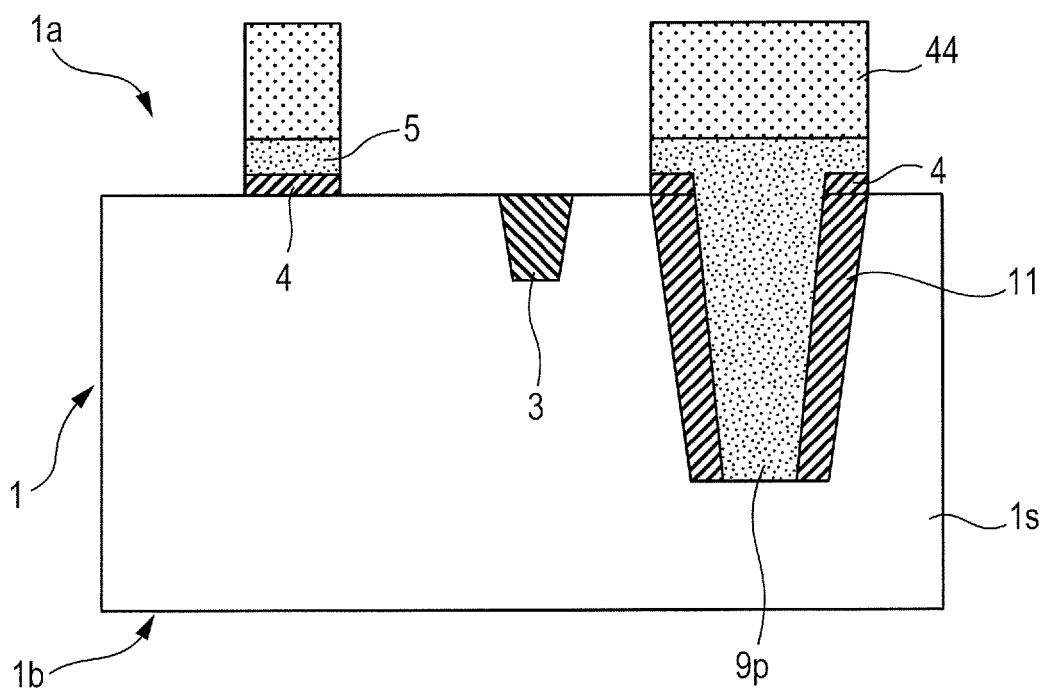
FIG. 46 is a schematic cross-sectional view (a step of processing the gate electrode film) showing the region R1 of the wafer at the peripheries of the MISFET and through via cut out from FIG. 2 for describing the modification example (the via first polysilicon process) of the through via formation process in the method of manufacturing a semiconductor integrated circuit device according to First Embodiment of the invention.

FIG. 40 is a schematic cross-sectional view (a step of forming a through via) showing the region R1 of the wafer at the peripheries of the MISFET and through via cut out from FIG. 2 for describing a modification example (a via first-polysilicon process) of the through via formation process in the method of manufacturing a semiconductor integrated circuit device according to First Embodiment of the invention. FIG. 41 is a schematic cross-sectional view (a step of forming a through-via liner insulating film and etching) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention. FIG. 42 is a schematic cross-sectional view (a step of burying and planarizing a through via electrode) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention. FIG. 43 is a schematic cross-sectional view (a step of forming a gate insulating film) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention. FIG. 44 is a schematic cross-sectional view (a step of etching the gate insulating film) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention. FIG. 45 is a schematic cross-sectional view (a step of forming a gate electrode film) showing the region R1 of the wafer at the peripheries of the MISFET and through via cut out from FIG. 2 for describing the modification example (the via first-polysilicon process) of the through via formation process in the method of manufacturing a semiconductor integrated circuit device according to First Embodiment of the invention. FIG. 46 is a schematic cross-sectional view (a step of processing the gate electrode film) showing the region R1 of the wafer at the peripheries of the MISFET and through via cut out from FIG. 2 for describing the modification example (the via first polysilicon process) of the through via formation process in the method of manufacturing a semiconductor integrated circuit device according to First Embodiment of the invention. Based on them, the modification example (the via first-polysilicon process) of the through via formation process in the method of manufacturing a semiconductor integrated circuit device according to First Embodiment of the invention will be described.

As shown in FIG. 40, a through via forming resist film 15 (having a thickness of, for example, about 5 μm) is formed almost all over the surface of the wafer 1 on the device surface 1*a* side when an STI region 3 and the like are completed, followed by patterning, for example, by typical lithography. Then, with the patterned through via forming resist film 15 as a mask, anisotropic dry etching is conducted to form a through via 16 (having a top diameter of about 3 μm and a depth of about 20 μm) having a substantially circular planar shape. The resist film which becomes unnecessary is then removed, for example, by ashing. The inner side surface 16*i* of the through via 16 may be perpendicular or slightly tapered toward the bottom.

Then, as shown in FIG. 41, as in FIG. 7, a silicon oxide-based insulating film (for example, an ozone TEOS film having a thickness of about 200 nm) is formed, for example, by CVD almost all over the surface of the wafer 1 on the device surface 1*a* side to form a through-via liner insulating film 11. Next, as in FIG. 8, a through-via bottom insulating film removing resist film 17 (having a thickness of for example, about 1 μm) is formed almost all over the surface of the wafer 1 on the device surface 1*a* side, followed by patterning, for example, by typical lithography. Then, as in FIG. 9, for example, with the patterned through-via bottom insulating film removing resist film 17 as a mask, anisotropic dry etching is conducted to remove the insulating film from the through-via bottom 16*b*. Then, the resist film which becomes unnecessary is removed, for example, by ashing.

Next, as shown in FIG. 42, the device surface 1*a* of the wafer 1 is thermally oxidized to form a thin silicon oxide film (sacrificial film). For example, a boron-doped polysilicon film is then formed all over the sacrificial film, for example, by CVD so as to fill the through via 16 therewith. Then, the polysilicon film outside the through via 16 is removed, for example, by dry etchback and the sacrificial film is also removed, for example, by wet etching. As a result, a polysilicon through via electrode 9p is buried in the through via 16.

Next, as shown in FIG. 43, a gate insulating film 4 is formed almost all over the device surface 1a of the wafer 1.

Next, as shown in FIG. 44, for example, a gate insulating film etching resist film 43 is formed almost all over the surface of the wafer 1 on the device surface 1a side, followed by patterning, for example, by typical lithography. Then, with the patterned gate insulating film etching resist film 43 as a mask, the gate insulating film 4 is etched to form an opening on the polysilicon through via electrode 9p. The resist film which becomes unnecessary is then removed, for example, by ashing.

As shown in FIG. 45, a conductive film 5 (for example, a polysilicon film) to be a gate electrode is formed almost all over the device surface 1a of the wafer 1, for example, by CVD.

Next, as shown in FIG. 46, a gate electrode processing resist film 44 is formed almost all over the device surface la of the wafer 1, followed by patterning, for example, by typical lithography. Next, with the patterned gate electrode processing resist film 44 as a mask, for example, anisotropic dry etching is conducted to pattern the gate electrode 5 and the like. Then, the resist film which becomes unnecessary is removed, for example, by ashing.

After that, introduction of a source and a drain, formation of a sidewall, formation of a premetal insulating film 6, burying of a conductive plug 7, and the like are conducted to obtain a structure similar to that of FIG. 4 or FIG. 16.

In the example described in this section, for example, burying of a through via electrode is conducted during a gate electrode forming step and is conducted with a timing (different timing process) different from that of forming a gate electrode film. Alternatively, it may be conducted simultaneously with the formation of the gate electrode film (simultaneous process). The former one has the merit of facilitating the process, while the latter one has the merit of simplifying the process step.

9. Description on a modification example (a via first contact process) of the through via formation process in the method of manufacturing a semiconductor integrated circuit device according to First Embodiment of the invention (mainly, from FIG. 47 to FIG. 54)

This section describes an example of a via first contact process as an example of the process described in Section 2 and the like modified in the through via formation timing. The flow of the process is fundamentally similar to that described in from FIG. 4 to FIG. 27 except for the portion of the through via, because only the starting timing of through via formation is shifted from the time of completion of a premetal region to the time of completion of a gate electrode (for example, after patterning of the gate electrode, introduction of a source and a drain, formation of a sidewall, and the like but prior to the formation of a premetal insulating film 6). Accordingly, only a portion which varies according to the shifting of the timing of the through via formation will hereinafter be described in principle.

Figure 47:
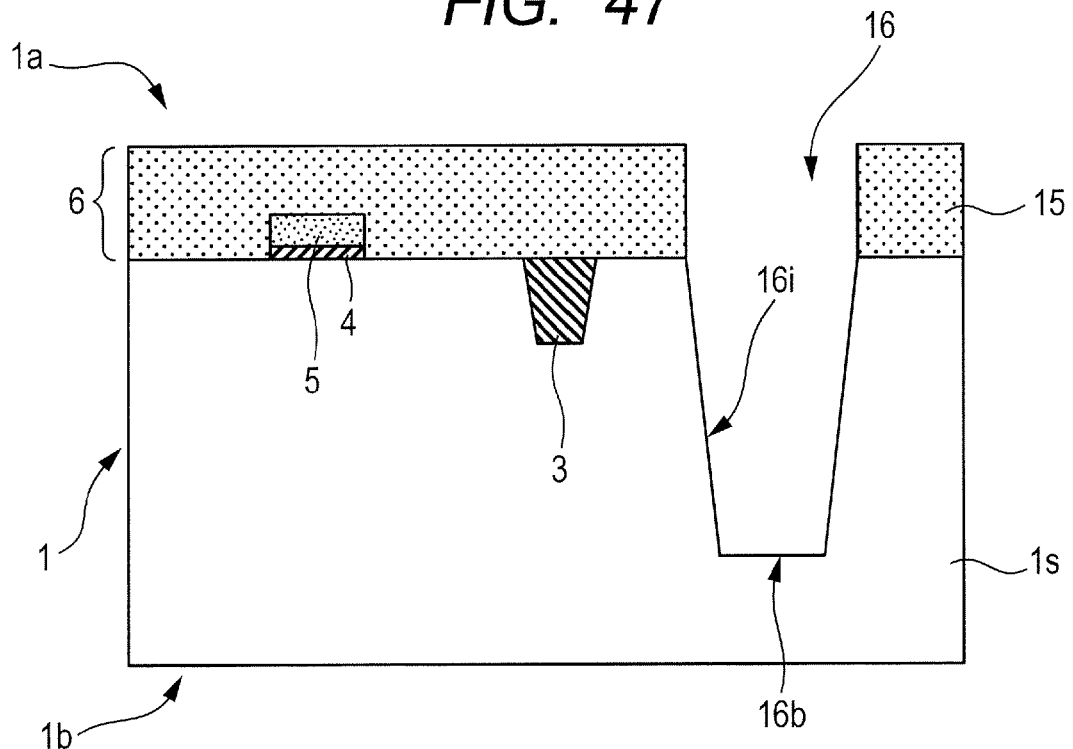
FIG. 47 is a schematic cross-sectional view (a through via forming step) showing the region R1 of the wafer at the peripheries of the MISFET and through via cut out from FIG. 2 for describing a modification example (a via first contact process) of the through via formation process in the method of manufacturing a semiconductor integrated circuit device according to First Embodiment of the invention.
Figure 48:
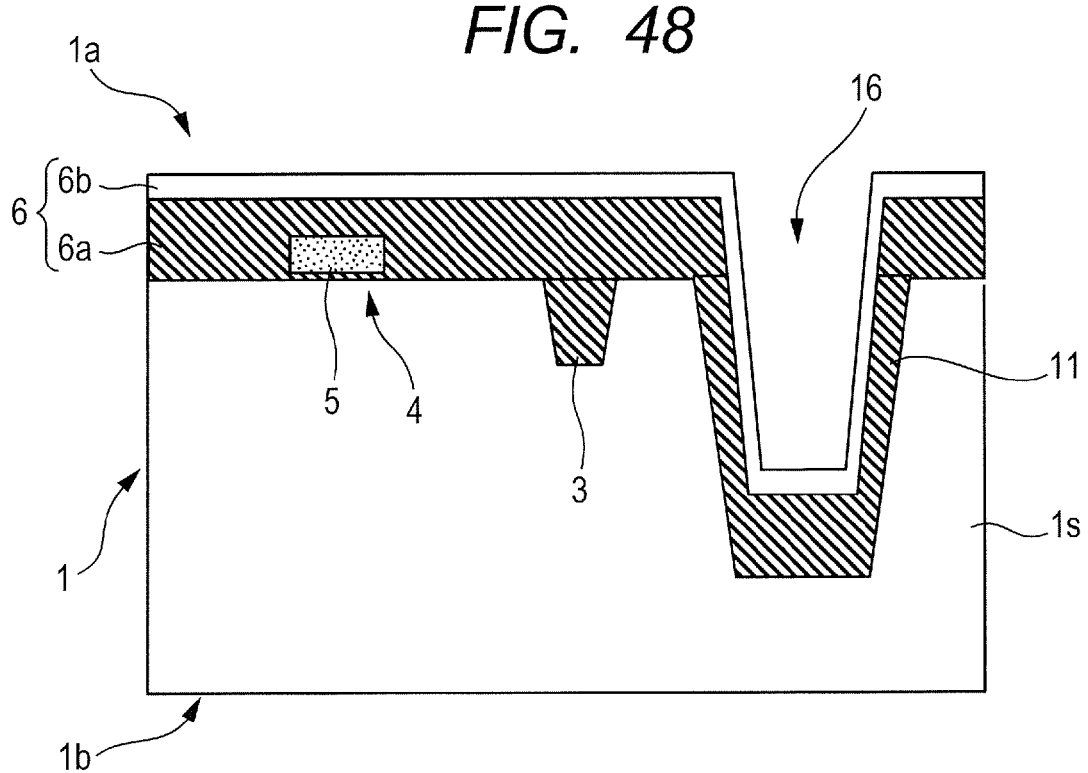
FIG. 48 is a schematic cross-sectional view (a step of forming a through-via liner insulating film) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention.
Figure 49:
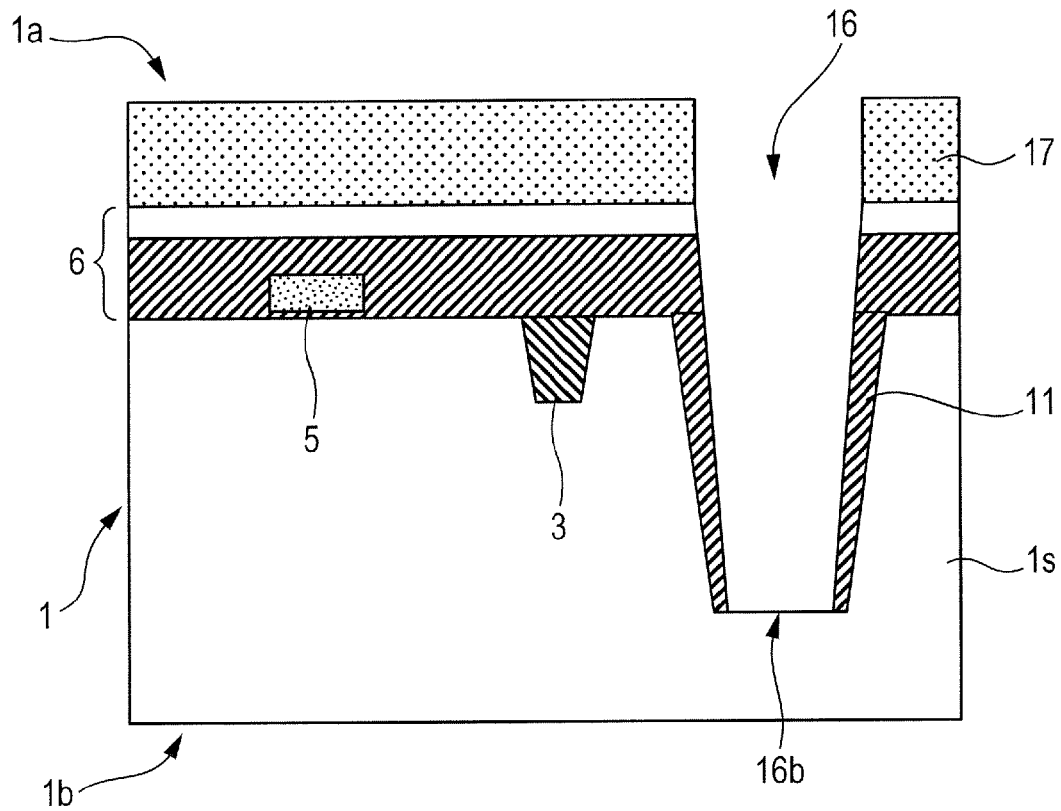
FIG. 49 is a schematic cross-sectional view (a step of removing the through-via bottom insulating film) showing the region R1 of the wafer at the peripheries of MISFET and through via cut out from FIG. 2 for describing the modification example (the via first contact process) of the through via formation process in the method of manufacturing a semiconductor integrated circuit device according to First Embodiment of the invention.
Figure 50:
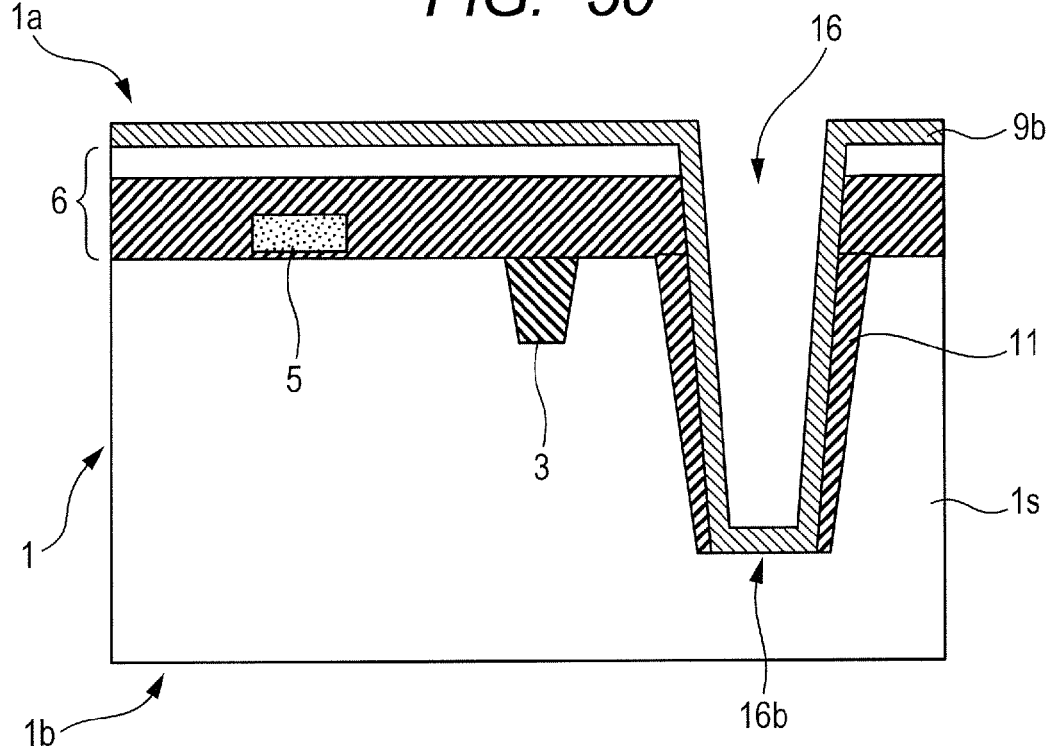
FIG. 50 is a schematic cross-sectional view (a step of forming a through-via barrier metal film) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention.
Figure 52:
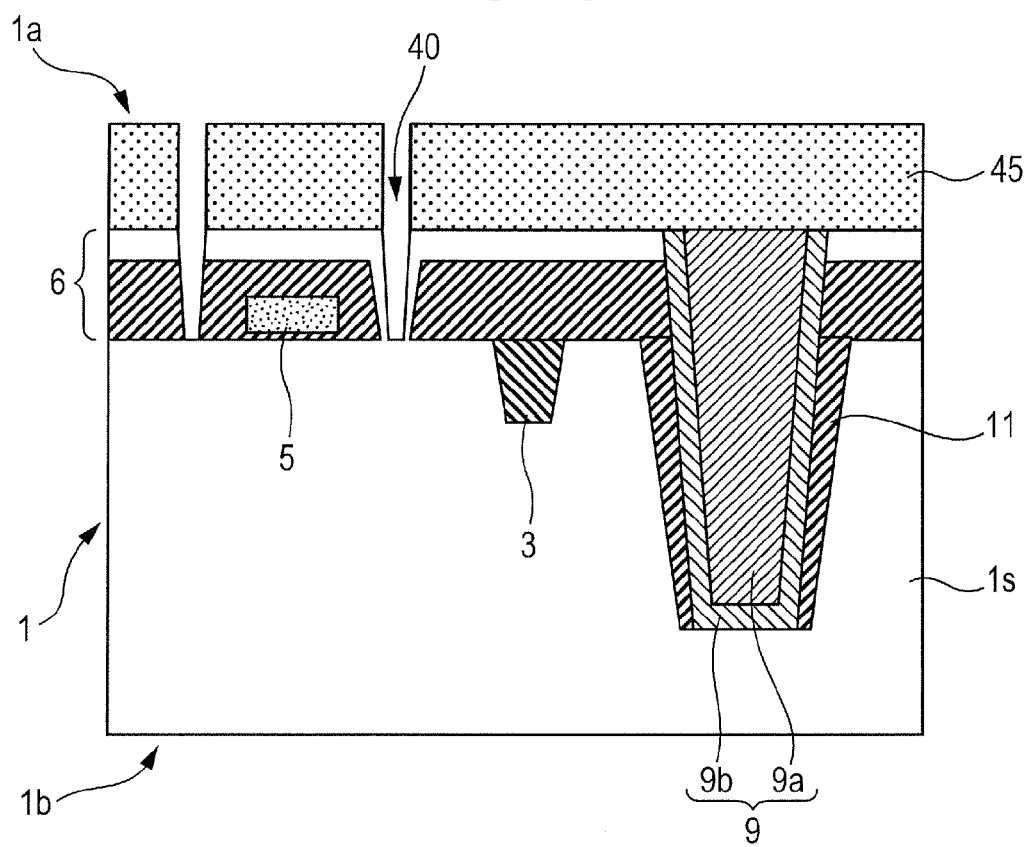
FIG. 52 is a schematic cross-sectional view (a step of forming a contact hole) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention.
Figure 53:
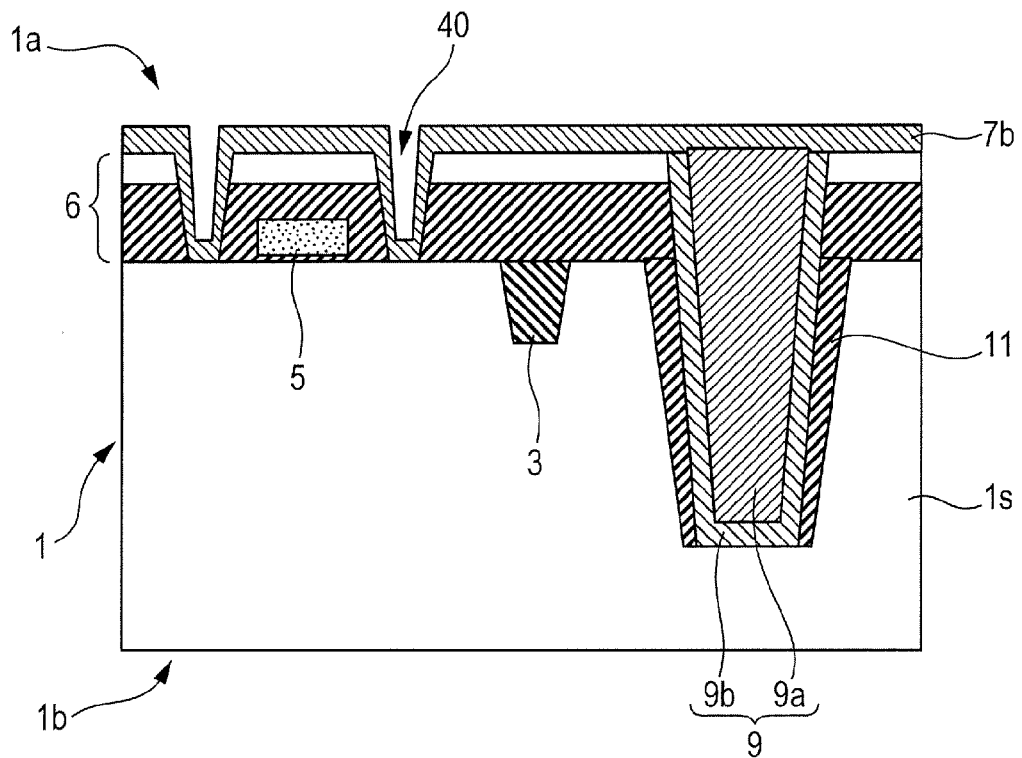
FIG. 53 is a schematic cross-sectional view (a step of forming a metal-plug barrier metal film) showing the region R1 of the wafer at the peripheries of the MISFET and through via cut out from FIG. 2 for describing the modification example (a via first contact process) of the through via formation process in the method of manufacturing a semiconductor integrated circuit device according to First Embodiment of the invention.
Figure 54:
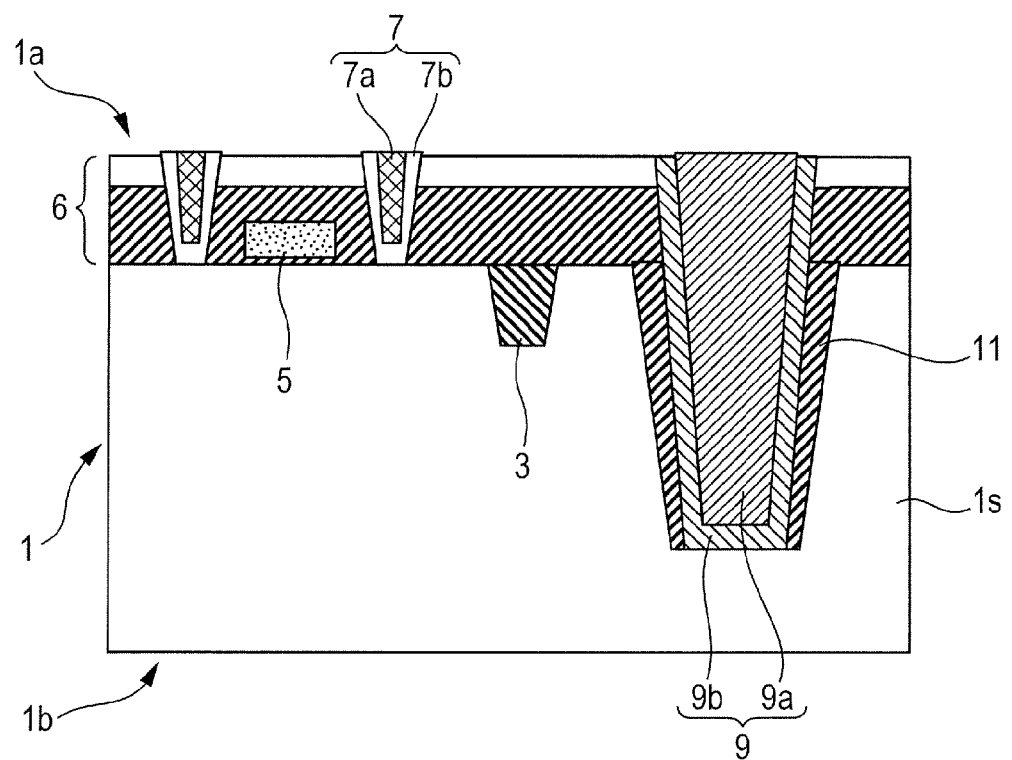
FIG. 54 is a schematic cross-sectional view (a step of burying and planarizing a conductive plug) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention.

FIG. 47 is a schematic cross-sectional view (a step of forming an thorough via) showing the region R1 of the wafer at the peripheries of the MISFET and through via cut out from FIG. 2 for describing a modification example (a via first contact process) of the through via formation process in the method of manufacturing a semiconductor integrated circuit device according to First Embodiment of the invention. FIG. 48 is a schematic cross-sectional view (a step of forming a through-via liner insulating film) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. FIG. 49 is a schematic cross-sectional view (a step of removing a through-via bottom insulating film) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. FIG. 50 is a schematic cross-sectional view (a step of forming a through-via barrier metal film) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. FIG. 51 is a schematic cross-sectional view (a step of burying and planarizing a through via electrode) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. FIG. 52 is a schematic cross-sectional view (a step of forming a contact hole) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. FIG. 53 is a schematic cross-sectional view (a step of forming a metal plug barrier metal film) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. FIG. 54 is a schematic cross-sectional view (a step of burying and planarizing a conductive plug) showing the region R1 of the wafer at the peripheries of the MISFET and through via cut out from FIG. 2 for describing the modification example (the via first contact process) of the through via formation process in the method of manufacturing a semiconductor integrated circuit device according to First Embodiment of the invention. Based on them, the modification example (via first contact process) of the through via formation process in the method of manufacturing a semiconductor integrated circuit device according to First Embodiment of the invention will be described.

For example, after completion of the gate electrode, as shown in FIG. 47, a through via forming resist film 15 (having a thickness of, for example, about 5 μm) is formed almost all over the surface of the wafer 1 on the device surface 1a side, followed by patterning, for example, by typical lithography. Next, with the patterned through via forming resist film 15 as a mask, for example, anisotropic dry etching is conducted to form a through via 16 (having a top diameter of, for example, about 3 μm and a depth of about 20 μm) having a substantially circular planar shape. Then, the resist film which becomes unnecessary is removed, for example, by ashing. The inner side surface 16i of the through via 16 may be perpendicular or slightly tapered toward the bottom.

Then, as shown in FIG. 48, a silicon oxide-based insulating film (for example, an ozone TEOS film having a thickness of, for example, about 200 nm) is formed, for example, by CVD almost all over the surface of the wafer 1 on the device surface 1a side to form a through-via liner insulating film 11 and a main premetal insulating film 6a. Next, a silicon oxide-based insulating film (a plasma TEOS film having a thickness of, for example, about 100 nm) is formed almost all over the surface of the wafer 1 on the device surface 1a side as a cap-layer premetal insulating film 6b, for example, by CVD.

Next, as shown in FIG. 49, for example, with the through-via bottom insulating film removing resist film 17 as a mask, the cap-layer premetal insulating film 6b in the through via 16 and the through-via liner insulating film 11 on the through-via bottom 16b are removed. The resist film which becomes unnecessary is then removed, for example, by ashing.

Next, as shown in FIG. 50, a titanium nitride film (having a thickness of, for example, about 30 nm) is formed on almost the whole surface (including the inner surface of the through via 16) of the wafer 1 on the device surface 1a side as a through-via barrier metal film 9b, for example, by MOCVD (metal organic CVD) or sputtering (ionized sputtering).

Next, as shown in FIG. 51, a tungsten film is formed on the titanium nitride film 9b and on almost the entire surface (including the inner surface of the through via 16) of the wafer 1 on the device surface 1a side, for example, by CVD (using, as a gas system, $B_2H_6/WF_6$, for nucleation and $H_2/WF_6$ for blanket) so as to fill the through via 16. Next, metal CMP is conducted to remove the tungsten film and the titanium nitride film 9b outside the through via 16.

Next, as shown in FIG. 52, a contact hole forming resist film 45 is formed almost all over the surface of the wafer 1 on the device surface 1a side, followed by patterning, for example, by typical lithography. With thus-patterned contact hole forming resist film 45 as a mask, a contact hole 40 is formed, for example by anisotropic dry etching (using, for example, a fluorocarbon-based gas as a gas system). The resist film which becomes unnecessary is then removed, for example, by ashing.

Next, as shown in FIG. 53, a titanium nitride film is formed as a metal plug barrier metal film 7b almost all over the surface (including the inner surface of the contact hole 40) of the wafer 1 on the device surface 1a side, for example, by MOCVD or sputtering (for example, ionized sputtering).

Next, as shown in FIG. 54, a tungsten film 7a is deposited on almost the entire surface (including the inner surface of the contact hole 40) of the wafer 1 on the device surface 1a side, for example, by CVD (using, as a gas system, $B_2H_6/WF_6$ for nucleation and $H_2/WF_6$ for blanket) so as to fill the contact hole 40. Next, metal CMP is conducted to remove the tungsten film 7a and the metal plug barrier metal film 7b outside the contact hole 40. The state equivalent to that of FIG. 4 except that the through via electrode 9 has already been completed can be obtained.

Steps subsequent thereto are therefore fundamentally the same as those shown in from FIG. 5 to FIG. 27 so that an overlapping description is omitted here.

In the example described above in this section, burying of the through via electrode is conducted during the contact formation step and it is conducted at a timing different from that of the formation of the contact plug (different timing process). Alternatively, it is conducted simultaneously with the formation of the contact plug (simultaneous process). The different timing process has the merit of facilitating the process, while the simultaneous process has the merit of simplifying the process step.

10. Supplementary description on the above-mentioned embodiment (including modification examples) and general consideration (1) Problems of TSV and Characteristics of Each Example:

In TSV, that is, a through via electrode formed in a through hole made in a semiconductor substrate such as silicon substrate, the lower end is usually closed before thinning of a wafer in the through-via preceding front-via type process mainly described herein, which makes it difficult to conduct a conduction test of the through via electrode. In addition, the semiconductor substrate portion of the wafer is usually insulated from each of the through via electrodes so that there is a possibility of defects such as gate breakdown occurring when undesirable charge-up is caused by the process after burying of the through via electrodes.

In the above-mentioned embodiment (including modification examples), with a combination of processes, that is, hole formation in a semiconductor substrate and formation of a liner insulating film on the inner surface of the hole, suited for microfabrication as a base, a through via electrode structure with an electrically opened lower end is used in combination to achieve a through via electrode process suited for microfabrication, which will be described below specifically.

(2) Consideration on the timing of through via electrode formation: The via middle process as described mainly in from Section 1 to Section 6 has the merit of forming a low-resistance through via electrode because microfabrication of a lower-level wiring (for example, the first-level buried wiring) can be used and at the same time, copper or the like can be used as a main material of the through via electrode.

On the other hand, the via middle process described mainly in Section 7 cannot use microfabrication used in a via middle process or a via first process, but it has the merit of using low-resistance copper or the like as a main material of a through via electrode after substantial completion of the wafer process.

Since in the via first-polysilicon process as described mainly Section 8, the through via electrode is formed before introduction of a source-drain step, the process is advantageous from the standpoint of thermal budget. Polysilicon is a very stable material in the process and it does not cause any contamination. Addition of boron (or phosphorus, or the like), on the other hand, markedly increases the resistance, compared with even tungsten or the like. The via first-polysilicon process belongs to the via first process so that it has the merit of using microfabrication of the FEOL step.

The via first-contact process as described mainly in Section 9 can use a relatively low-resistance material such as tungsten as a main material of the through via electrode so that it can realize relatively low resistance. The via first-contact process belongs to the via first process so that it has the merit of using microfabrication of the FEOL step.

11. Summary

The invention made by the present inventors has been described specifically based on the embodiment. It should however be borne in mind that the invention is not limited to or by it. Needless to say, it can be changed without departing from the gist of the invention.

For example, in the above-mentioned embodiment, the invention is described specifically with a gate first process as a main example. The invention is not limited to it but, needless to say, can be applied to a FUSI process, a High-k first & gate last process, a High-k & gate last process, a P side gate last hybrid process, and the like.

In the above-mentioned embodiment, a structure using a copper-based buried wiring (including a silver-based buried wiring or the like) is described specifically. The invention is not limited to a structure using a buried wiring as a main wiring system, but needless to say, can be applied to a structure using an aluminum-based non-buried wiring as a main wiring system.

Moreover, in the above-mentioned embodiment, the invention is described with a pad layer mainly comprised of an aluminum-based non-buried wiring (including a pad layer comprised only of a pad) as an example, but the invention is not limited to it. It is needless to say that the invention can also be applied to a pad layer comprised of a copper-based buried wiring (including a silver-based buried wiring and including a pad layer comprised only of a pad).

What is claimed is:

1. A method of manufacturing a semiconductor integrated circuit device comprising:
    preparing a semiconductor wafer having a device main surface and back surface;
    forming, from the device main surface of the semiconductor wafer to a semiconductor surface region of the semiconductor wafer, a plurality of holes reaching the inside thereof;
    forming an insulating film on the inner surface of the holes including the sides and the bottom portion of the holes;
    removing the insulating film at the bottom portion of the holes;
    burying a conductive member in the holes while covering, with the insulating film, the inner surface of the holes except for the bottom portion thereof, and thereby forming a plurality of through via electrodes; and
    after the operation of burying the conductive member in the holes but during a wafer process process, irradiating electron beams to the device main surface of the semiconductor wafer to test a conduction state of the through via electrodes.

2. The method of manufacturing a semiconductor integrated circuit device according to claim 1, further comprising:
    in the wafer process, electrically coupling at least one of the through via electrodes to a gate electrode.

3. The method of manufacturing a semiconductor integrated circuit device according to claim 2,
    wherein the through via electrodes are formed using a via middle process.

4. The method of manufacturing a semiconductor integrated circuit device according to claim 3,
    wherein the through via electrodes are buried in a step of forming a first-level wiring but at a timing different from that of burying the first-level wiring.

5. The method of manufacturing a semiconductor integrated circuit device according to claim 3,
    wherein the through via electrodes are buried simultaneously with burying of a first-level wiring.

6. The method of manufacturing a semiconductor integrated circuit device according to claim 2,
    wherein the through via electrodes are formed using a via last process.

7. The method of manufacturing a semiconductor integrated circuit device according to claim 6,
    wherein the through via electrodes are formed during a step of forming uppermost-level wirings except for a pad layer.

8. The method of manufacturing a semiconductor integrated circuit device according to claim 7,
    wherein at least one of the through via electrodes is electrically coupled to a pad through a wiring belonging to the pad layer.

9. The method of manufacturing a semiconductor integrated circuit device according to claim 2,
    wherein the through via electrodes are formed using a via first process.

10. The method of manufacturing a semiconductor integrated circuit device according to claim 9,
    wherein the burying of the through via electrodes is conducted in a gate electrode forming step but at a timing different from that of forming a gate electrode film.

11. The method of manufacturing a semiconductor integrated circuit device according to claim 9,
    wherein the burying of the through via electrodes is conducted simultaneously with the formation of a gate electrode film.

12. The method of manufacturing a semiconductor integrated circuit device according to claim 9,
    wherein the burying of the through via electrodes is conducted in a contact forming step but at a timing different from that of forming a contact plug.

13. The method of manufacturing a semiconductor integrated circuit device according to claim 9,
    wherein the burying of the through via electrodes is conducted simultaneously with the formation of a contact plug.

14. The method of manufacturing a semiconductor integrated circuit device according to claim 2,
    wherein the lower end of each of the through via electrodes and a semiconductor region in the vicinity thereof have therebetween a metal silicide layer.

15. The method of manufacturing a semiconductor integrated circuit device according to claim 2, further comprising:
    after the operation of burying the conductive member in the holes, subjecting the semiconductor wafer to film thinning treatment from the back surface side of the semiconductor wafer to expose the through via electrodes on the back surface side of the semiconductor wafer.

16. The method of manufacturing a semiconductor integrated circuit device according to claim 15, further comprising:
    after the operation of burying the conductive member in the holes, coupling the through via electrodes to a bump electrode provided on another semiconductor substrate.

17. A method of manufacturing a semiconductor integrated circuit device comprising the steps of:
    (a) preparing a semiconductor wafer having a device main surface and back surface;
    (b) forming, from the device main surface of the semiconductor wafer to a semiconductor surface region of the semiconductor wafer, a plurality of holes reaching the inside thereof;
    (c) forming an insulating film on the inner surface of the holes;
    (d) after the step (c), burying a conductive member in the holes while covering, with the insulating film, the inner surface of the holes except for the bottom portion thereof, and thereby forming a plurality of through via electrodes; and
    (e) in a wafer process, electrically coupling at least one of the through via electrodes to a gate electrode,
    wherein at least after the step (d), the semiconductor region in the vicinity of the lower end of each of the through via electrodes has a heavily doped region having the same conductivity type as that of a semiconductor region therearound and having a high impurity concentration.

18. A method of manufacturing a semiconductor integrated circuit device comprising the steps of:

(a) preparing a semiconductor wafer having a device main surface and back surface;
(b) forming, from the device main surface of the semiconductor wafer to a semiconductor surface region of the semiconductor wafer, a plurality of holes reaching the inside thereof;
(c) forming an insulating film on the inner surface of the holes;
(d) after the step (c), burying a conductive member in the holes while covering, with the insulating film, the inner surface of the holes except for the bottom portion thereof, and thereby forming a plurality of through via electrodes; and
(e) in a wafer process, electrically coupling at least one of the through via electrodes to a gate electrode,
wherein the through via electrodes have a barrier metal structure mainly with a titanium film as an outer layer and a titanium nitride film as an inner layer.

\* \* \* \* \*